(12) United States Patent
Perego et al.

(10) Patent No.: US 11,727,966 B2
(45) Date of Patent: *Aug. 15, 2023

(54) MEMORY CONTROLLERS, SYSTEMS, AND METHODS SUPPORTING MULTIPLE REQUEST MODES

(71) Applicant: Rambus Inc., San Jose, CA (US)

(72) Inventors: Richard E. Perego, Thornton, CO (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/665,544

(22) Filed: Feb. 6, 2022

(65) Prior Publication Data

US 2022/0301602 A1    Sep. 22, 2022

Related U.S. Application Data

(63) Continuation of application No. 16/790,183, filed on Feb. 13, 2020, now Pat. No. 11,276,440, which is a
(Continued)

(51) Int. Cl.
*G11C 7/10* (2006.01)
*G06F 13/16* (2006.01)
*G11C 5/06* (2006.01)

(52) U.S. Cl.
CPC ........ *G11C 7/1072* (2013.01); *G06F 13/1678* (2013.01); *G06F 13/1684* (2013.01);
(Continued)

(58) Field of Classification Search
CPC ... G11C 7/1072; G11C 7/1045; G11C 7/1075; G11C 5/06; G06F 13/1678; G06F 13/1684; G06F 13/1694
See application file for complete search history.

(56) References Cited

U.S. PATENT DOCUMENTS 4,332,028 A    5/1982  Joccotton et al.
5,319,755 A    6/1994  Farmwald et al.
(Continued)

FOREIGN PATENT DOCUMENTS

GB          2357602       6/2001
WO      WO-01/42929       6/2001
(Continued)

OTHER PUBLICATIONS

"How DDR3 Memory Works", Jan. 30, 2007, CST Publications. 3 pages.
(Continued)

*Primary Examiner* — Edward J Dudek, Jr.

(57) ABSTRACT

A memory system includes a memory controller with a plurality N of memory-controller blocks, each of which conveys independent transaction requests over external request ports. The request ports are coupled, via point-to-point connections, to from one to N memory devices, each of which includes N independently addressable memory blocks. All of the external request ports are connected to respective external request ports on the memory device or devices used in a given configuration. The number of request ports per memory device and the data width of each memory device changes with the number of memory devices such that the ratio of the request-access granularity to the data granularity remains constant irrespective of the number of memory devices.

20 Claims, 29 Drawing Sheets

Related U.S. Application Data continuation of application No. 15/916,193, filed on Mar. 8, 2018, now Pat. No. 10,600,455, which is a continuation of application No. 15/169,331, filed on May 31, 2016, now Pat. No. 9,959,914, which is a continuation of application No. 14/305,799, filed on Jun. 16, 2014, now Pat. No. 9,378,787, which is a continuation of application No. 12/745,494, filed on May 28, 2010, now Pat. No. 8,924,680, which is a continuation of application No. 12/595,125, filed as application No. PCT/US2008/004790 on Apr. 11, 2008, now abandoned.

(60) Provisional application No. 60/988,826, filed on Nov. 19, 2007, provisional application No. 60/911,435, filed on Apr. 12, 2007.

(52) U.S. Cl.
CPC ............ *G06F 13/1694* (2013.01); *G11C 5/06* (2013.01); *G11C 7/1045* (2013.01); *G11C 7/1075* (2013.01)

(56) References Cited

U.S. PATENT DOCUMENTS

| | | | |
|---|---|---|---|
| 5,430,676 | A | 7/1995 | Ware et al. |
| 5,432,923 | A | 7/1995 | Taniguchi et al. |
| 5,699,506 | A | 12/1997 | Phillips et al. |
| 5,892,981 | A | 4/1999 | Wiggers |
| 5,906,003 | A * | 5/1999 | Runas .................. G11C 7/1006 711/201 |
| 6,044,412 | A | 3/2000 | Evoy |
| 6,167,487 | A | 12/2000 | Camacho et al. |
| 6,170,041 | B1 | 1/2001 | LeVasseur et al. |
| 6,256,256 | B1 * | 7/2001 | Rao ..................... G11C 11/4097 365/189.04 |
| 6,499,089 | B1 | 12/2002 | Phelan et al. |
| 6,578,104 | B1 | 6/2003 | Small et al. |
| 6,671,836 | B1 * | 12/2003 | Lai .......................... G11C 29/48 714/718 |
| 6,691,214 | B1 | 2/2004 | Li et al. |
| 6,742,098 | B1 | 5/2004 | Halbert et al. |
| 6,748,556 | B1 | 6/2004 | Storino et al. |
| 6,778,491 | B1 | 8/2004 | Fourcand et al. |
| 6,839,393 | B1 | 1/2005 | Sidiropoulos |
| 6,877,071 | B2 | 4/2005 | Sherman |
| 6,889,304 | B2 | 5/2005 | Perego et al. |
| 7,061,821 | B2 | 6/2006 | Coteus et al. |
| 7,093,083 | B1 | 8/2006 | Matthews et al. |
| 7,165,153 | B2 | 1/2007 | Vogt |
| 7,239,669 | B2 | 7/2007 | Cummings et al. |
| 7,299,389 | B2 | 11/2007 | Nishida et al. |
| 7,333,908 | B2 | 2/2008 | Johnson |
| 7,548,601 | B2 | 6/2009 | Sidiropoulos |
| 7,577,789 | B2 | 8/2009 | Perego et al. |
| 8,335,894 | B1 | 12/2012 | Rajan et al. |
| 8,924,680 | B2 | 12/2014 | Perego et al. |
| 11,276,440 | B2 * | 3/2022 | Perego ................ G06F 13/1678 |
| 2004/0006674 | A1 | 1/2004 | Hargis et al. |
| 2004/0019756 | A1 | 1/2004 | Perego et al. |
| 2004/0105292 | A1 | 6/2004 | Matsui |
| 2004/0117566 | A1 | 6/2004 | McClannahan et al. |
| 2004/0117581 | A1 * | 6/2004 | Lee ..................... G06F 13/1684 711/170 |
| 2004/0139253 | A1 | 7/2004 | Perego et al. |
| 2004/0221106 | A1 | 11/2004 | Perego et al. |
| 2005/0182885 | A1 | 8/2005 | Matsui et al. |
| 2006/0112294 | A1 | 5/2006 | Walker |
| 2007/0011392 | A1 | 1/2007 | Lee et al. |
| 2007/0022333 | A1 * | 1/2007 | Terry .................. G11C 29/022 714/718 |
| 2007/0050167 | A1 | 3/2007 | Johnson |
| 2007/0162670 | A1 * | 7/2007 | Yang .................... G11C 29/028 710/100 |
| 2007/0214335 | A1 | 9/2007 | Bellows et al. |
| 2007/0260841 | A1 | 11/2007 | Hampel et al. |
| 2007/0283109 | A1 | 12/2007 | Kelly |
| 2010/0262768 | A1 | 10/2010 | Chen |
| 2011/0016278 | A1 | 1/2011 | Ware et al. |

FOREIGN PATENT DOCUMENTS

| | | |
|---|---|---|
| WO | WO-2004-051484 | 6/2004 |
| WO | WO-2005-101417 | 10/2005 |

OTHER PUBLICATIONS

Article 34 Amendment dated Mar. 28, 2011 re Int'l. Application No. PCT/US2008/004790. 24 Pages.
Boey, et al., "Serial Interface Logic Built in Self Test Methodology," Electronic Manufacturing Technology Symposium (IEMT), 2008 33rd IEEE/CPMT International, pp. 1-3, Nov. 4-6, 2008. 3 pages doi: 10.1109/IEMT.2008.5507795 URL: http://ieeexolore.ieee.org/stamp/stamp.jsp?tp=&arnumber=5507795&isnumber=5507772.
Chang, K., et al., "A 16Gb/s/link, 64GB/S Bidirectional Asymmetric Memory Interface Cell," 2008 IEEE Symposium on VLSI Circuits of Technical Papers, pp. 126-127, Jun. 18-20, 2008. 2 pages.
CN Office Action dated Nov. 26, 2015 for CN Appl. No. 200880011660. 2. 6 Pages. (With translation).
CN Office Action dated Mar. 31, 2012, CN Application No. 200880011660.2. 6 Pages.
CN Office Action dated Jan. 30, 2013 in CN Application No. 200880011660.2, Includes English Translation. 7 pages.
CN Office Action dated Nov. 6, 2013 in CN Application No. 200880011660.2, English translation. 5 pages.
CN Office Action dated Nov. 6, 2013 in CN Application No. 200880011660.2, Including English Translation. 11 pages.
EP Communication Pursuant to Article 94(3) EPC dated Feb. 9, 2018 re: EP Appln. No. 17157845.3. 5 Pages.
EP Communication Pursuant to Article 94(3) EPC dated Feb. 1, 2016 re EP Appln. No. 08742848.8. 6 Pages.
EP Extended European Search Report dated May 12, 2017 re: EP Appln. No. 17157845.3. 9 Pages.
EP Office Action dated Jul. 24, 2014 in EP Application No. 08742848.8. 6 pages.
EP Office Action dated Nov. 6, 2012 in EP Application No. 08742848.8-2212. 5 pages.
EP Office Action dated Sep. 20, 2013 in EP Application No. 08742848.8. 4 pages.
EP Office Communication dated Dec. 6, 2011 re EP Application No. 08742848.8. 4 Pages.
EP Response dated Apr. 10, 2013 to the Official Communication of Nov. 6, 2012, in EP Application No. 08742848.8, Includes New Claims & New Description Pages (Clean and Highlighted Copies). 27 pages.
EP Response dated Feb. 3, 2014 in EP Application No. 08742848.8, Includes New Claims and New Description pp. 2 and 2a (Clear and Highlighted Copies). 18 pages.
EP Response dated Jun. 14, 2010 re EP Application No. 08742848. 8, includes New Claims 1-43. 12 Pages.
EP Response dated Mar. 7, 2014 in EP Application No. 08742848.8. 5 pages.
EP Response Filed Jun. 7, 2018 in response to the Official Communication Pursuant to Art. 94(3) EPC dated Feb. 9, 2018 re: EP Appln. No. 17157845.3. 17 Pages.
EP Response Filed on Nov. 3, 2017 in response to the Official Communication Pursuant to Rule 69 EPC dated Aug. 7, 2017 and the Extended European Search Report dated May 12, 2017 re: EP Appln. No. 17157845.3. 17 pages.
EP Response with EP Appln. No. 08742848.8 filed on Dec. 21, 2015 in Response to the Summons to Attend Oral Proceedings of Sep. 1, 2015. 37 Pages.

(56) References Cited

OTHER PUBLICATIONS

EP Submission dated May 24, 2012 re EP Application No. 08742848. 8, includes new claims (clear copy and highlighted), claim chart, and new description page. 49 pages.
Gibbard et al., "Asymmetric Signal Processing for Indoor Wireless LAN's," IEEE Transactions on Vehicular Technology, vol. 48, No. 6, Nov. 1999, XP011063963, Pisctaway, NJ. 12 pages.
Gu, Xinli et al., "Re-Using DFT Logic for Functional and Silicon Debugging Test", ITC International Test Conference, IEEE, Paper 23.3, 2002. pp. 648-656. 9 Pages.
Information Disclosure Statement, dated Jun. 30, 2010, in U.S. Appl. No. 12/745,494. 5 pages.
JEDEC Standard, "Double Data Rate (DDR) SDRAM Specification" JEDEC Solid State Technology Association, JESD79, Jun. 2000. 76 Pages.
Madden, Chris et al., "System Level Deterministic and Random Jitter Measurement and Extraction for Multi-gigahertz Memory Buses", IEEE, 2004, pp. 7-10, 4 Pages.
Miscellaneous Letter submitted on Jun. 4, 2010 re U.S. Appl. No. 12/627,769. 1 Page.
PCT Preliminary Report (Chapter II) dated Dec. 6, 2011 for Int'l. Application PCT/US2008/004790. 8 Pages.

\* cited by examiner

MEMORY CONTROLLERS, SYSTEMS, AND METHODS SUPPORTING MULTIPLE REQUEST MODES

This application is a continuation of U.S. patent application Ser. No. 16/790,183 for "Memory Controllers, Systems, and Methods Supporting Multiple Request Modes," filed on Feb. 13, 2020 on behalf of first-named inventor Richard E. Perego, which is a continuation of U.S. patent application Ser. No. 15/916,193 for "Memory Controllers, Systems, and Methods Supporting Multiple Request Modes," filed on Mar. 8, 2018 on behalf of first-named inventor Richard E. Perego (issued on Mar. 24, 2020 as U.S. Pat. No. 10,600, 455), which is a continuation of U.S. patent application Ser. No. 15/169,331 for "Memory Controllers, Systems, and Methods Supporting Multiple Request Modes," filed on May 31, 2016 on behalf of first-named inventor Richard E. Perego (issued on May 1, 2018 as U.S. Pat. No. 9,959,914), which is a continuation of U.S. patent application Ser. No. 14/305,799 for "Memory Controllers, Systems, and Methods Supporting Multiple Request Modes," filed on Jun. 16, 2014 on behalf of first-named inventor Richard E. Perego (issued on Jun. 28, 2016 as U.S. Pat. No. 9,378,787), which is a continuation of U.S. patent application Ser. No. 12/745, 494 for "Memory Controllers, Systems, and Methods Supporting Multiple Request Modes," filed on May 28, 2010 on behalf of first-named inventor Richard E. Perego (issued on Dec. 30, 2014 as U.S. Pat. No. 8,924,680); said applications are hereby incorporated by reference. U.S. patent application Ser. No. 12/745,494 is a continuation of U.S. patent application Ser. No. 12/595,125 for "Memory Controllers, Systems, and Methods Supporting Multiple Request Modes," filed on May 3, 2010 on behalf of first-named inventor Richard E. Perego, which in turn is a national stage application of PCT Patent Application PCT/US2008/ 004790, filed on Apr. 11, 2008; PCT Patent Application PCT/US2008/004790 in turn claims priority to each of U.S. Provisional Application Nos. 60/911,435 and 60/988,826, respectively filed on Apr. 12, 2007 for "Memory Devices Controlled By Point-To-Point Control And Address Signals With Adjustable Width And Rate" on behalf of first-named inventor Frederick A. Ware and on Nov. 19, 2007 for "Reconfigurable Memory Device and System with Multi-port Request Logic" on behalf of first-named inventor Richard E. Perego. Priority is claimed to each of the aforementioned applications.

FIELD

This invention relates to semiconductor memory technology as well as related uses of the semiconductor memory technology.

BACKGROUND

The design and fabrication technology of semiconductor memory devices has evolved rapidly over the past decade. In the case of dynamic random access memories (DRAMs), for example, the number of bits of data stored in a single DRAM chip has increased by a factor of four roughly every three years. This has resulted in the doubling of the size of memory systems at the same rate. Each new higher density generation of DRAMs reduces the number of individual memory chips needed in a system by one half. Fewer (but higher density) individual DRAM chips in memory systems results in fewer total number of pins available for transfer of data within the system. Reducing the number of pins available for receiving and transmitting information decreases the bandwidth of the memory system. That is, while internal to the memory chip large numbers of bits can be accessed per cycle, only a small percentage of the data can make it across the device boundary to the external world in any given time interval.

Today's advanced computing systems and microprocessors, however, demand greater and greater data bandwidths from memory systems. This has resulted in a more concerted effort in the memory industry to devise solutions to the bandwidth bottleneck. One approach to improving the data bandwidth in memory systems has focused on designing high speed interface structures. A memory sub-system based on a very fast and efficient interface technology that exploits a number of innovative data transmission techniques is described in U.S. Pat. No. 5,319,755 (Farmwald et al.) and 5,430,676 (Ware et al.). Other approaches have focused more on the internal circuitry of the memory devices to increase the rate of data transfer.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Overview

An advanced memory device and system with multiple request (RQ) ports is disclosed. Embodiments allow RQ bandwidth to scale with data (DQ) bandwidth by using similar point-to-point topologies and signaling rates while allowing capacity scaling with provisions for maintaining low or constant access granularity. The description of the figures focuses on showing the routing of communications and the operation of the devices but often omits detailed schematics that would otherwise clutter the description and occlude comprehension of the embodiments shown.

Terminology and Notation

"Point-to-point": For purposes of this description, the term "point-to-point" will generally refer to a dedicated communication channel between two points, e.g. a controller to a memory. Generally, the point-to-point signal will travel directly between the two points without intermediate active components. However, in some cases buffers and/or inverters, or other items may be present on the signaling path. The general contrast is versus a shared communication channel, such as a multidrop bus, where the same channel is shared with other active components, e.g. for the controller to talk to a first memory, the signal must pass through a second memory.

"Port": For purposes of this description, the term "port" will generally refer to one or more signaling wires used to transmit a logically related group of information. For example, if a unit of transmission comprises two symbols transmitted in series using single-ended signaling, then one port in that example could be physically implemented using a single wire, or printed circuit board (PCB) trace, etc. If the same unit of transmission was sent using differential signaling, then one port could be physically implemented using two wires, or PCB traces, etc. In the memory context of one request (RQ) packet one port provides adequate signaling wires for all of the necessary command and address (CA or C/A) information to describe the request based on the signaling methodology, symbol encodings, and serialization/deserialization in use. The meaning for DQ packets and ports is analogous. Note that if multiwire coding schemes are used for transmission, it may be that some wires are shared across multiple ports in the specific physical implementation on a given chip and/or circuit.

Figure 7:
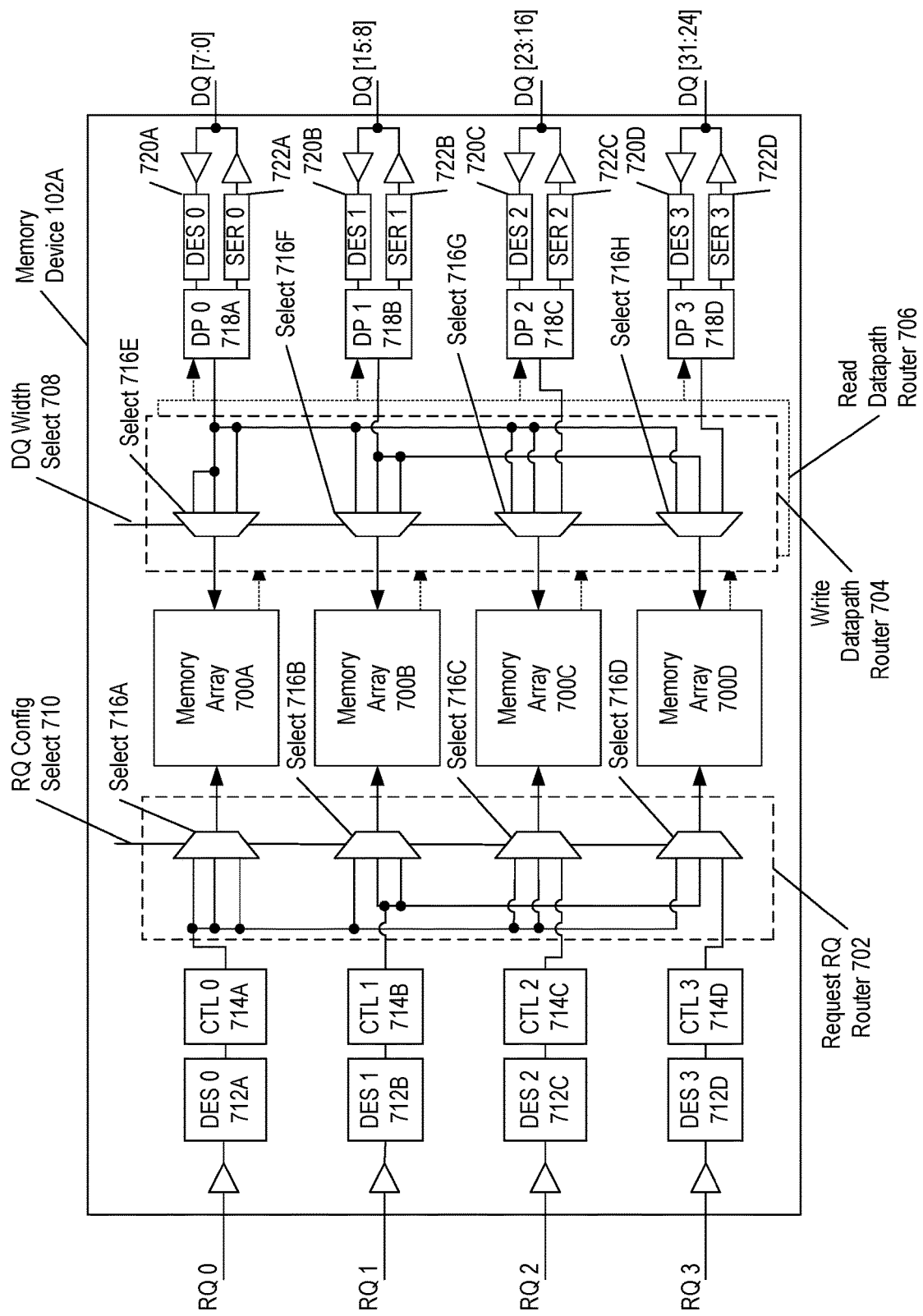
FIG. 7 illustrates a simplified schematic for a memory for use in the system of FIGS. 1-6, in this illustration the write datapath router detail is provided.

Number of Ports Shown on Figures: Since reconfigurable memory controllers and memory devices and related systems are a focus of embodiments described herein, it is convenient in the figures to often notate the number of ports in use for a given function, e.g. either RQ or DQ. For example, In FIG. 1, the memory device 102A is shown with RQ 4×1 and DQ 4×8. This indicates a configuration that includes four single-link RQ ports and four eight-link DQ ports. Contrast that with FIG. 3, where the same memory device 102A is shown with RQ 1×1 and DQ 1×8, which indicates a configuration that includes one single-link RQ port and one eight-link DQ port. FIG. 7 and the accompanying text, infra, provide context for a single implementation of the memory devices 102A-D shown in FIGS. 1-6. In some embodiments the number of ports that are in use may be different from the number of physical ports. Whether a given reference is to a physical port or a subset of physical ports that happens to be used in a given embodiment will be clear in context.

"Request" or "RQ": When used in the context of memory in this description, the term request (RQ) is interchangeable for command and address (C/A). Similarly, C/A may be used interchangeably for RQ.

Example Systems

Figure 1:
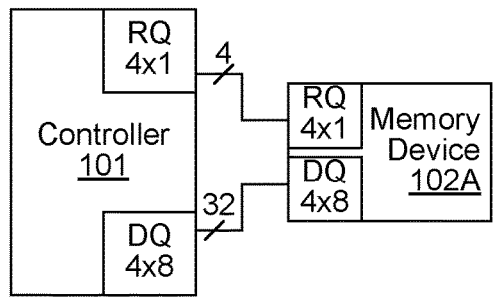
FIG. 1 shows system with a controller coupled to a memory in a first configuration.
Figure 2:
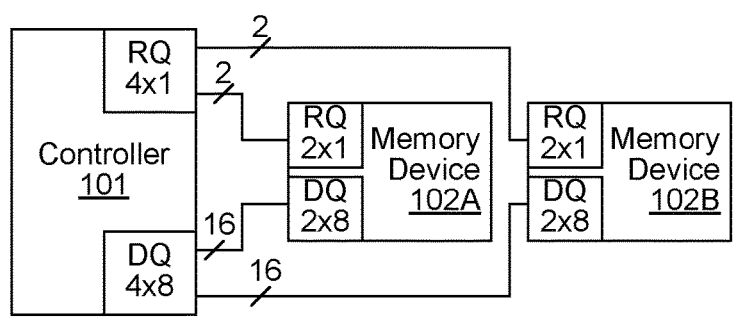
FIG. 2 shows the system of FIG. 1 in a second configuration.
Figure 3:
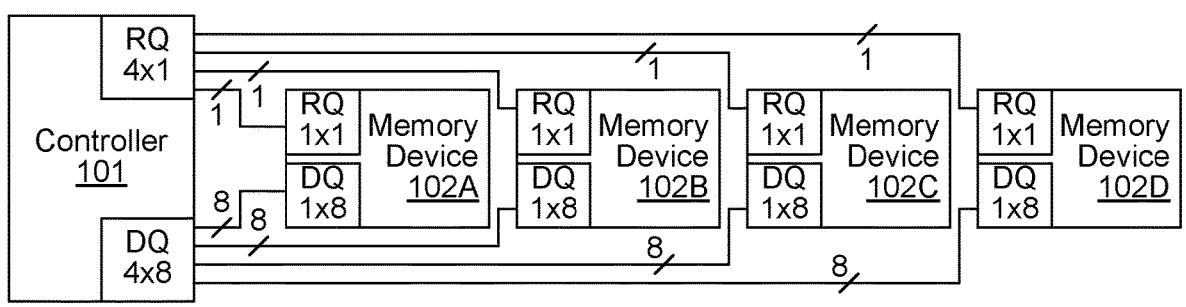
FIG. 3 shows the system of FIG. 1 in a third configuration.

FIGS. 1-3 show the capacity scaling capabilities of this configurable point-to-point architecture via discussion of an exemplary system 100.

FIG. 1 shows a system 100 according to a first configuration. In this configuration, a controller 101 is coupled in communication with a memory device 102A. Controller 101 has four single-link request ports RQ and, for each request port, an eight-link data port DQ. In this first configuration, all of the RQ ports (four single-link ports, or 4×1) and all of the DQ ports (four eight-link ports, or 4×8) of the controller 101 are coupled in communication with a single memory device 102A. As discussed above, the physical wiring or communication topology is implementation specific. For example if the system employs a 32 symbol request packet then each of the four RQ ports will receive a different packet per period of time. In this configuration each of the request ports is coupled to a different memory array inside the memory device. See the discussion of FIG. 7, infra, for more on the memory device 102A. Alternate terms for the memory array may be quadrants (quads), or sections. The memory array itself may be subdivided into multiple banks. Throughout these examples, a burst length, or prefetch, of 32 symbols per link is assumed in calculations unless otherwise noted.

It is useful to consider that some embodiments make advantageous use of high speed RQ ports that might be as little as one link (e.g. one wire for single ended signaling or two wires for differential signaling). In such embodiments, if the RQ links run at, or close to, the speed of the DQ links there are fewer wires associated with each RQ port to route. For example, in an XDR® memory system, there are 12 single-ended wires, or links, used to provide request (command and address) information to the memory devices. Each request packet is 24 bits sent in two symbols per packet across the 12 links (See the discussion of FIG. 11B, infra, for a sample timing diagram.) In the nomenclature of this description, those 12 single-ended wires, or links, would be considered one RQ port. In contrast, according to some embodiments the RQ link or links can be implemented using one or more differential wiring pair conveying request packets at the same speed as the DQ links (e.g., 32 symbol or RQ packets). In such embodiments, FIG. 1 would require only four differential wiring pairs (8 total wires) to couple all four RQ ports of the controller 101 to the RQ ports of the memory device 102A. According to the illustrated embodiment, the bit rate for each RQ link is identical to the bit rate for each DQ link, so one RQ link could send an independent read or write request for 32 bytes (32 symbols×8 DQ links per RQ link). If four (4) concurrent requests are sent over each of the four RQ ports, the total number of data bytes accessed per packet time would be 4×32 bytes, or 128 bytes.

FIG. 2 shows system 100 in a dual-device configuration in which controller 101 is coupled in communication with memory devices 102A and 102B. Controller 101 has two RQ ports coupled to each memory device 102A, and each memory device 102A is configured to include two single-link RQ ports (e.g. 2×1). The DQ ports on controller 101 are similarly split, two to memory device 102A and two to memory device 102B, or sixteen data links to each memory device. To accommodate this split, each memory device is configured to provide two single-link request ports (2×1). As a result, the total number of data bytes accessed per memory device 102A (or memory device 102B) per packet time is cut in half to 2×32 bytes, or 64 bytes. The controller 101 will add additional addressing information, e.g. 1 bit, to each request packet sent over the RQ ports because the controller 101 needs to address twice the memory device capacity as in FIG. 1, but now at half the number of data bytes per memory device per packet time. See the discussion of FIG. 7, infra, to see how the four memory arrays within a device can be divided into even and odd groupings. In one embodiment, the size of the RQ packet remains fixed, e.g. 32 symbols, despite the additional addressing information. The DQ packet length remains fixed since the embodiments of FIGS. 1-3 are focused on capacity scalability.

FIG. 3 shows the system 100 according to a third configuration. In this configuration, the controller 101 is coupled in communication with memory devices 102A-D. Of the four RQ ports on the controller 101, one is coupled to each of the memory devices 102A-D. Similarly, of the four DQ ports, one (eight data links) is coupled to each of the memory devices 102A-D. As a result, the total number of data bytes accessed per memory device 102A-D per packet time is cut in half again compared to FIG. 2, to 1×32 bytes, or 32 bytes total. Here, the controller adds still more addressing information than used in FIG. 2, e.g. one bit more, to each RQ packet, all while maintaining the size of the RQ packet fixed, because the controller 101 will need to address twice the memory device capacity as in FIGS. 1-2, but now at 32 data bytes per memory device per packet time. The request interface of each memory device includes one, single-link port in this configuration. Thus in this third configuration, the four RQ packets each go to different memory devices, and each memory device 102A-D has 8 DQ links that are routed to the appropriate memory array within the device according to the addressing information. DQ packet time is unchanged in this configuration. In effect, the memory capacity doubles in FIG. 2 as compared with FIG. 1, and doubles again in FIG. 3, all while maintaining the same number of point-to-point connections for both the data DQ and request RQ links that extend between memory controller 101 and the attached memory device or devices. Also advantageous from the memory controller's perspective, the transaction granularity is the same for one, two, or four memory devices. The storage capacity of system 100 can thus be scaled while maintaining the use of point-to-point connections and constant per-port access granularity.

Having described the basic topology and layout of the elements, system 100 will now be described in greater detail along with the functional aspects. In one embodiment the system 100 is a computer system, e.g. a server computer, a video game console, or a personal computer; a printed circuit board; multi-chip-module, or system-on/in-package.

The controller 101 is an integrated circuit with a memory controller, e.g. a CPU, GPU, north bridge, south bridge, etc. For example, in one embodiment the system 100 could be a game console system, the controller 101 could be a modified Cell Broadband Engine from IBM. The game console system could have a fixed number of memory devices of the same type as memory device 102A, e.g. two devices such as in FIG. 2. Other numbers of memory devices than shown in FIGS. 1-3 could be supported off a single controller with appropriate adjustments to the number of RQ/DQ ports on the controller 101. See e.g. discussion of FIG. 11, infra.

The memory devices 102A-D may be any read/write memory with a suitable interface for communicating with the controller, e.g. RAMs, DRAMs, non-volatile memory, SRAM—or even ROM devices in read only mode—might also be used. The memory devices 102A-D can be either directly coupled to the system 100, e.g., soldered to the printed circuit board (PCB) or removable on modules such as DIMMs, SIMMs, etc. See discussion of FIG. 9, infra, for one embodiment using modules.

Summarizing, different embodiments provide a way to have a single controller, e.g. controller 101, that supports a wide range of memory capacity (one to four memory devices in the example) while maintaining point-to-point routing for both RQ and DQ ports. All of the memory devices 102A-D are coupled to the controller in a point-to-point fashion. In these embodiments, the memory devices 102A-D are programmable in DQ width and have configurable request logic. The programmability and reconfigurability can be auto-detecting based on the presence/absence of memory devices or modules, programmable through one or more fusable, flashable, or electrically programmable registers, set through jumpers on the system 100, controlled by the request packet information, and/or other means. These embodiments all offer advantages in that a single type of memory device, e.g. memory device 102A, can be used in very different configurations.

The controller 101 can also be used in another set of configurations for scalable access granularity. In the three configurations discussed so far in connection with FIGS. 1-3, the access granularity per RQ port remained constant at 32 bytes. This result can be derived from the following assumptions, 32 symbols/DQ link/request×8 DQ links/RQ port. The controller 101 can also be used in configurations that allow granularity scalability, which will be described in conjunction with FIGS. 4-6.

Figure 4:
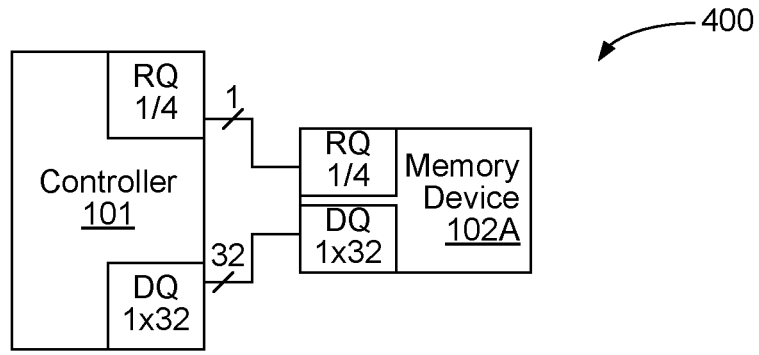
FIG. 4 shows a system with a controller coupled to a memory in a fourth configuration.

FIG. 4 shows a system 400 in a fourth configuration. The system 400 provides for granularity scalability using different configurations. In the fourth configuration, controller 101 is coupled to memory device 102A. Notably, only one of the four RQ ports (1/4) in the controller 101 is used in this first configuration. Again, per the discussion of notation, supra, the actual number of ports on the controller 101 and memory device 102A may be different. The relevant point is the number in use in this configuration. Following through this example of FIGS. 4-6 the adaptability of a single memory device 102A to a variety of different controller configurations will be apparent. Note that the address length in each request packet in FIG. 4 would be shorter than the address information for the system 100 as configured in FIG. 1. This is because the same memory with larger access granularity has fewer addressable locations. However, the request packet format could still be of a constant size across all of these configurations.

Figure 5:
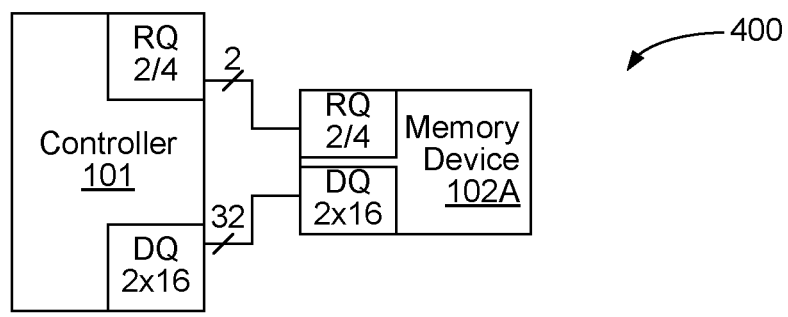
FIG. 5 shows the system of FIG. 4 in a fifth configuration.
Figure 6:
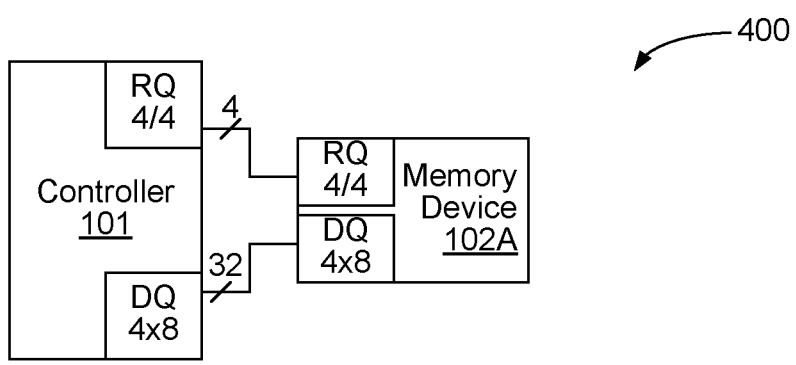
FIG. 6 shows the system of FIG. 4 in a sixth configuration.

In the fifth configuration shown in FIG. 5, system 400 has the controller 101 coupled to the memory device 102A using two of the four RQ ports (2/4) on the controller 101 and the memory device 102A. In the sixth configuration, of FIG. 6, all four RQ ports (4/4) are used on both devices. Using the example, in the fourth configuration, shown in FIG. 4, the access granularity would be 128 bytes. This result can be derived from the following assumptions: 32 symbols/DQ link/request×32 DQ links/RQ channel. The access granularity would be 64 bytes, and 32 bytes, in FIGS. 5 and 6, respectively, because the number of DQ links associated with each request channel would be 16 and 8, respectively. System 400 thus allows system designers to allocate the minimum RQ links required for a desired access granularity.

In one embodiment only the desired number of request links are implemented on the controller 101 for the desired system access granularity. The memory device 102A can be programmed to the desired number of independent request channels. Specifically, a game console system maker might prefer 128 byte access granularity while desktop and server computers system makers might prefer 32 byte access granularity. Accordingly, each manufacturer might only put the actual number of external request ports needed for their desired access granularity; however, the same memory device 102A can be used by these vastly different configurations. For example, the desire to have controller pin savings and/or cost reduction might be why the number of request ports might be varied on the controller 101.

As discussed memory device 102A will include one or more memory arrays, sometimes called quadrants, sections, or sectors, or even banks. Each memory array is capable of decoding independent access (e.g. read) requests. The request router within the memory device 102A can be configured to broadcast the same request to all memory arrays, to send unique requests to each memory array, and/or combinations of these or other options to make efficient use of the memory arrays. This is further described together with an example implementation in FIGS. 7-8. Additionally, each of the memory arrays may make use of micro-threading and may be comprised of smaller arrays of memory cells. In later examples, memory arrays are divided into four independently addressable "quads," each of which includes four banks.

FIG. 7 illustrates a simplified schematic for a memory device 102A for use in the system of FIGS. 1-6. The elements of FIG. 7 will be described followed by their use.

Figure 8:
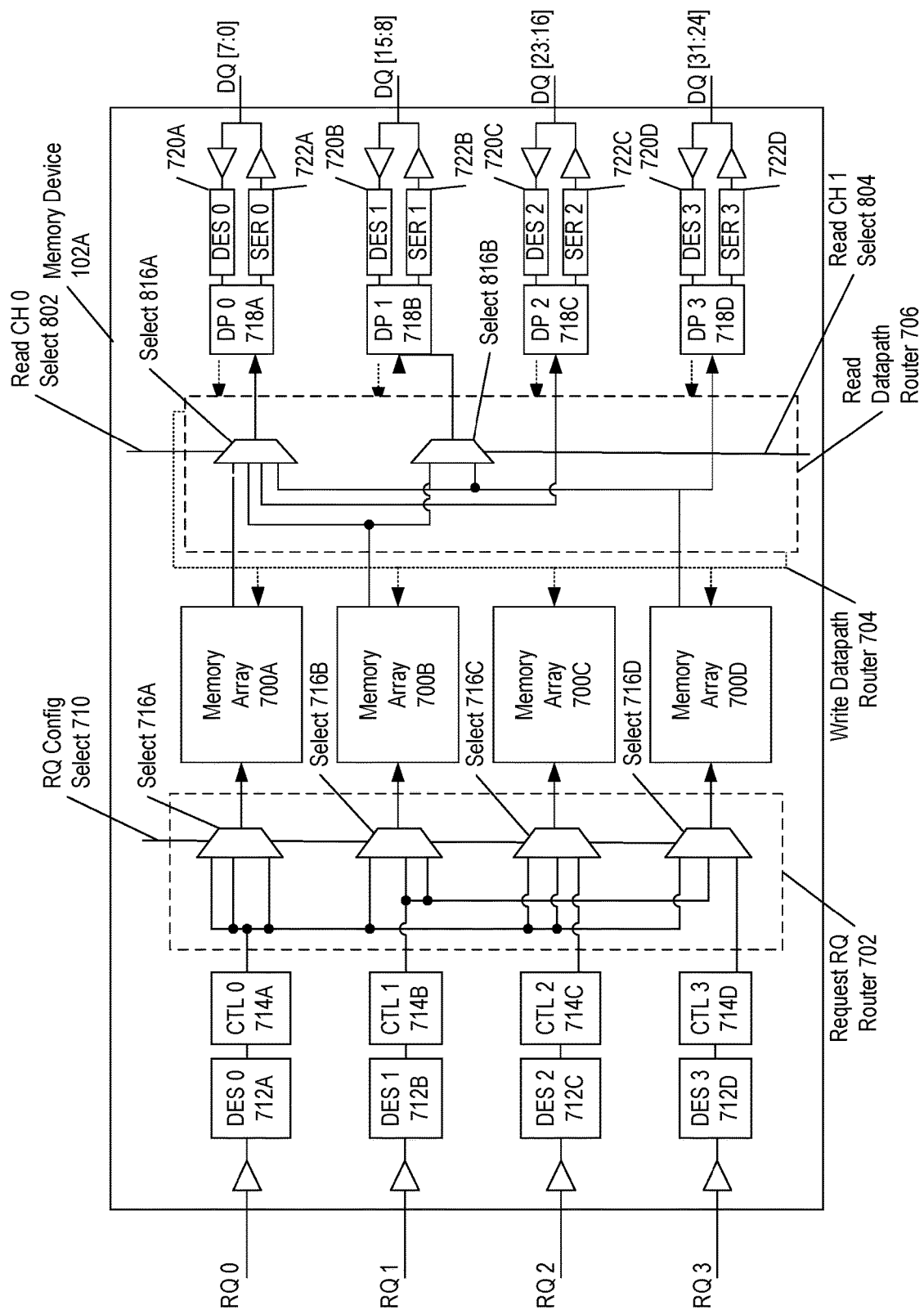
FIG. 8 illustrates a simplified schematic for the read datapath router for the memory of FIG. 7.

Memory device 102A is comprised of four memory arrays 700A-D. More arrays are possible in alternate configurations. Each memory array 700A-D is capable of independent operation. The memory arrays are coupled to a request router 702, a write datapath router 704 and a read datapath router 706. For clarity, the read datapath router 706 is not shown in detail in FIG. 7. FIG. 8 provides details on the read datapath router 706. For the rest of the discussion of FIG. 7, the details of the read datapath router 706 will be omitted with the understanding that the operation and functionality parallels the write datapath router 704.

The request router 702 and write datapath router 704 receive select signals: RQ Config select 710 and DQ width select 708, respectively. These may be distinct signals or the same signal. The signal may be coming from off the memory device 102A, e.g. from settings, jumpers, signals, wires, etc., or the signal may be calculated on the memory device 102A, e.g. with using a combination of registers, logic, etc. In either case, the RQ Config select 710 controls the number of C/A ports used while the DQ width select 708 controls the width of the device and the number of DQ ports used. In the example embodiment with four memory arrays 700A-D, the select signals vary from zero to two. Specifically, if RQ Config select 710 is zero, then only one request port RQ0 will be used; if one then two request ports RQ0 and RQ1 will be used; if two then all four request ports RQ[3:0] will be used. In a similar fashion the DQ width select 708 varies the width of the memory device: if zero then one DQ port is used (links DQ[7:0]); if one then two DQ ports are used (links DQ[7:0] and DQ[15:8]); and if two then four DQ ports are used (links DQ[7:0], DQ[15:8], DQ[23:16], and DQ[31:24]). In other embodiments scaling can be in x1, x2, x4, x8, x16, and x32. Still other scaling factors are possible. Write enable signals to the memory arrays 700A-D are elided for clarity of illustration. See, e.g., FIGS. 18-20 of US Patent Publication 2004/0221106, and accompanying text for a discussion of write enable at the module level for routing signals to memory devices in a configurable point-to-point topology.

Changing the value of the RQ Config select 710 and the DQ width select 708 switches the memory device 102A to be able to operate in the different configurations described above in connection with FIGS. 1-6.

Select 716A-H are logic that use the values of the RQ Config select 710 and the DQ width select 708 to achieve the routing of signals inside the request router 702 and the write datapath router 704. In one embodiment the select 716A-H are implemented using multiplexers. In this example configuration, the RQ Config select 710 and the DQ width select 708 might be two wires to provide inputs to the multiplexers.

The other components of the memory device 102A are shown briefly for reference. Specifically on the request side, buffers followed by deserializers 712A-D and memory request controllers 714A-D (abbreviated CTL in figure) are used. The memory request controllers 714A-D are coupled to the request router 702.

The memory request controllers 714A-D (labeled CTL 0 through CTL 3) receive deserialized command and address information, decode it, and generate address and control signals to interface to the memory arrays 700A-D. The memory request controllers 714A-D may include state machines, registers, decoders, sequencers, and the like. The example embodiment shows the memory request controllers 714A-D placed in front of the request router 702. The memory request controllers 714A-D could optionally be placed after the request router 702. In that embodiment, the request router would route deserialized, but undecoded request information. The request router 702 functionality is independent of the specific information being routed.

On the DQ side, buffers followed by deserializers 720A-D accept the input from outside the memory device 102A and serializers 722A-D are coupled to buffers to send output from the memory to the outside. The deserializers 720A-D and serializers 722A-D are coupled to respective datapath modules 718A-D. The datapath modules 718A-D are coupled to the write datapath router 704 (and the read datapath router 706).

The datapath modules 718A-D (abbreviated DP in figure) provide support for both read and writes. In some embodiments the datapath modules 718A-D have separate read and write paths. For writes, the datapath modules 718A-D perform modifications of the write data (e.g. bit inversion, error correction, masked byte replacement, mask key comparison, etc.) and generate, or transmit, write data and write enable signals to the memory arrays 700A-D. For reads, the datapath modules 718A-D perform any necessary modification of the read data (e.g. bit inversion, error correction, parity generation, latency modification, etc.) as it is forwarded from the memory arrays 700A-D to the serializers. As discussed in connection with the memory request controllers 714A-D, the datapath modules 718A-D could be located after/before the write datapath router 704/read datapath router 706 and the functionality of those routers is independent of the specific information being routed.

FIG. 8 illustrates a simplified schematic for the read datapath router 706 for the memory device 102A of FIG. 7. Specifically focusing on different elements versus FIG. 7, the read datapath router 706 is now shown in detail including selects 816A-B for achieving the routing functionality. Two read selects are provided in this example embodiment to control selects 816A-B: read CH 0 select 802 and read CH 1 select 804. The value of these two is a function of the current settings for DQ width select 708 and the address decode. See, e.g., FIGS. 18-20 of US Patent Publication 2004/0221106 and accompanying text for a discussion of address decode at the module level for routing signals to memory devices in a configurable point-to-point topology.

In some embodiments, use of the request ports can be multiplexed in time to stagger requests across different memory arrays. For example, if one request is in use, instead of sending the same packet to all four memory arrays, the C/A information can be staggered in time such that different C/A information is provided to each memory array within the device.

Although one embodiment of the write datapath router 704 and the read datapath router 706 are shown, other routing embodiments are possible to provide for flexible use of the memory arrays 700A-D. For example, a full crossbar with the capability to route any input port to any to any output port based upon a dynamic route selection could be used. Route selection in these embodiments could be decoded from input pins, fuses, register settings, address bits and/or fields of the request packets, other signals, and/or some combination of these options.

Use in Conjunction with Memory Modules

Figure 9:
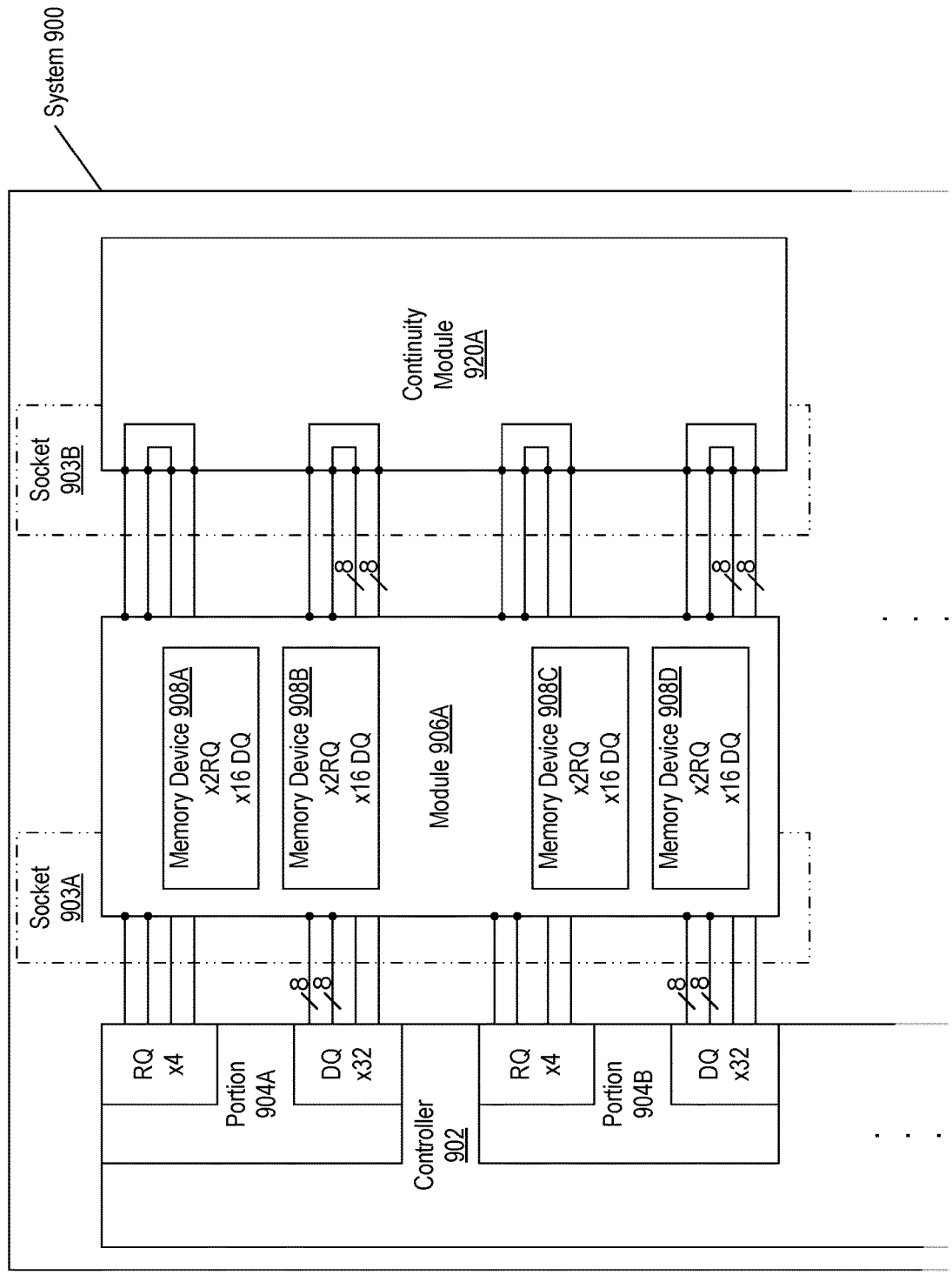
FIG. 9 is a diagram of an unbuffered module embodiment in a base configuration.

The discussion of FIGS. 1-6 concerning system configurations employing memory devices and controllers supporting a variety of embodiments has focused primarily on controllers coupled directly to individual memory devices—as opposed to memory devices on memory modules. Embodiments that make use of modules such as DIMMs, SIMMs, and/or other types of memory modules are also possible. These embodiments have two primary flavors: unbuffered and buffered. FIG. 9 illustrates an unbuffered module embodiment.

FIG. 9 is a diagram of an unbuffered module embodiment in a base configuration. The upgraded configuration will be considered in conjunction with FIG. 10, infra. FIG. 9 illustrates a system 900 with a controller 902 and sockets 903A-B to receive memory modules and continuity modules. In the base configuration, a memory module 906A is shown in socket 903A and a continuity module 920A is shown in socket 903B. The continuity module can also be referred to as a shorting module. The portion of controller 902 shown has two portions 904A-B, these portions can also be called memory channels. The implementation of controller 902 need not separate the two portions physically, e.g. they can be intermingled. Not shown in the figure are a parallel "bottom half" of the system 900 where the controller 902 has two additional portions, communication paths and sockets for two additional memory modules or continuity modules. The operation of portion 904A will be discussed; portion 904B operates in a like fashion. The unseen bottom portions also operate in a like fashion. In considering the capacity and other characteristics of the system 900, the contribution of memory modules, memory devices, etc., will be considered.

Whether the two portions 904A-B operate independently or in "lock step" (e.g. independent request information for DQ ports in portion 904A and portion 904B or common, identical, request information) is an implementation decision. Additionally, solid circles identify active communications ports. In this single-module configuration, portion 904A is coupled to a memory module 906A and a continuity module 920A. The continuity module 920A, sometimes called a shorting module, is inserted in the base configuration of system 900 to provide the point-to-point connections "back to" memory module 906A. Alternative embodiments do not use continuity modules and instead use other approaches to provide the point-to-point topology back to memory module 906A.

The memory module 906A includes memory devices 908A-D. Each of which is of the general design of memory device 102A which was discussed supra in conjunction with FIGS. 7-8 in detail; however, in this example, memory devices 908A-D have only two request ports and two eight-link DQ ports. All connections from the controller 902 to the memories 908A-D are point-to-point. In the base configuration, in portion 904A, the two request ports that communicate to module 906A directly are routed to a respective request port on each of memory devices 908A-B. The other two request ports on portion 904A communicate to the memory devices 908A-B, one request port on each memory by way of the continuity module 920A. The DQ configuration is analogous but in bundles of eight links. The specific on-module routing of the RQ and DQ ports on modules 906A-B is omitted for clarity.

Figure 10:
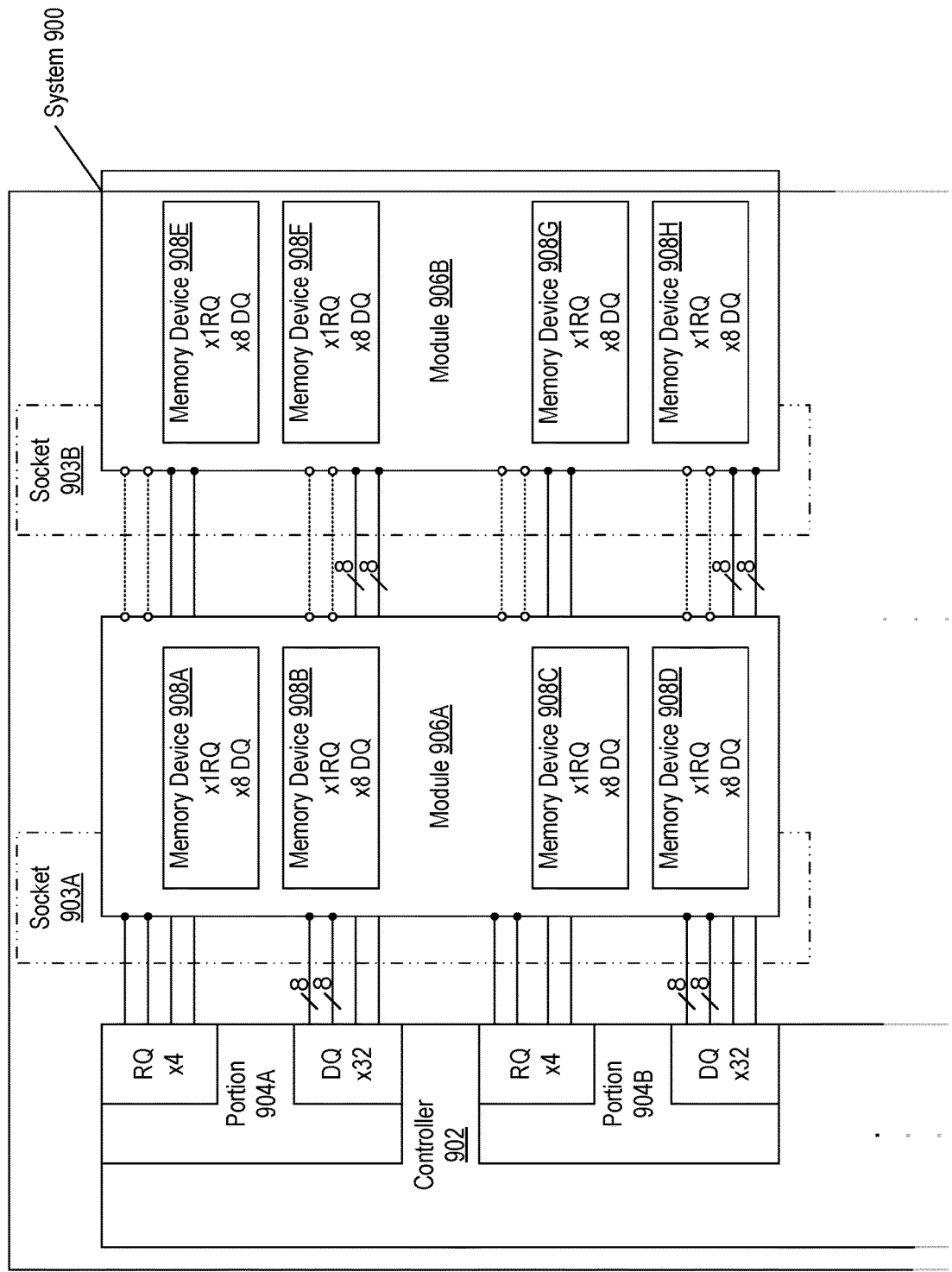
FIG. 10 is a diagram of an unbuffered module embodiment in an upgraded configuration.

FIG. 10 is a diagram of an unbuffered module embodiment in an upgraded configuration. It is similar to FIG. 9, however the continuity module 920A has been removed from the socket 903B and replaced with a memory module 906B having memory devices 908E-H (all of which of are of like design to the memory devices 908A-D). As shown, all of the memory devices 908A-H now make use of only a single RQ port and a single eight-link DQ port. This is directly analogous to the difference between FIG. 1 and FIG. 2. In FIG. 10, open circles with dotted line paths indicate inactive communication ports. Specifically, the dotted lines between memory module 906A and memory module 906B show that those request links for the path back to memory module 906A are not active for the memory channel being driven by portion 904A.

Assuming that the system 900 requires at least one filled socket for each "half" of the controller 902 (e.g. two module minimum since this is a four socket system), the two configurations are possible as outlined in Table 1.

TABLE 1

| System Attribute | Base (FIG. 9) | Upgraded (FIG. 10) |
| --- | --- | --- |
| Memory modules | 2 | 4 |
| Continuity modules | 2 | 0 |
| Devices per module | 4 | 4 |
| Memory device C/A width | 2 | 1 |
| Memory device DQ width | 16 | 8 |
| Total # of memory devices | 8 | 16 |
| C/A bandwidth (and DQ bandwidth) | X Gbps | X Gbps |
| Capacity | Y GB | 2Y GB |
| Access granularity | Z Bytes | Z Bytes |

The units used in Table 1 are for reference purposes only, other units more appropriate to the specific values of X, Y, and Z would work equally well.

As shown, this system 900 provides the capacity benefits in a modularized form. Some observations flow from the discussion of this:

The number of RQ ports per portion can grow asymptotically up to the number of DQ links per portion (e.g. to support high-capacity configurations).

The maximum number of memory devices in the system is limited by the number of RQ ports in the unbuffered module case, since all memory devices are served via point-to-point RQ and DQ links.

Using buffered modules (not illustrated) could allow for additional modules per RQ port or DQ port behind each buffer.

Figure 11A:
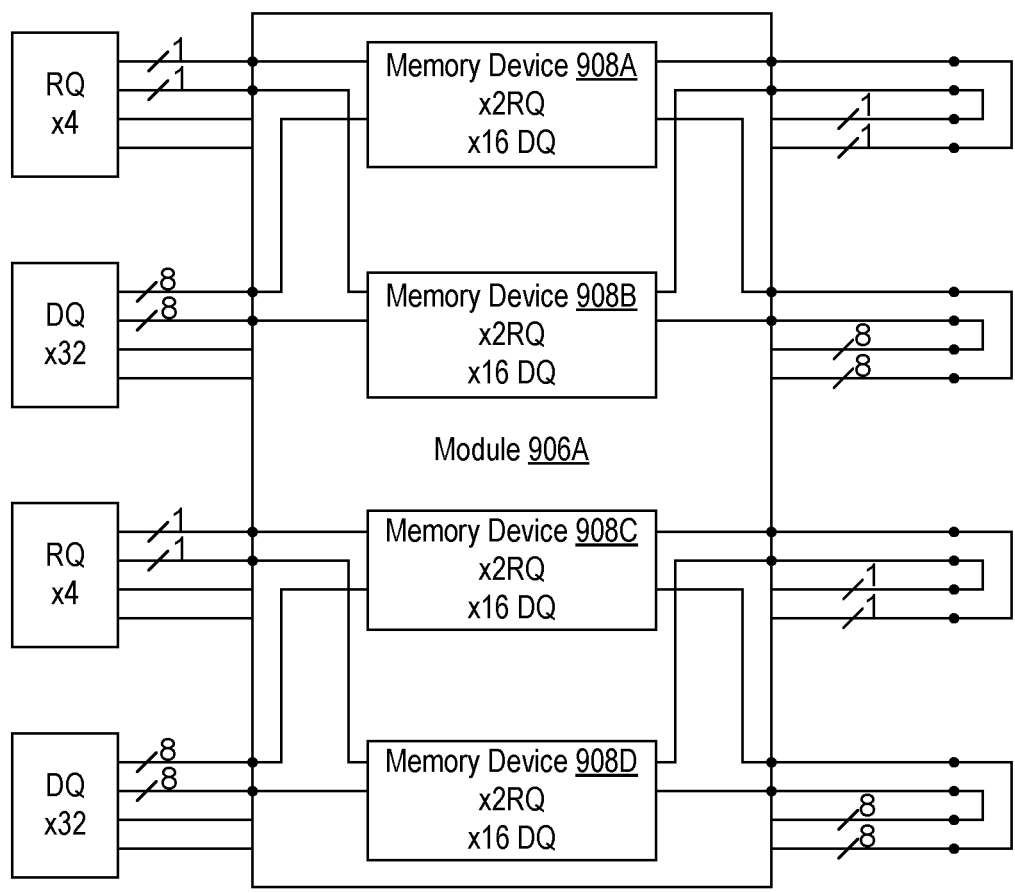
FIG. 11A is a diagram of an unbuffered module for use in the system of FIGS. 9-10.

FIG. 11A is a diagram of an unbuffered module for use in the system of FIGS. 9-10. The memory module 906A is shown in greater detail. FIG. 11 is illustrative of the base configuration of FIG. 9 and the specific routing of the RQ and DQ ports is apparent. In the upgraded configuration of FIG. 10, the communications channels on the right hand side of the memory module 906A would be unused.

Comparative Timing Diagrams

Figure 11B:
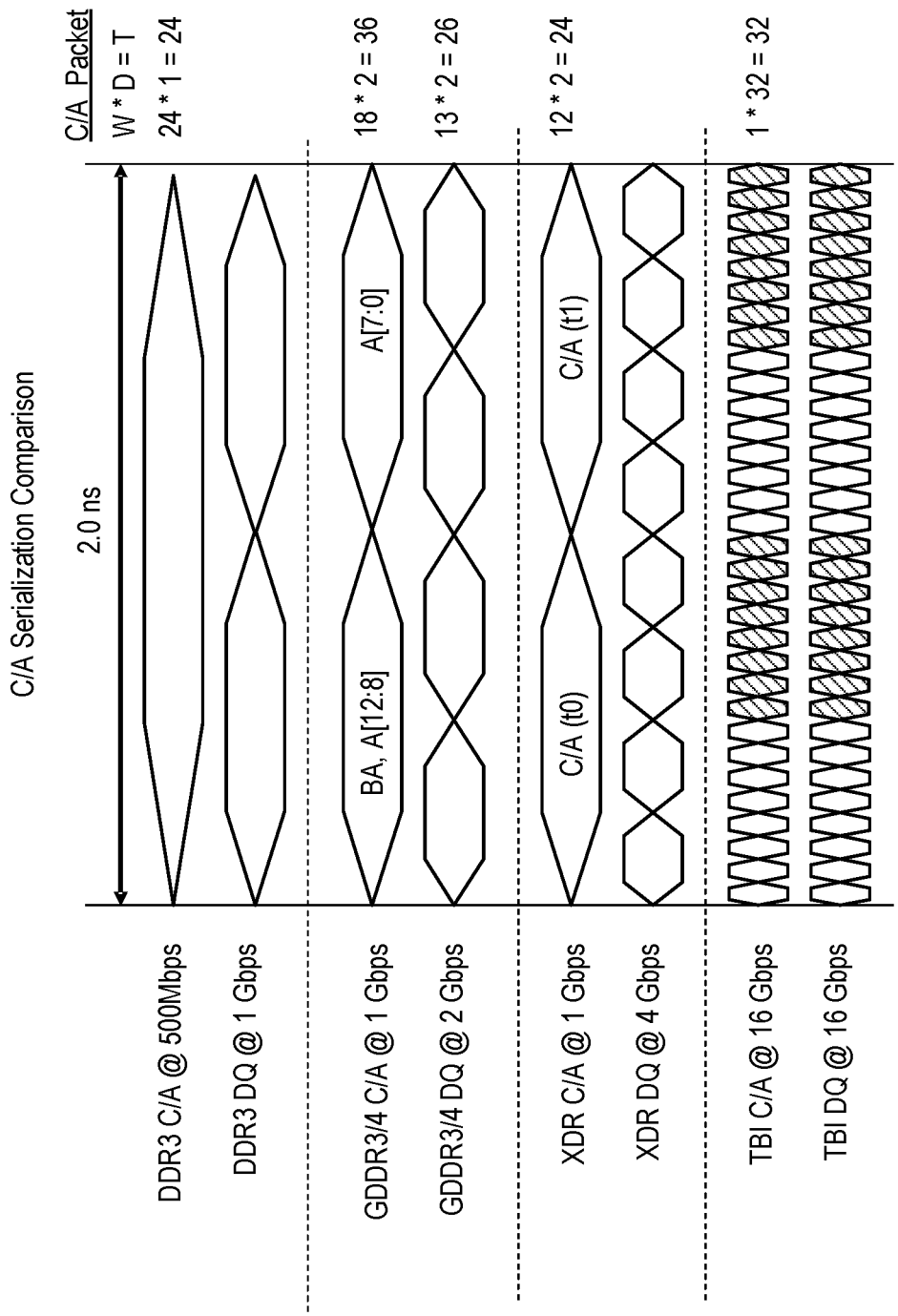
FIG. 11B shows a timing diagram comparing the request (RQ) serialization between DDR3, GDDR3/4, XDR, and the serialization used according to one embodiment described herein.

FIG. 11B shows a timing diagram comparing the request (RQ) serialization between DDR3, GDDR3/4, XDR, and the serialization used according to one embodiment described herein. The timing diagram shown also illustrates the serialization of data DQ according to several existing approaches. The bottom section labeled "TBI" illustrates a proposed serialization for RQ and DQ according to embodiments described herein. In the example, a 16 Gbps (gigabit per second) data rate is used for transmitting both requests and data. As seen in the rightmost column, in this embodiment, a single RQ packet comprises 32 bits.

Alternative System Diagram

Figure 11C:
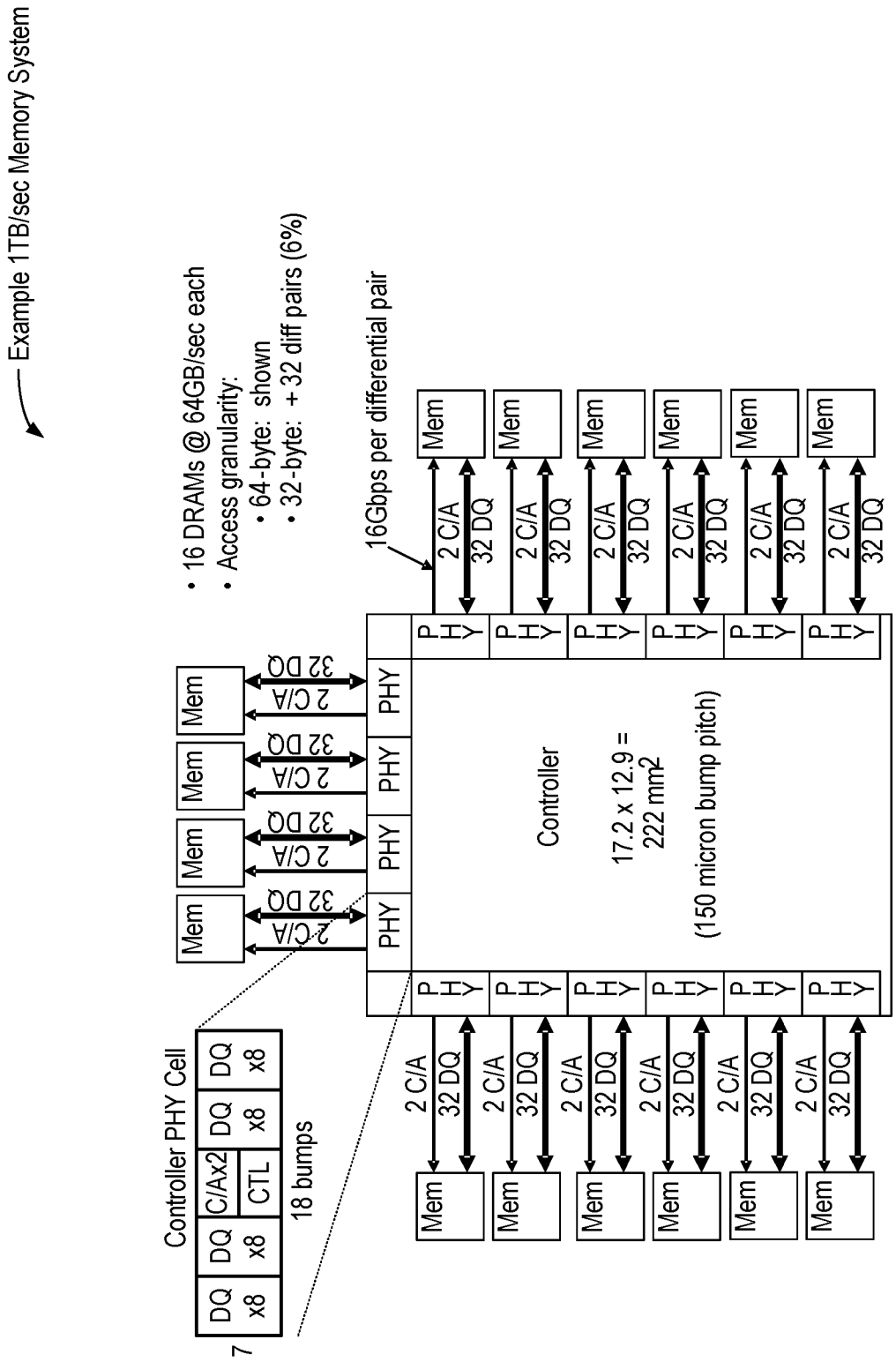
FIG. 11C shows an alternative system employing a controller according to one embodiment described herein.

FIG. 11C shows an alternative system employing a controller according to one embodiment described herein. The item labeled controller is comprised of multiple portions labeled PHY with memory devices (shown with label Mem) coupled to the controller via two C/A ports and two DQ ports. FIG. 11C is notable because it shows how to use the scalable granularity of the memory device 102A and controller 101 in a large-scale system. The controller illustrated has the ability to issue one or two requests per memory device and up to thirty-two concurrent requests to the memory system. FIG. 11C shows a one TBps (terabyte per second) memory system at 64-byte access granularity. However, 32-byte access granularity would also be possible, as would 128-byte by increasing the number of request ports used per portion on the controller to four; however, the memory device type need not be changed—only the memory device configuration, e.g. through the configuration selects discussed, supra, in connection with FIGS. 7-8. One difference between FIG. 11C and FIGS. 9-10 is that system 900 employs point-to-point routing of the RQ and DQ ports from the controller past empty sockets (e.g. using continuity modules) for capacity expansion. This requires the memory module to include some routing of the RQ and DQ ports to handle the different module topologies that are possible. In FIG. 11C, to the extent memory modules are used they are for convenience of insertion of the memory devices, e.g. there is no use of continuity modules.

Clocking and Signaling

Figure 11D:
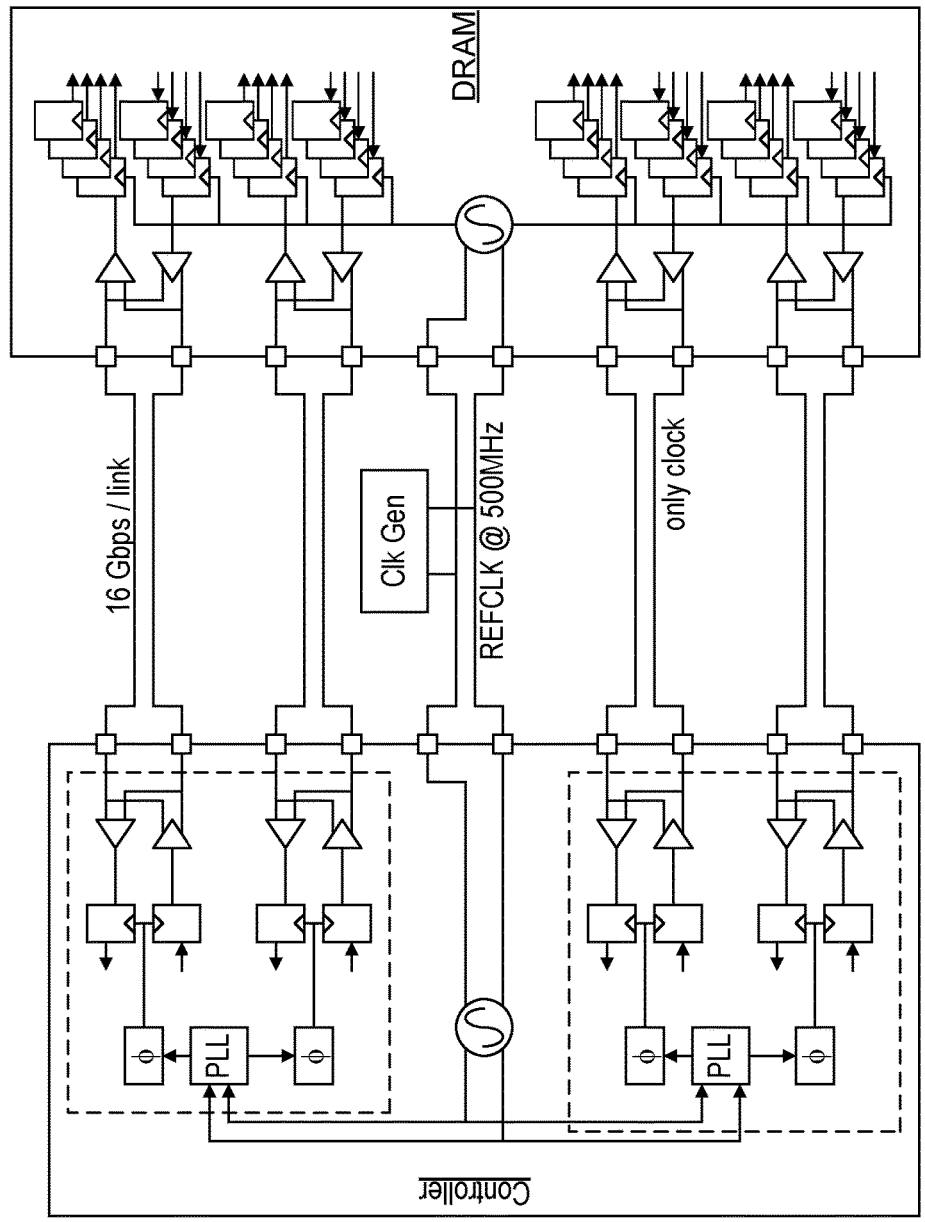
FIG. 11D shows a possible clocking and signaling approach usable according to one embodiment described herein.

FIG. 11D shows a possible clocking and signaling approach usable according to one embodiment described herein. The controller (e.g. 101 or 902) and memory devices (e.g. 102A-D and 908A-H) can use fully differential signaling, though other clocking and signaling approaches are possible. This example uses wire-only clock distribution The embodiments of FIGS. 1-11D allow request bandwidth to scale with data bandwidth by using the same or similar point-to-point topologies and signaling rates for requests and data while allowing capacity scaling with provisions for maintaining low or constant access granularity. In order to obtain maximum flexibility with respect to capacity and granularity scaling, it is advantageous for the number of independently controlled memory array sections to be greater than or equal to the number of request channels implemented. However, there are many possible ways to utilize a memory device with this degree of configuration flexibility in a system, and only a few of the possible embodiments have been described here.

One configuration would be four RQ ports with four memory arrays on a memory. This would in turn lead to the following common configurations: one RQ port drives all memory arrays; two RQ ports, one drives "even" memory arrays and the other "odd" memory arrays; each of four RQ ports independently drives one memory array. The number of RQ ports may be varied with the width of the datapath to allow fixed access granularity per request port. The memory systems can support micro-threading in some embodiments, which allows the controller to independently address different parts of a memory-device core.

Embodiments with Constant Request-Access and Data Granularity

The approaches described in connection with FIGS. 1-11D can be applied in a variety of applications to allow a memory controller to accommodate numbers and types of memory die and/or memory modules. The memory controller supports a flexible, pin-efficient request interface that provide for high-speed, point-to-point request links, and that can be used by one memory device or module, or can be shared among a number of devices or a number of modules, while preserving request and data-access granularity.

Some embodiments support adjustable request-packet signaling rates, and a selected rate may depend upon the number of memory modules or devices in a given memory system, and/or how many memory devices reside on a respective memory module. In a dual-device mode, for example, a memory controller conveys request packets to two memory devices via respective request ports at the same signaling rate. The two memory devices may reside on a same module or on different modules. In a single-device mode, the memory controller conveys request packets to a single memory device via both ports at a signaling rate lower than (e.g., half of) the signaling rate used in the dual-module mode. Memory systems in accordance with the various embodiments may include a buffer coupled between the memory controller and the one or more memory devices. The buffer may reside on a memory module on which both the first and second memory devices reside.

Figure 12:
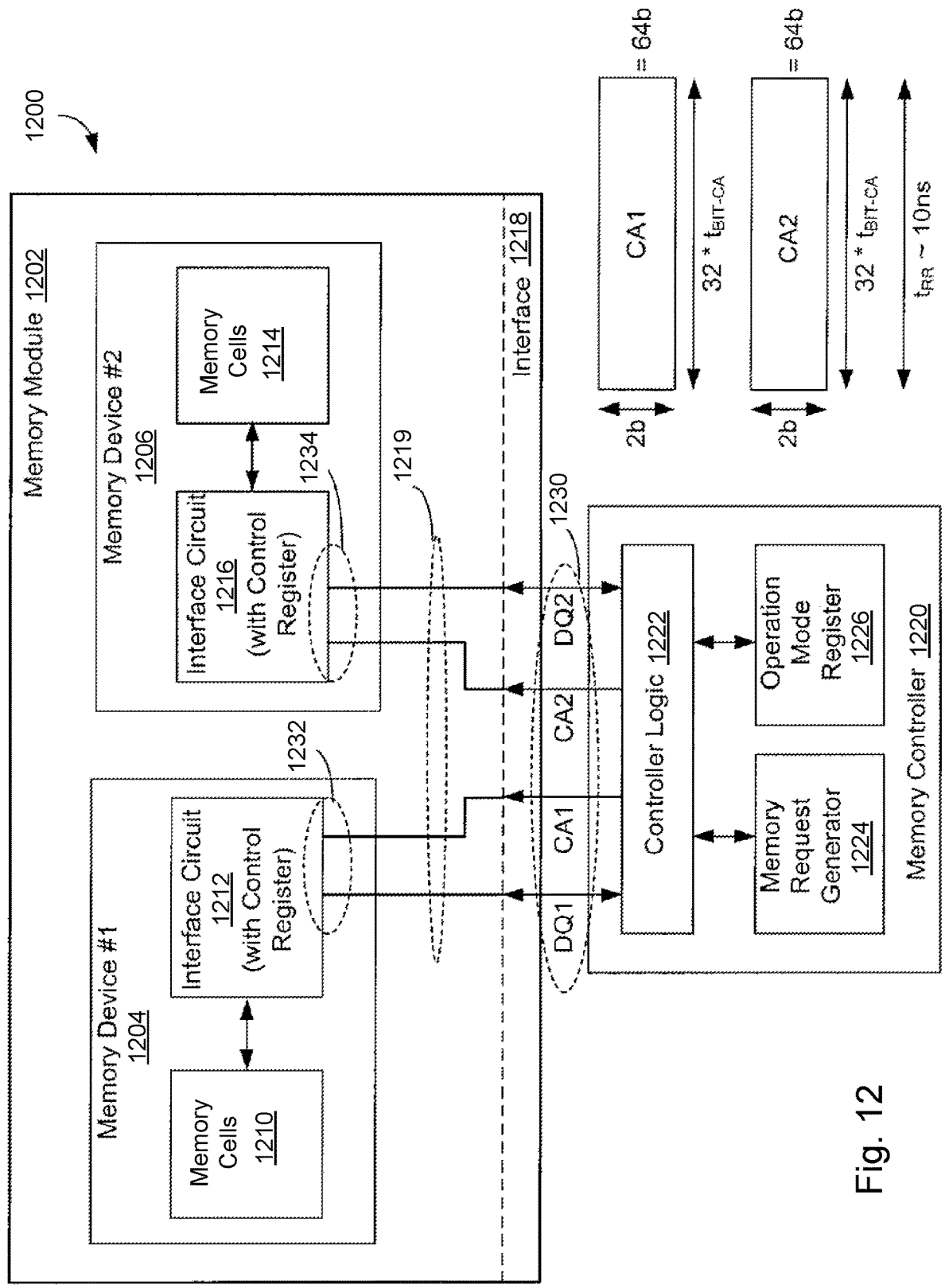
FIG. 12 is a block diagram illustrating a memory system 1200 in a first mode of operation, according to one embodiment of the present disclosure.

FIG. 12 is a block diagram illustrating a memory system 1200 in a first mode of operation, according to one embodiment of the present disclosure. The memory system 1200 includes at least one memory module 1202, a memory controller 1220, and a communication channel 1230 coupling the memory module 1202 to the memory controller 1220. In one embodiment, the communication channel 1230 includes data (DQ) links forming one or more DQ ports (e.g., DQ1 link, DQ2 link) and command/address (CA) links forming one or more CA ports (e.g., CA1 link, CA2 link). For example, the DQ lines and CA lines may be formed using signal traces on or in a circuit board (e.g., a motherboard) to which the controller 1220 and the memory module 1202 are secured.

The memory module 1202 may include one or more memory devices, such as memory devices 1204 and 1206, a connector 1218 for coupling the memory module 1202 to the DQ and CA links in the communication channel 1230, and conductive lines, or traces, 1219 for connecting the memory devices 1204 and 1206 to respective ones of the DQ and CA ports. Conductive lines 1219 may be conductive patterns formed, for example, on a printed circuit board, to which the memory devices 1204 and 1206 are secured. Although only two memory devices 1204 and 1206 are shown in FIG. 12, in practice, the memory system 1200 may include more or fewer memory devices residing on a same memory module or on different modules. Also, although memory devices 1204 and 1206 are shown as residing on a same memory module 1202, the following discussion about the memory system 1200 applies to situations when the memory devices 1204 and 1206 reside on different memory modules.

For example, the memory module 1202 may be a DIMM (Dual In-line Memory Module), and the memory devices 1204 and 1206 may be SDRAM (Synchronous Dynamic Random Access Memory), although different types of memory devices and memory modules may be used. Memory device 1204 includes memory cells 1210 and interface circuit 1212, which may also include a control register (not shown). Likewise, memory device 1206 includes memory cells 1214 and interface circuit 1216, which may also includes a control register (not shown). The interface circuits 1212 and 1216 may include input/output pins 1232 and 1234 that are connected to the conductive lines 1219 for inputting and output DQ and CA signals. For example, the first set of input/output pins 1232 are connected to CA1 and DQ1 and the second set of input/output pins 1234 are connected to CA2 and DQ2.

The memory controller 1220 includes a memory request generator 1224, an operation mode register 1226, and controller logic 1222. The memory request generator 1224 generates memory read or write requests corresponding to certain locations of the memory cells 1210 and 1214 of the memory devices 1204 and 1206. The controller logic 1222 generates control and address (CA, C/A, or RQ) signals corresponding to the particular locations of the memory cells 1210, 1214. The CA signals may include a read or write command to the memory module 1202.

The memory controller 1220 and thus the memory system 1200 are capable of operating in at least two operation modes to generate the CA signals with different CA signaling rates. In generating the CA signals, the controller logic 1222 determines the operation mode of the memory system 1200 based on, for example, an operation mode flag stored in the operation mode register 1226. For instance, the memory controller 1220 may determine the type or configuration (operation mode) of the memory module or the memory devices 1204 and 1206 through SPD (serial presence detect) information provided by the memory module 1202 to the memory controller 1220. The example shown in FIG. 12 illustrates the case where the memory system 1200 is in a first operation mode, in which each of the memory devices 1204 and 1206 is coupled to the controller 1220 via dedicated CA and DQ lines, e.g. point-to-point links. When the memory system 1200 is in the first operation mode, the controller logic 1222 generates the CA signals (CA1 and CA2) with a first signaling rate (e.g., 32 bits per one $t_{RR}$ interval, where $t_{RR}$ represents a minimum time interval between independent row accesses to a particular memory device). The CA1 or CA2 port may include multiple signal links capable of carrying multiple bits of information in parallel. In the example of FIG. 12, the CA1 or CA2 port may include two signal lines capable of carrying two bits of information in parallel, or the CA1 or CA2 port is two bits wide. So, when the CA signaling rate is 32 bits/$t_{RR}$, the CA1 or CA2 port may carry a maximum of 64 CA bits during one $t_{RR}$ interval or during 32 $t_{BIT-CA}$ intervals, wherein $t_{BIT-CA}$ represents a bit interval in a CA signal. Note that the CA1 and CA2 ports may have misaligned (staggered) $t_{RR}$ intervals, although in some examples, the CA1 and CA2 ports may have aligned $t_{RR}$ intervals. The controller logic 1222 also serves to transmit the CA signals and to transmit and receive memory data signals DQ over the ports DQ1 and DQ2.

Figure 13:
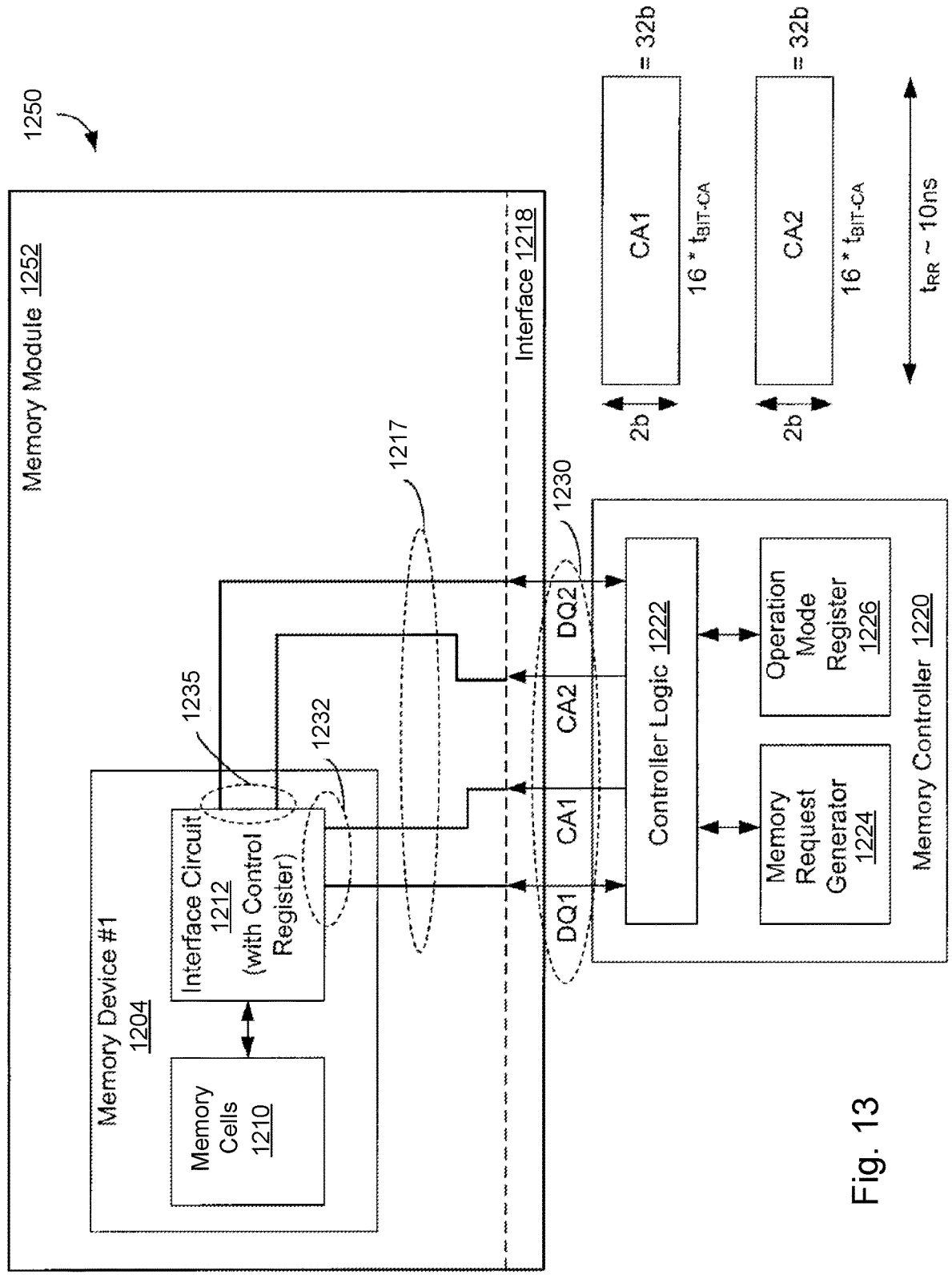
FIG. 13 is a block diagram illustrating a memory system 1250 in a second mode of operation, according to one embodiment.

As shown in FIG. 12, the memory system 1200 in the first operation mode has one memory device 1204 connected to the DQ port DQ1 and the CA port CA1 and another memory device 1206 connected to the DQ port DQ2 and the CA port CA2. For example, each of the DQ ports DQ1 and DQ2 may be 4 bits wide, resulting in a data port DQ of 8 bits wide. As stated above, memory system 1200 may include more modules and a memory module may include more or less memory devices. For example, a memory module may contain sixteen memory devices, with each memory device connected to a DQ port that is four bits wide and to a CA port that is two bits wide, so that the memory module may transmit or receive 32 CA signals in parallel and 64 DQ signals in parallel. Each of the CA ports CA1 and CA2 may be 2 bits wide, allowing 64 bits of CA information to be communicated in 32 $t_{BIT-CA}$ intervals. Since each of the memory devices 1204 and 1206 in the first operation mode in FIG. 13 is connected to a CA port that is two bits wide with a signaling rate of 32 bits/$t_{RR}$, each memory device 1204 and 1206 may receive a maximum of 64 bits of CA information in one $t_{RR}$ interval. Thus, each memory device 1204 and 1206 has at least a dedicated CA port such that CA1 is connected to memory device 1204 and not connected to memory device 1206 and CA2 is connected to memory device 1206 and not connected to memory device 1204. In this sense, in addition to the DQ ports DQ1 and DQ2, the CA ports CA1 and CA2 also have a point-to-point connection, providing a simple topology that is symmetrical to the topology of the DQ links. As a result, each memory device 1204 and 1206 may be independently accessed via the dedicated CA line. Since the topologies of the CA links are substantially the same as the topologies of the DQ links, the CA links can be operated at a signaling rate that is at the same order of magnitude as the signaling rate of the DQ links.

In one embodiment, the controller logic 1222 includes multiplexing/steering logic (not shown) to enable the generation and/or transmission of the CA signals according to the width and signaling rate of the CA links. The resulting CA data is then transmitted over the CA ports CA1, CA2 to their corresponding memory devices 1204 and 1206.

The CA signals transmitted over the port CA1 are received by the interface circuit 1212 of the memory device 1204 via input (CA) pins 1232, and the CA signals transmitted over the port CA2 are received by the interface circuit 1216 of the memory device 1206 via input (CA) pins 1234. The memory device 1204 or 1206 may be a memory device of a fixed CA width that is the same as the width of the CA port CA1 or CA2, respectively. Or the memory device 1204 or 1206 may have an adjustable CA width, and the interface circuit 1212, 1216 may include de-multiplexing/steering logic (not shown) for converting the CA data received on the CA ports (CA1 and CA2) to parallel CA data, with the serial/parallel conversion ratio adjustable depending upon the width and signaling rate of the CA ports.

When the memory device 1204 and 1206 has an adjustable CA width, the interface circuit 1212, 1216 may include a control register, which stores a flag, indicating which operation mode the memory system 1200 operates in. That is, the control register has a field indicating the operation mode of the memory system 1200. This field may be programmed at initialization by the memory controller 1220, once the memory controller 1220 determines the configuration of the memory system 1200. The control register may be written via the CA ports, the DQ ports, or a sideband link (not shown). It is also possible to use a fuse, a dedicated input pin, or another non-volatile method, instead of a volatile register field, in order to specify the operation mode to the memory devices 1204, 1206. In the first operation mode, the interface circuit 1212 and 1216 decodes the received CA signals at the first signaling rate, and provides access (read or write) to the associated memory cells 1210, 1214. Note that each memory device 1204 and 1206 communicates with CA ports having widths of CA1 and CA2, respectively, which are each two bits wide (2b) as an example. Thus, in the first operation mode, when the memory system 1200 operates with a first signaling rate (32 bits/$t_{RR}$) for each CA line, the maximum amount of CA data communicated over each CA port CA1 and CA2 is 64 bits in each $t_{RR}$ interval, as shown in FIG. 12.

Note that other components of the memory system 1200 that are not particularly relevant to illustrating the features of the present embodiment are omitted from FIG. 12. In addition, although FIG. 12 illustrates only one memory module 1202 and only two memory devices 1204 and 1206 on the memory module 1202, this is merely for simplicity of illustration and the memory system 1200 may include more memory modules and a real memory module may have more memory devices. For example, one configuration uses sixteen memory devices.

FIG. 13 is a block diagram illustrating a memory system 1250 in a second mode of operation, according to one embodiment. The memory system 1250 is similar to the memory system 1200 in FIG. 12, except that the memory module 1252 in this example has one memory device #1 1204, and that both DQ ports DQ1 and DQ2 and both CA ports CA1 and CA2 are connected to the same memory device 1204. This embodiment is similar to the embodiment of FIG. 2.

When the memory system 1250 is in the second operation mode, the controller logic 1222 generates the CA signals (CA1 and CA2) with a second signaling rate (16 bits per one $t_{RR}$ interval), which is lower than the first signaling rate (32 bits/$t_{RR}$) in the example of FIG. 12. Again, the CA1 or CA2 port may include multiple signal links capable of carrying multiple bits of information in parallel. In the example of FIG. 13, each of the CA1 port and the CA2 port may include two signal links capable of carrying two bits of information in parallel, or each of the CA1 port and the CA2 port is two bits wide. So, when the CA signaling rate is 16 bits/$t_{RR}$, each of the CA1 and CA2 ports may carry a maximum of 32 CA bits during one $t_{RR}$ interval or during 16 $t_{BIT-CA}$ intervals, wherein $t_{BIT-CA}$ represents a bit interval in a CA signal.

The memory system 1250 in the second operation mode has one memory device 1204 connected to both DQ ports DQ1 and DQ2 and both CA links CA1 and CA2. Since the CA ports, CA1 and CA2 together, may carry a maximum of 64 CA bits during one $t_{RR}$ interval or during 16 $t_{BIT-CA}$ intervals, the memory device 1204 in the second operation mode in FIG. 2 still receives 64 bits of CA information, same as the amount of CA information that the memory device 1204 in the first operation mode in FIG. 12 receives. The memory device 1204 has dedicated CA ports such that both ports CA1 and CA2 are connected to memory device 1204 and not to other memory devices. In this sense, in addition to the DQ ports DQ1 and DQ2, the CA ports CA1 and CA2 also have point-to-point connections, providing a simple topology that is symmetrical to the topology of the DQ ports. As a result, each memory device may be independently accessed via the dedicated CA port. Since the topologies of the CA links are substantially the same as the topologies of the DQ links, the CA links can be operated at a signaling rate that is in the same order of magnitude as the signaling rate of the DQ links. In one example, the CA rate may be half the DQ rate, while other examples support equivalent CA and DQ rates.

As explained above, the controller logic 1222 includes multiplexing/steering logic (not shown) to enable the generation and/or transmission of the CA signals according to the width and signaling rate of the CA links. The resulting CA data is then transmitted over the CA links CA1, CA2 to the memory device 1204.

The CA signals transmitted over the ports CA1 and CA2 are received by the interface circuit 1212 of the memory device 1204 via input (CA) pins 1232, 1235. The interface circuit 1212 may include de-multiplexing/steering logic (not shown) for converting the CA data received on the CA ports to parallel CA data, with the serial/parallel conversion ratio adjustable depending upon the width and signaling rate of the CA port. In the second operation mode, the interface circuit 1212 decodes the received CA signals at the second signaling rate, and provides access (read or write) to the associated memory cells 1210. The memory device 1204 communicates with CA ports having widths of both CA1 and CA2, which are each 2 bits wide as an example. Thus, in the second operation mode, when the memory system 1250 operates with a second signaling rate (16 bits/$t_{RR}$) for each CA link, the maximum amount of CA data communicated to the memory device 1204 over the CA ports CA1 and CA2 is 64 bits in each $t_{RR}$ interval.

As is evident from FIGS. 12 and 13, the memory system 1200, 1250 can be operated in one of at least two operation modes. In the first operation mode, the memory module has a first number of memory devices (two, in the example of FIG. 12), and the CA signal width for each memory device in the first operation mode is 2 bits wide, which is half the CA signal width (4 bits wide) for each memory device in the second operation mode. In contrast, the CA signaling rate for each memory device in the first operation mode is twice the CA signaling rate for each memory device in the second operation mode. Having a lower CA signaling rate when the DQ signal width (or number of memory devices) increases is beneficial, because noise increases with the DQ signal width. A lower CA signaling rate makes the memory system less susceptible to the increased noise in the DQ signal resulting from the increased DQ signal width. The maximum amount of CA signal data that can be transmitted to each memory device remains the same in either operation mode. However, depending upon the number of memory modules and the configuration and number of memory devices in a memory module, the CA signal width is adjustable and the CA signaling rate is also adjustable. In either operation mode, the CA signaling rate can be at the same order of magnitude as the DQ signaling rate, since both the CA signals and the DQ signals employ point-to-point topology. Moreover, the CA signaling rate can be adjusted to be different from the DQ signaling rate.

Figure 14:
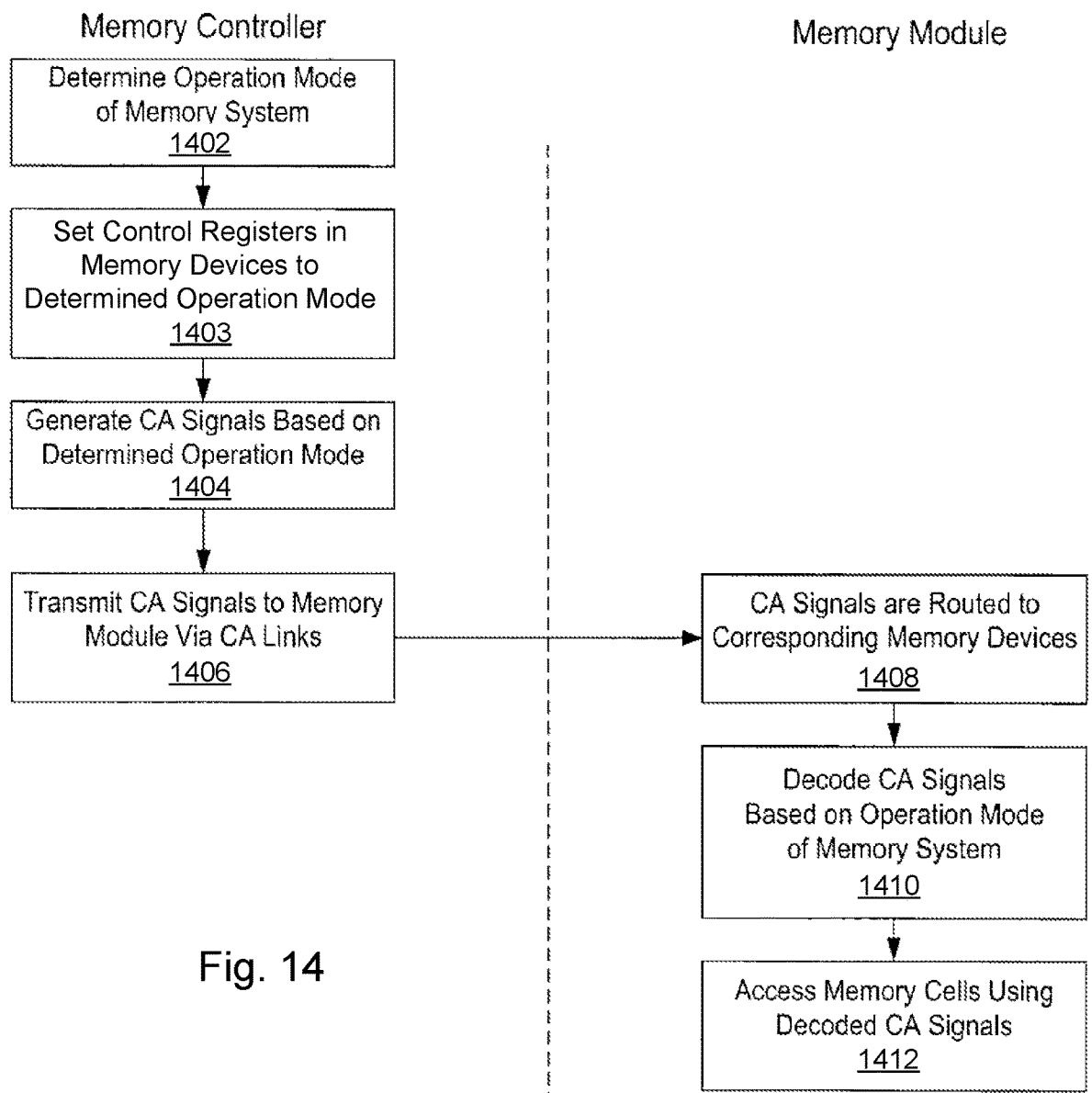
FIG. 14 is a flowchart illustrating a method of operating a memory system in a plurality of modes of operation, according to one embodiment of the present disclosure.

FIG. 14 is a flowchart illustrating a method of operating a memory system in a plurality of modes of operation, according to one embodiment of the present disclosure. In order to control the memory system, the memory controller first determines 1402 the operation mode of the memory system. The memory controller also sets 1403 the control registers in the memory devices according to the determined operation mode. Then, the memory controller generates 1404 the CA signals based on the determined operation mode. Thus, if the memory system is in the first operation mode with each memory device receiving a first width of CA signals, the memory controller generates 1404 the CA signals at the first signaling rate. On the other hand, if the memory system is in the second operation mode with each memory device receiving a second width of CA signals that is wider than the first width, the memory controller generates 1404 the CA signals at the second signaling rate lower than the first signaling rate. The memory controller transmits 1406 the generated CA signals to the memory module via the CA ports, and the CA signals are then routed 1408 on the memory module to the corresponding memory devices. The memory devices decode 1410 the CA signals based on the operation mode of the memory system, and the memory cells on the memory devices are accessed 1412 using the decoded CA signals.

Figure 15:
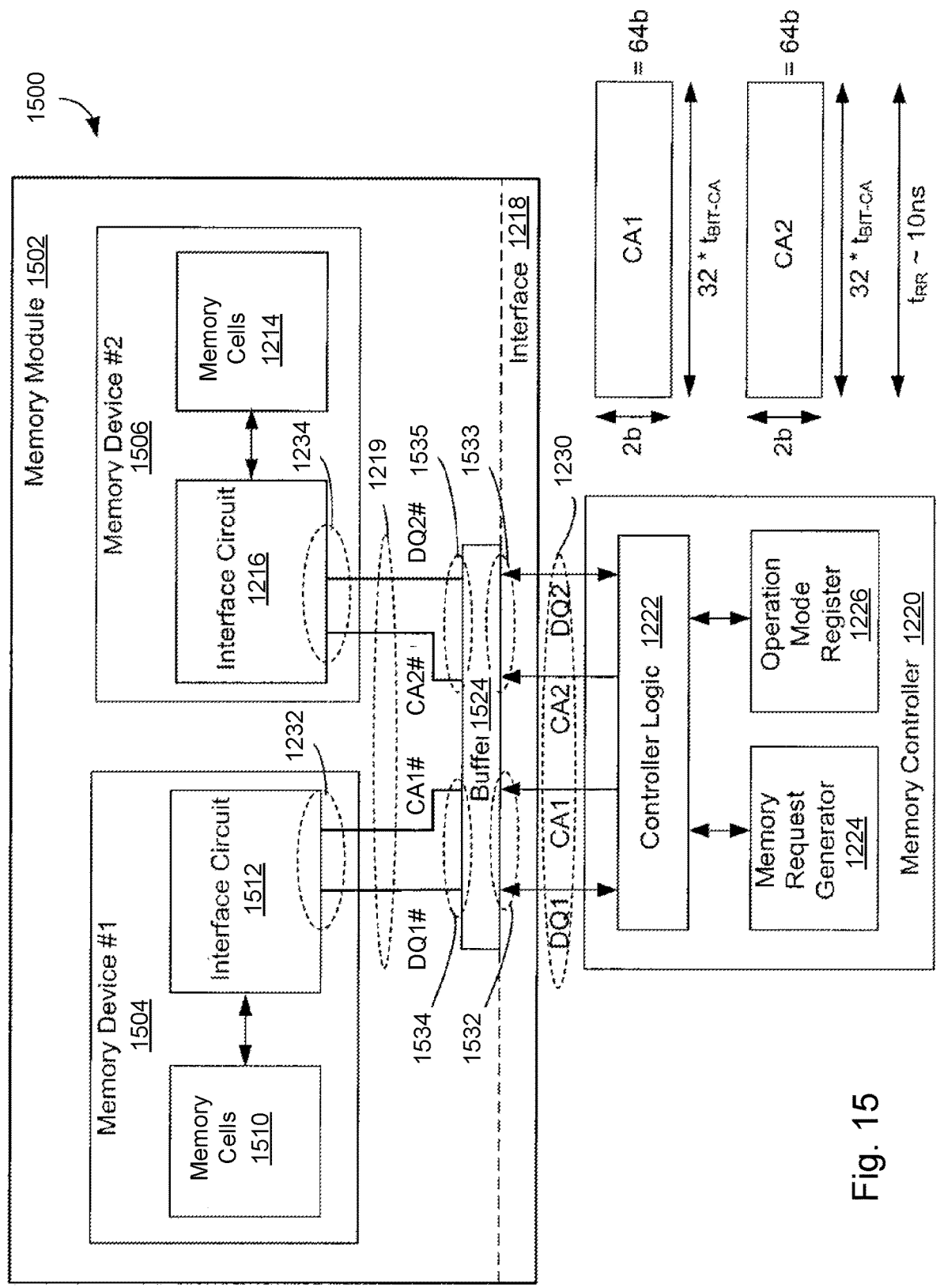
FIG. 15 is a block diagram illustrating a memory system 1500 in a first mode of operation, according to another embodiment of the present disclosure.

FIG. 15 is a block diagram illustrating a memory system 1500 in a first mode of operation, according to another embodiment of the present disclosure. The memory system 1500 of FIG. 15 is similar to the memory system 1200 of FIG. 12, except that the memory devices 1504, 1506 are standard memory components that are not designed for operation in different operation modes by themselves. Thus, in order to provide the memory system 1500 the features of multiple operation modes, the memory system 1500 of FIG. 15 further includes a micro-buffer 1524, which will be explained in more detail below.

As explained with reference to FIG. 12, the memory controller 1220 in FIG. 15 is also capable of operating in at least two operation modes, to generate the CA signals with different CA signaling rates. In generating the CA signals, the controller logic 1222 determines the operation mode of the memory system 1500 based on the operation mode flag stored in the operation mode register 1226. The example shown in FIG. 15 is the case where the memory system 1500 is in a first operation mode. When the memory system 1500 is in the first operation mode, the controller logic 1222 generates the CA signals (CA1 and CA2) with a first signaling rate (32 bits/$t_{RR}$ in this example). The CA1 or CA2 port may include multiple signal links capable of carrying multiple bits of information in parallel. In the example of FIG. 15, the CA1 or CA2 port may include multiple signal links capable of carrying two bits of information in parallel, or the CA1 or CA2 port is two bits wide. So, when the CA signaling rate is 32 bits/$t_{RR}$, the CA1 or CA2 port may carry a maximum of 64 CA bits during one $t_{RR}$ interval or during 32 $t_{BIT-CA}$ intervals, wherein $t_{BIT-CA}$ represents a bit interval in a CA signal. The controller logic 1222 also serves to transmit CA signals over the CA ports CA1 and CA2 and transmit and receive memory data signals DQ over the DQ ports DQ1 and DQ2. As explained above, the controller logic 1222 includes multiplexing/steering logic (not shown) to enable the generation and/or transmission of the CA signals according to the width and signaling rate of the CA ports.

The micro-buffer 1524 may comprise an application specific integrated circuit (ASIC) that includes input pins 1532, 1533 and output pins 1534, 1535. For example, a first set of the input pins 1532 may be connected to CA1, DQ1, and a second set of the input pins 1533 may be connected to CA2, DQ2. Also, for example, a first set of the output pins 1534 may be connected to CA1 #, DQ1 # and a second set of the output pins 1535 may be connected to CA2 #, DQ2 #. The micro-buffer 1524 is coupled to receive the CA signals and the DQ signals via the primary CA and primary DQ ports, CA1, CA2, DQ1, and DQ2, the connector 1218, and the input pins 1532, 1533. The micro-buffer 1524 includes circuitry that converts the received CA signals to have a CA width and CA signaling rate compatible with the interface circuit 1512, 1516 of the standard memory devices 1504, 1506. More specifically, the micro-buffer 1524 is able to convert the CA signals between two different types of signaling topologies on the primary interface (to the controller 1220) and the secondary interface (to the memory devices 1504, 1506). For example, the primary interface to the memory controller 1220 may be comprised of point-to-point high speed signals, and the secondary interface to the memory devices 1504, 1506 may be slower and wider than the primary interface, and may use non-point-to-point signals (e.g., multi-drop or fly-by topology). The converted CA signals are output via the output pins 1534, 1535 and routed to the corresponding memory devices 1504, 1506 via the secondary CA ports, CA1 #, CA2 #. Likewise, the buffer 1524 also converts the data signals received on the DQ ports DQ1, DQ2 to have a DQ width and DQ signaling rate compatible with the interface circuit 1512, 1516 of the standard memory devices 1504, 1506. The converted DQ signals are routed to the corresponding memory devices 1504, 1506 via the secondary DQ ports, DQ1 #, DQ2 #.

As shown in FIG. 15, the memory system 1500 in the first operation mode has one memory device 1504 connected to the secondary DQ port DQ1 # and the secondary CA port CA1# and another memory device 1506 connected to the secondary DQ port DQ2 # and the secondary CA port CA2

. Thus, the memory system 1500 has a point-to-point topology for both the DQ and CA links. However, the use of the micro-buffer 1524 allows the adjustable point-to-point CA links to be added to conventional memory devices 1504, 1506 without changing the structure of the standard memory devices 1504, 1506, by adding the micro-buffer 1524 and the controller 1220 capable of handling multiple operation modes with adjustable width and adjustable CA signaling rate.

Figure 16:
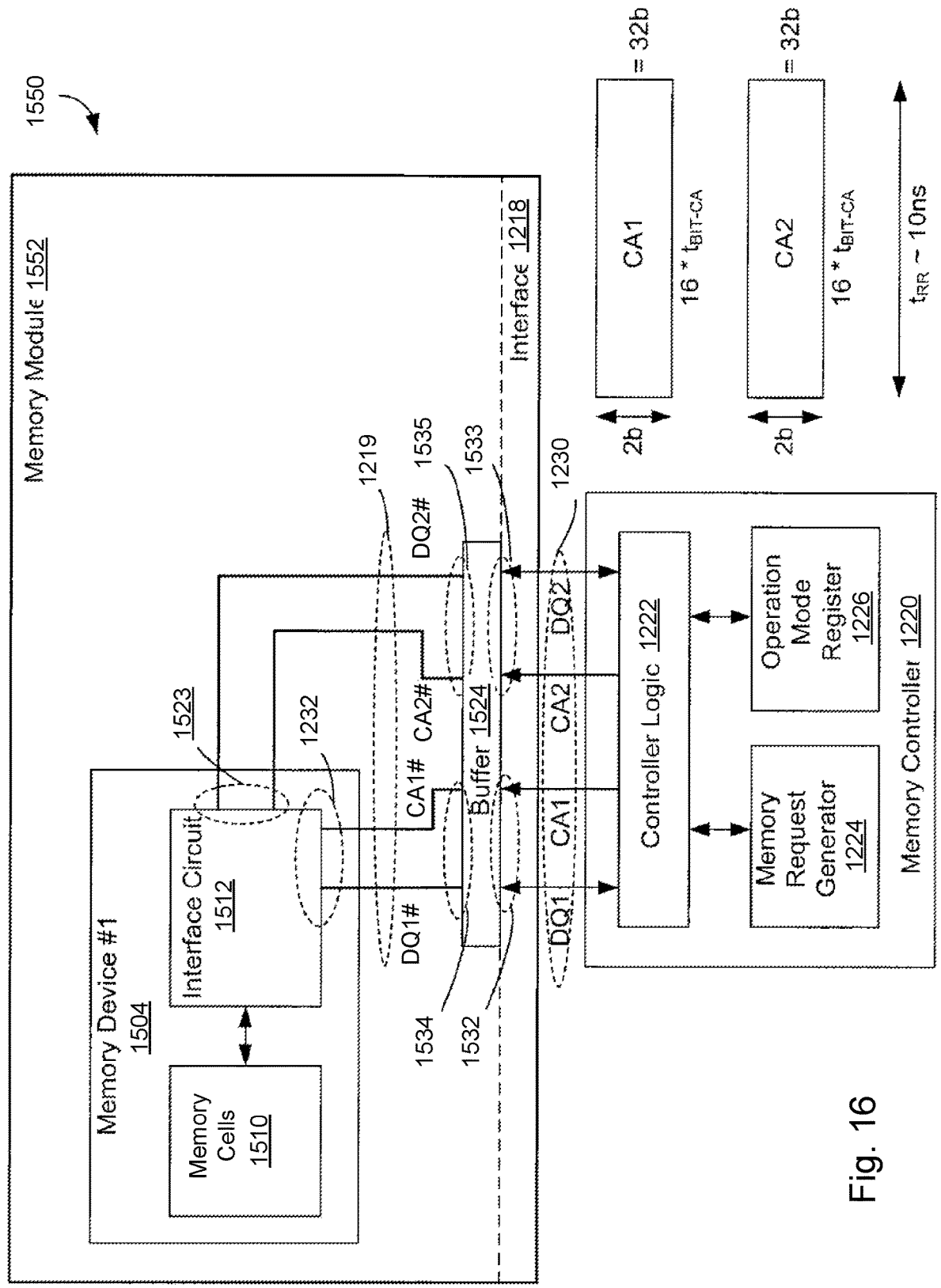
FIG. 16 is a block diagram illustrating a memory system in a second mode of operation.

FIG. 16 is a block diagram illustrating a memory system in a second mode of operation, according to another embodiment of the present disclosure. In memory system 1550, the memory devices 1504, 1506 are standard memory components that are not designed for operation in different operation modes by themselves. Thus, in order to provide the memory system 1550 of the features of multiple operation modes, the memory system 1550 of FIG. 16 further includes the micro-buffer 1524.

As explained with reference to FIG. 13, the memory controller 1220 in FIG. 16 is also capable of operating in at least two operation modes, to generate the CA signals with different CA signaling rates. In generating the CA signals, the controller logic 1222 determines the operation mode of the memory system 1550 based on the operation mode flag stored in the operation mode register 1226. The example shown in FIG. 16 is the case where the memory system 1550 is in a second operation mode. When the memory system 1550 is in the second operation mode, the controller logic 1222 generates the CA signals (CA1 and CA2) with a second signaling rate (16 bits/$t_{RR}$ in this example), which is lower than the first signaling rate (32 bits/$t_{RR}$) in FIG. 15. The CA1 or CA2 port may include multiple signal links capable of carrying multiple bits of information in parallel. In the example of FIG. 16, the CA1 or CA2 port may include two signal lines capable of carrying two bits of information in parallel, or the CA1 or CA2 port is two bits wide. So, when the CA signaling rate is 126 bits/$t_{RR}$, each of the CA1 or CA2 ports may carry a maximum of 32 CA bits during one $t_{RR}$ interval or during 126 $t_{BIT-CA}$ intervals, wherein $t_{BIT-CA}$ represents a bit interval in a CA signal. The controller logic 1222 also serves to transmit the CA signals over the ports CA1 and CA2 and transmit and receive memory data signals DQ over the ports DQ1 and DQ2.

The micro-buffer 1524 is coupled to receive the CA signals and the DQ signals via the primary CA and primary DQ ports, CA1, CA2, DQ1, and DQ2, and the connector 1218. The micro-buffer 1524 then converts the received CA signals to have a CA width and CA signaling rate compatible with the interface circuit 1512 of the standard memory device 1504. More specifically, the micro-buffer 1524 is able to convert the CA signals between two different types of signaling topologies on the primary interface (to the controller 1220) and the secondary interface (to the memory device 1504). For example, the primary interface to the memory controller 1220 may be comprised of point-to-point high speed signals, and the secondary interface to the memory device 1504 may be slower and wider, and may use non-point-to-point signals (e.g., multi-drop or fly-by topology). The converted CA signals are routed to the corresponding memory device 1504 via the secondary CA ports, CA1 #, CA2 #. Likewise, the buffer 1524 also converts the data signals received on the DQ ports DQ1, DQ2 to have a DQ width and DQ signaling rate compatible with the interface circuit 1512 of the standard memory device 1504. The converted DQ signals are routed to the corresponding memory device 1504 via the secondary DQ ports, DQ1 #, DQ2 #.

As shown in FIG. 16, the memory system 1550 in the second operation mode has one memory device 1504 connected to both secondary DQ ports, DQ1 # and DQ2 # and both secondary CA ports, CA1# and CA2 #. The memory system 1550 has a point-to-point topology for both the DQ and CA links. However, the use of the micro-buffer 1524 allows the adjustable point-to-point CA links to be added to standard memory devices without changing the structure of the standard memory device 1504, by adding the micro-buffer 1524 and the controller 1220 capable of handling multiple operation modes with adjustable width and adjustable CA signaling rate.

Figure 17:
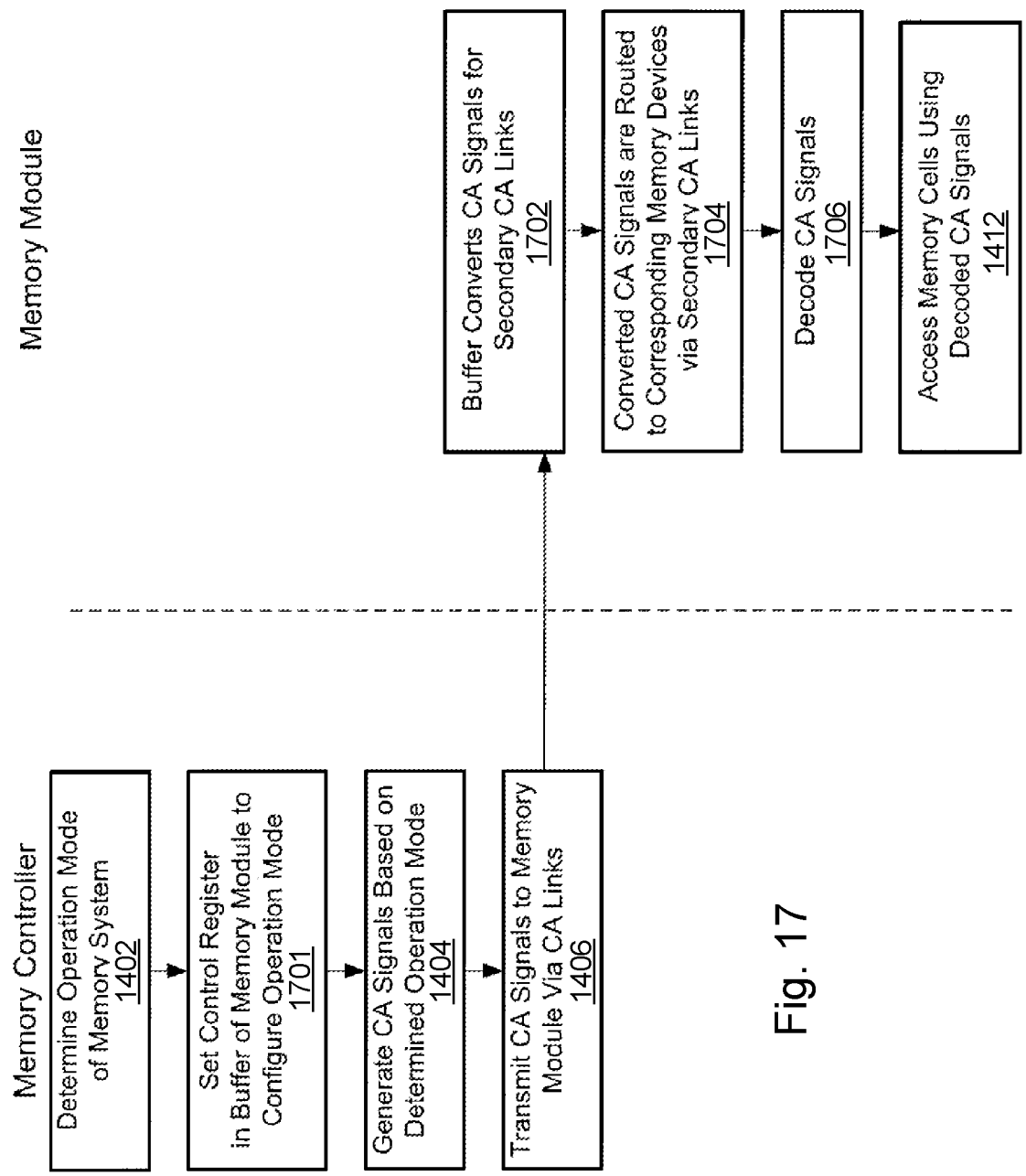
FIG. 17 is a flowchart illustrating a method of operating a memory system in a plurality of operation modes.

Referring to both FIGS. 16 and 17, in one embodiment the micro-buffer 1524 may receive the CA signals on the primary CA ports CA1, CA2 at different widths and signaling rates depending upon the operation mode, but leave the width and signaling rate of the CA signals on the secondary CA ports CA1 #, CA2 # the same regardless of the operation mode, but slower and wider than the primary interface. However, in another embodiment, the micro-buffer 1524 may also change the width and signaling rate of the CA signals on the secondary CA ports CA1 #, CA2 # depending upon the operation mode (e.g., a third signaling rate in the first mode, and a fourth signaling rate lower than the third signaling rate in the second mode).

FIG. 17 is a flowchart illustrating a method of operating a memory system in a plurality of operation modes, according to another embodiment of the present disclosure. The method of FIG. 17 is substantially similar to the method illustrated in FIG. 14, except that step 1701 is added and that steps 1702, 1704, and 1706 are added in place of steps 1408, 1410.

Referring to FIG. 17, in order to control the memory system, the memory controller first determines 1402 the operation mode of the memory system. Then, the memory controller sets 1701 the control register in the micro-buffer of the memory module to configure the memory module with the determined operation mode, and generates 1404 the CA signals based on the determined operation mode. Thus, if the memory system is in the first operation mode with each memory device receiving a first width of CA signals, the memory controller generates 1404 the CA signals at the first signaling rate. On the other hand, if the memory system is in the second operation mode with each memory device receiving a second width of CA signals that is wider than the first width of CA signals, the memory controller generates 1404 the CA signals at the second signaling rate lower than the first signaling rate. The memory controller transmits 1406 the generated CA signals to the memory module via the CA links.

The micro-buffer receives the CA signals via the CA ports and converts 1702 the CA signals to be in a format suitable for the logic interfaces of the memory components coupled to the secondary CA ports. The converted CA signals are then routed 1704 on the memory module to the corresponding memory devices via the secondary CA ports. The memory devices decode 1706 the CA signals, and the memory cells on the memory devices are accessed 1412 using the decoded CA signals.

Figure 18:
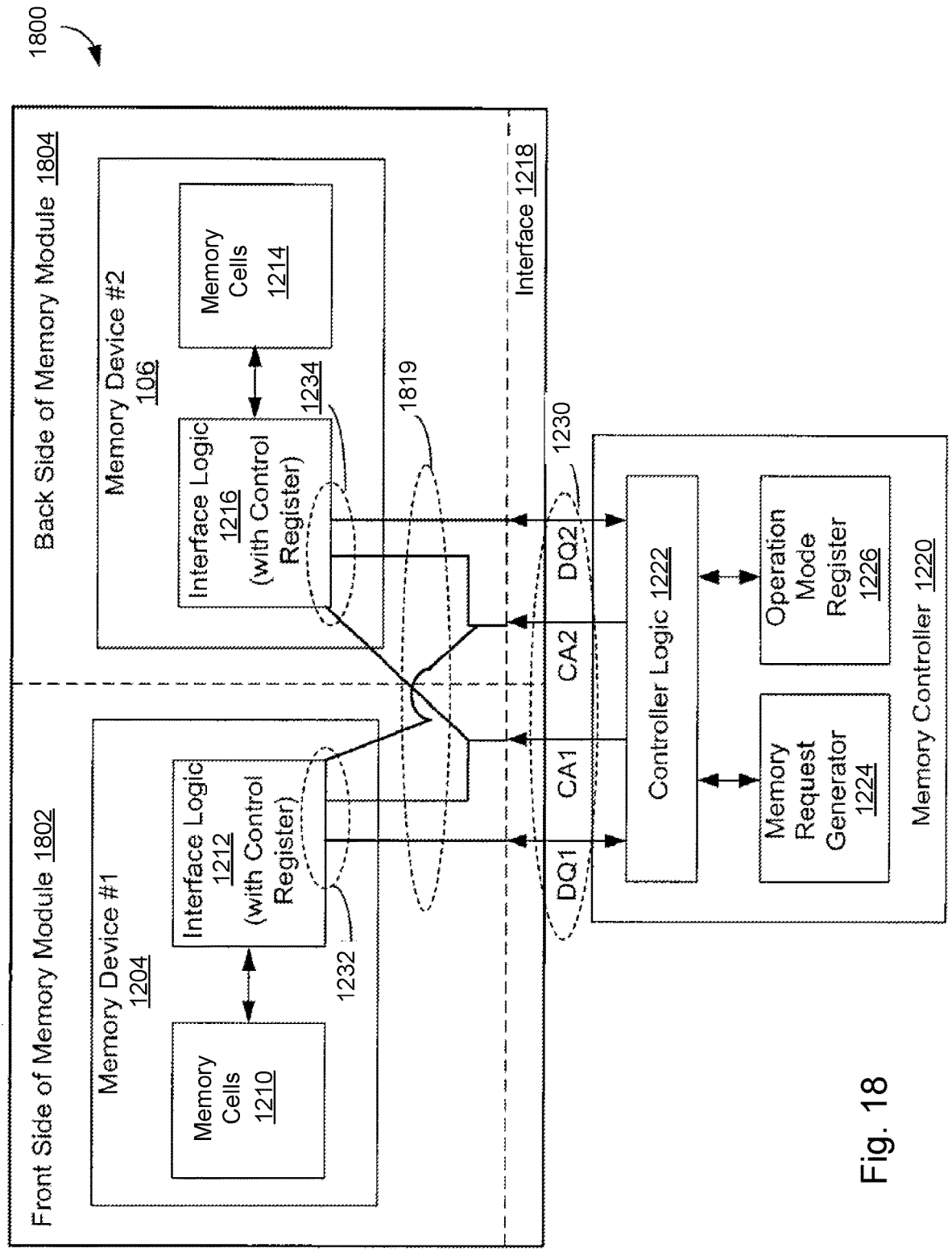
FIG. 18 is a block diagram illustrating a memory system with a "point-to-2-point" CA link topology.

FIG. 18 is a block diagram illustrating a memory system with a "point-to-2-point" CA link topology, according to still another embodiment of the present disclosure. The memory system 1800 of FIG. 18 is substantially the same as the memory system 1200 of FIG. 12, except for the configuration of the CA and DQ ports 1819 and that the memory devices 1204 and 1206 reside on the front and back sides 1802 and 1804 of the memory module, respectively, as mirrored memory devices. Each of the CA ports CA1 and CA2 are connected from the memory controller 1220 to the interface circuits 1212 and 1216 of both memory devices 1204 add 1206, while the DQ ports DQ1 and DQ2 are connected separately with DQ1 being connected to the memory device 1204, and DQ2 being connected to the memory device 1206. Therefore, the DQ ports DQ1 and DQ2 are connected "point-to-point" to the memory devices 1204 and 1206, while the CA ports CA1 and CA2 are connected "point-to-2-point" to the memory devices 1204 and 1206. Such topology enables the reduction in the number of CA links to half, as compared to point-to-point CA links, while permitting the CA signaling rate to be comparable to the CA signaling rate used with point-to-point CA links. The DQ signals employ point-to-point topology in order to maintain high signaling margin and also to minimize the data access granularity. Memory devices 1210 and 1214 receive the same request information on ports CA1 and CA2 and, in response to requests, transmit and receive different data on their respective data ports DQ1 and DQ2.

Exemplary Memory Systems

The following discussion describes memory systems that employ an integrated-circuit (IC) controller device that supports micro-threaded requests over high-speed request interfaces for single- and multi-memory-device topologies. The memory controller and associated memory device support point-to-point request and data interfaces, and the memory access granularity is the same irrespective of the number of memory devices.

Figure 19:
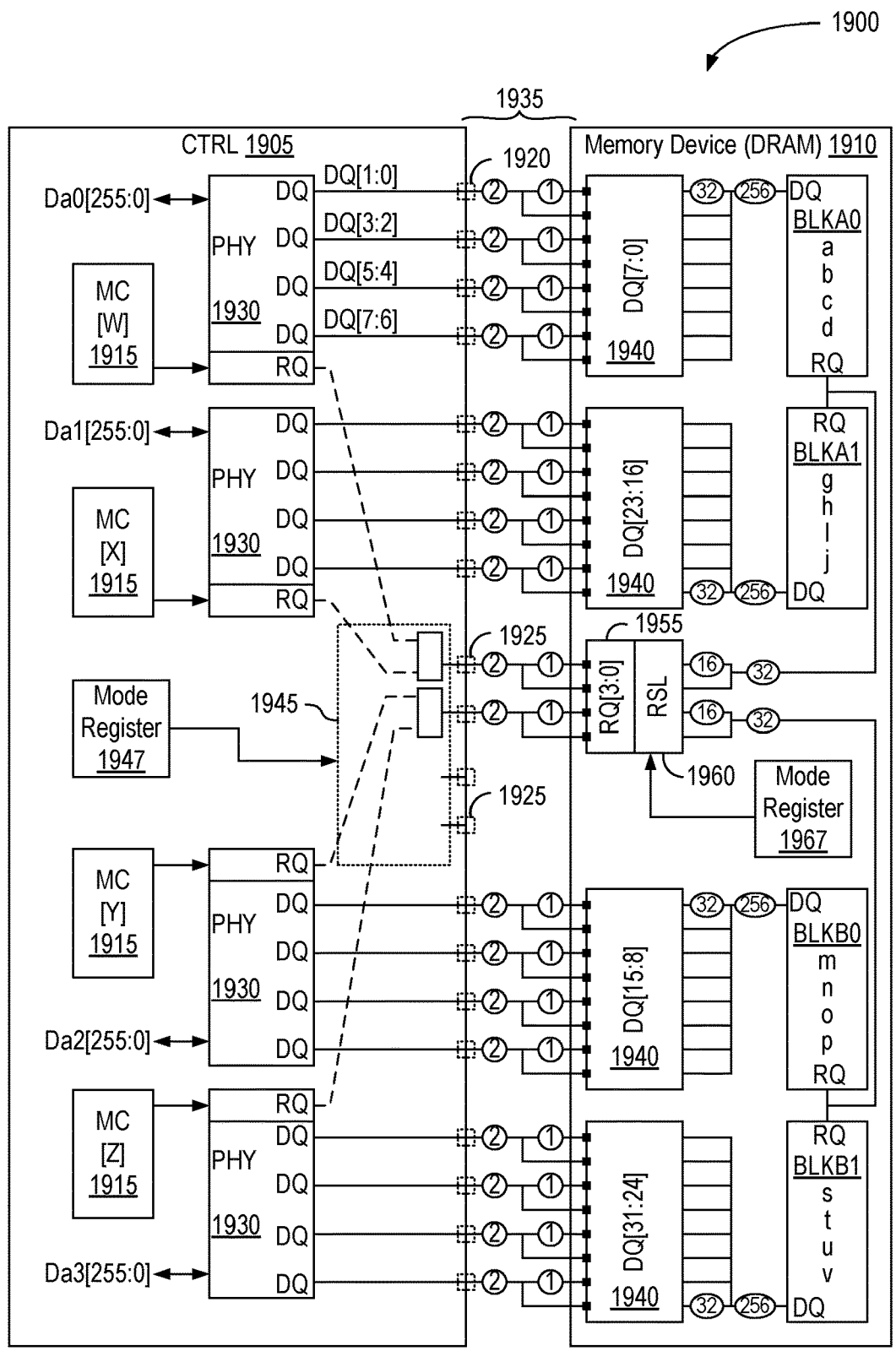
FIG. 19 depicts a memory system 1900 that includes an IC memory controller 1905 connected to a single IC memory device (e.g. a DRAM die) 1910 in accordance with one embodiment.

FIG. 19 depicts a memory system 1900 that includes an IC memory controller 1905 connected to a single IC memory device (e.g. a DRAM die) 1910 in accordance with one embodiment. Controller 1905 includes four memory-controller blocks 1915, labeled W, X, Y, and Z, each of which assembles and issues complete transaction requests provided by e.g. an integrated or external processor (not shown). Memory-controller blocks 1915 communicate data signals DQ and request signals RQ to external data and request ports 1920 and 1925 via respective signal interfaces 1930, each of which includes a plurality of data interfaces and a single request interface in the depicted embodiment. The term "external" refers to the physical manifestation of a port that is accessible to off-chip signal lines. In a typical example, a memory controller IC is mounted on a printed-circuit board (PCB) along with one or more memory device ICs. The PCB additionally supports conductive traces that connect to the external ports on the controller and memory-device ICs to facilitate communication between them.

The memory interconnect 1935 that extends between controller 1905 and memory device 1910 shows that each depicted DQ port from controller 1905, though shown as four DQ lines, is conveyed over four pairs of links to arrive at a data interface 1940 as eight differential data signals. (The circled number associated with a given signal path identifies the number of links in the path). Memory device 1910 thus supports thirty-two differential data ports 1920 DQ[31:0] grouped into four eight-link data ports. Steering logic 1945 allows memory-controller blocks 1915 to direct their respective complete transaction requests to various combinations of eight differential request ports, pairs of which are shown as blocks 1925. Steering logic 1945 is shown separate from memory-controller blocks 1915 for ease of illustration—and can be implemented this way—but may also be implemented elsewhere, for example within or between blocks 1915 and interfaces 1930. The connectivity for steering logic 1945, and later-described data-path connectivity, is defined using a mode register 1947 that stores a value indicative of the number of connected memory devices. The connectivity provided by steering logic 1945 in this example is explained below.

Memory 1910 includes four blocks of memory cells BLKA0, BLKA1, BLKB0, and BLKB1, which may be referred to as "quads" in this embodiment because they represent four discrete and independently accessible memory arrays. (Groups of two blocks can also be referred to as blocks, but are referred to as "bank halves" for ease of illustration.) Each block in turn includes four banks (e.g., block BLKA0 includes banks a, b, c, and d). Memory 1910 additionally includes a request interface 1955 and some request steering logic (RSL) 1960. Request interface 1955 receives request signals from steering logic 1945 via channel 1935, and steering logic 1960 directs such requests to appropriate blocks BLKA0, BLKA1, BLKB0, and BLKB1.

As explained below, the configurations of steering logic 1945 on memory controller 1905 and steering logic 1960 on memory device 1910 depend upon the number of memory devices coupled to memory controller 1905. System 1900 is a single-device embodiment in which memory device 1910 can respond to requests from memory controller 1905 by reading or writing up to thirty-two parallel data packets, each including 32 bits, for a total of 1,024 bits of data. Each memory-controller block 1915 generates its own request threads, which steering logic 1945 and 1960 forward to appropriate ones of the memory blocks. More specifically, each memory controller 1915 communicates requests information to it respective PHY 1930. The request information is then provided from the respective PHY to one or more of the memory blocks via steering logic 1945, channel 1935, request interface 1955, and steering logic 1960. A second set of request ports 1925, the lowermost two in this depiction, is provided but unused in this single-module example. Steering logic 1960 routes requests as appropriate for a given memory configuration, as indicated by a memory-side mode register 1967 in this example. Mode information for this and the controller can be stored differently, using e.g. fuses, anti-fuses, jumpers, etc.

In this embodiment, request threads from controller blocks [W] 1915 and [X] 1915 are conveyed to memory blocks BLKA0 and BLKA1, respectively, via steering logic 1945, channel 1935, and steering logic 1960. The portion of channel 1935 used for these request threads includes two differential links. Steering logic 1945 and 1960 can be set to dedicate one link to each controller block, or the links can be shared differently, as via time multiplexing. The contents of mode registers 1947 and 1967 define the appropriate routing and connectivity to convey the threads to their destination memory blocks. The importance of this selective connectivity will become evident in light of the embodiment of FIG. 21.

Figure 20:
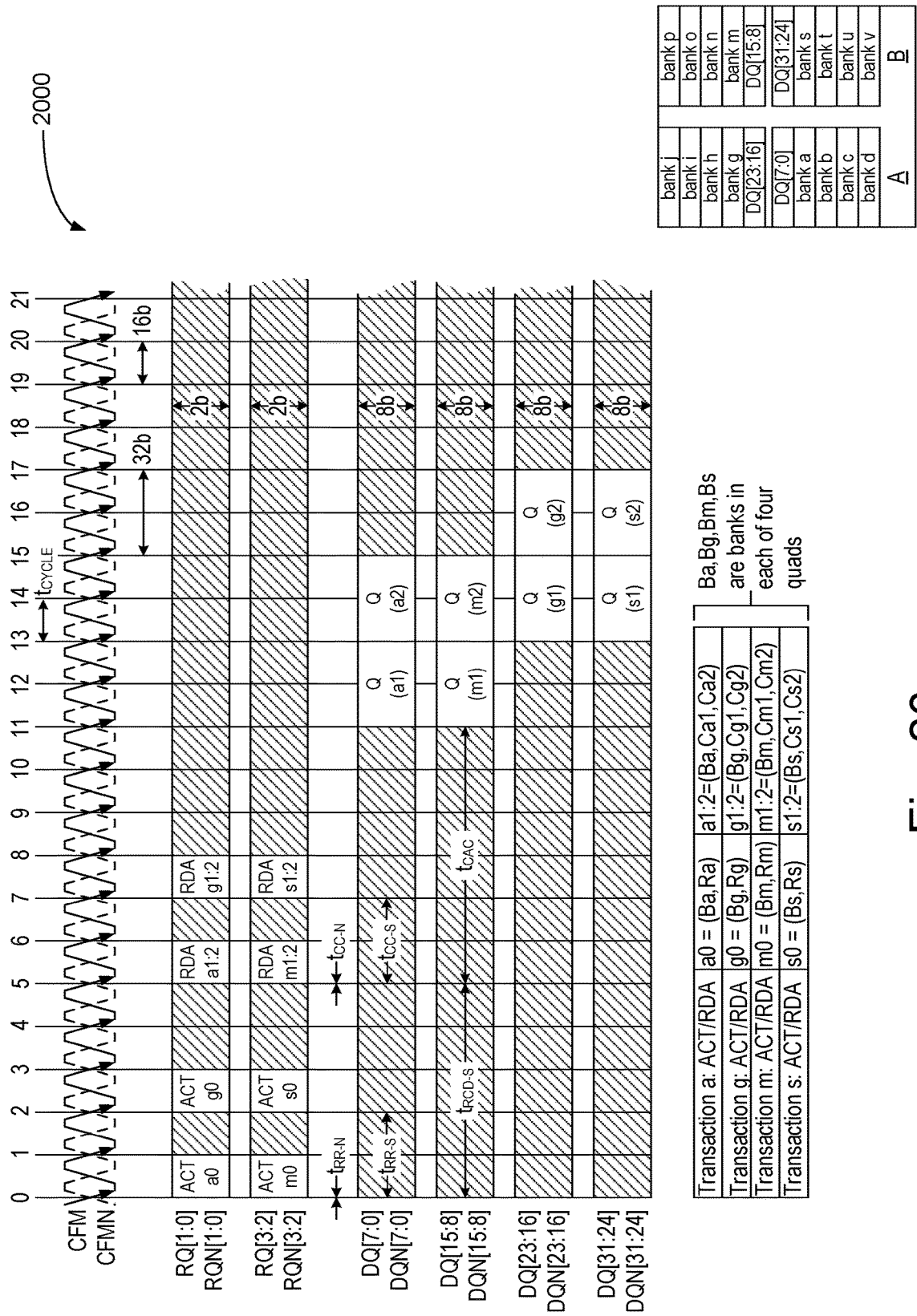
FIG. 20 shows a timing diagram 2000 in which four read transactions are directed to banks located in each of the four quads BLKA0, BLKA1, BLKB0, and BLKB1 in memory 1910 of FIG. 19.

FIG. 20 shows a timing diagram 2000 in which four read transactions are directed to banks located in each of the four quads BLKA0, BLKA1, BLKB0, and BLKB1 in memory 1910 of FIG. 19. Memory device 1910 has 32 DQ links enabled (e.g. DQ[31:0]/DQN[31:0] in a differential signaling system, where the "N" indicates a complementary signal), and two RQ link-pairs enabled (RQ[1:0]/RQN[1:0] and RQ[3:2]/RQN[3:2]). The RQ links can be enabled within interface 1955 or steering logic 1960. The CFM (and CFMN) legend shows the clock signal, or clock-from-master (and its negation for a differential clock). Across the top, the cycles (each having a length of $t_{CYCLE}$) are labeled from 0 to 21.

At time T0, a read transaction is directed to bank "a" of block BLKA0 is via the RQ[1:0]/RQN[1:0] links, which serve as two request ports, and later the read data Q (a1,a2) is transmitted on the DQ[7:0]/DQN[7:0] links of channel 1935 that extend between opposing data interfaces 1930 and 1940. Simultaneously, because the time $t_{RR-N}$ required to present successive row commands over a different link is zero, a transaction can be directed to bank "m" via the RQ[3:2]/RQN[3:2] links, and later the read data Q(m1,m2) transmitted on the DQ[15:8]/DQN[15:8] links. After a delay $t_{RR-S}$, the time required to present successive row commands over the same request link, a transaction is directed to bank "g" via the RQ[1:0]/RQN[1:0] links, and the read data Q(g1,g2) is transmitted on the DQ[23:16]/DQN[23:16] links. Simultaneously, a transaction can be directed to bank "s" via the RQ[3:2]/RQN[3:2]links, and the read data Q(s1, s2) is transmitted on the DQ[31:24]/DQN[31:24] links.

Each read transaction includes a ROW packet with an ACT command, a bank address, a row address, and a sub-row address. The sub-row address is not used in this x32 case. Each read transaction also includes a COL packet with a RDA command, a bank address, two column addresses, and two sub-column addresses. The sub-column addresses are not used in this x32 case. The COL packet follows the ROW packet by the row-to-column read delay $t_{RCD-R}$. The read data from the first column access follows the COL packet by the column access time ($t_{CAC}$). The read data from the second column access follows one column cycle interval ($t_{CC}$) later. Each column access produces 256 bits of data. This is serialized as 32 bits of data on each of the 8 DQ links associated with a given data interface 1940. Thus, in this example the column granularity is 32 bytes (32 B), the row granularity is 64 bytes (64 B), and each of two Q packets (e.g., Q(a1) and Q(a2)) is 32 bytes.

Memory controller 1905 maintains a queue of read and write transactions. Each transaction performs two column accesses on 32 B each in this example system. Operating independently, each memory-controller block 1915 and its associated interface 1930 directs requests to one of the four quads in memory 1910. The eight DQ links of data interface 1930 connect directly to the corresponding DQ links on memory 1910. The RQ information from each MC+PHY is multiplexed with one other MC+PHY in this embodiment, though other embodiments differ. Interleaved write transactions would steer the data in a manner similar to that shown in FIG. 19, except that the write data moves from controller 1905 to memory 1910.

Figure 21:
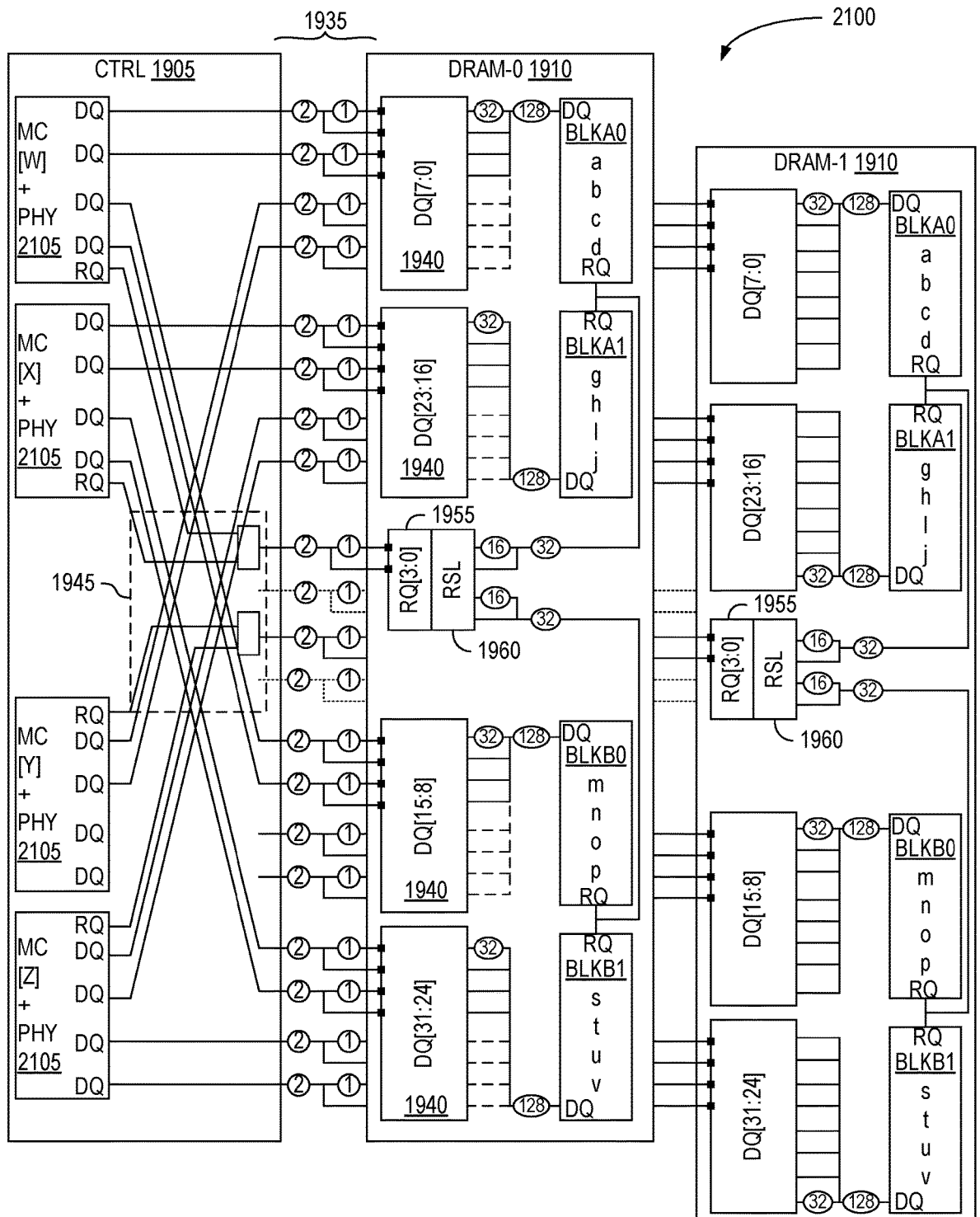
FIG. 21 depicts a dual-device memory system 2100 in which controller 1905 of FIG. 19 is configured to communicate with two memory devices 1905, for twice the memory capacity of system 1900, while maintaining the same number of banks and the same access granularity.

FIG. 21 depicts a dual-device memory system 2100 in which controller 1905 of FIG. 19 is configured to communicate with two memory devices 1905, for twice the memory capacity of system 1900, while maintaining the same number of banks and the same access granularity. For ease of illustration, the memory-controller blocks and interfaces of controller 1905 are combined into slices 2105. Unused request ports are coupled to dashed lines, which represent optional traces that can be provided on e.g. a board supporting controller 1905 and memory devices 1910 to support different numbers of modules and different types of request connectivity.

Controller 1905 includes the same number of data ports as in the single-module embodiment of FIG. 19, and each data port is of the same eight-link width. The data links from each controller slice 2105 are divided between the two devices 1910 in this embodiment, however. Moreover, while two RQ ports are still used, one per module, they are different from the two used in FIG. 19. Each memory device 1910 is configured so that each memory block (e.g. BLKA0) has half the data width and twice number of address locations as compared with the single-device embodiment of FIG. 19.

Figure 22:
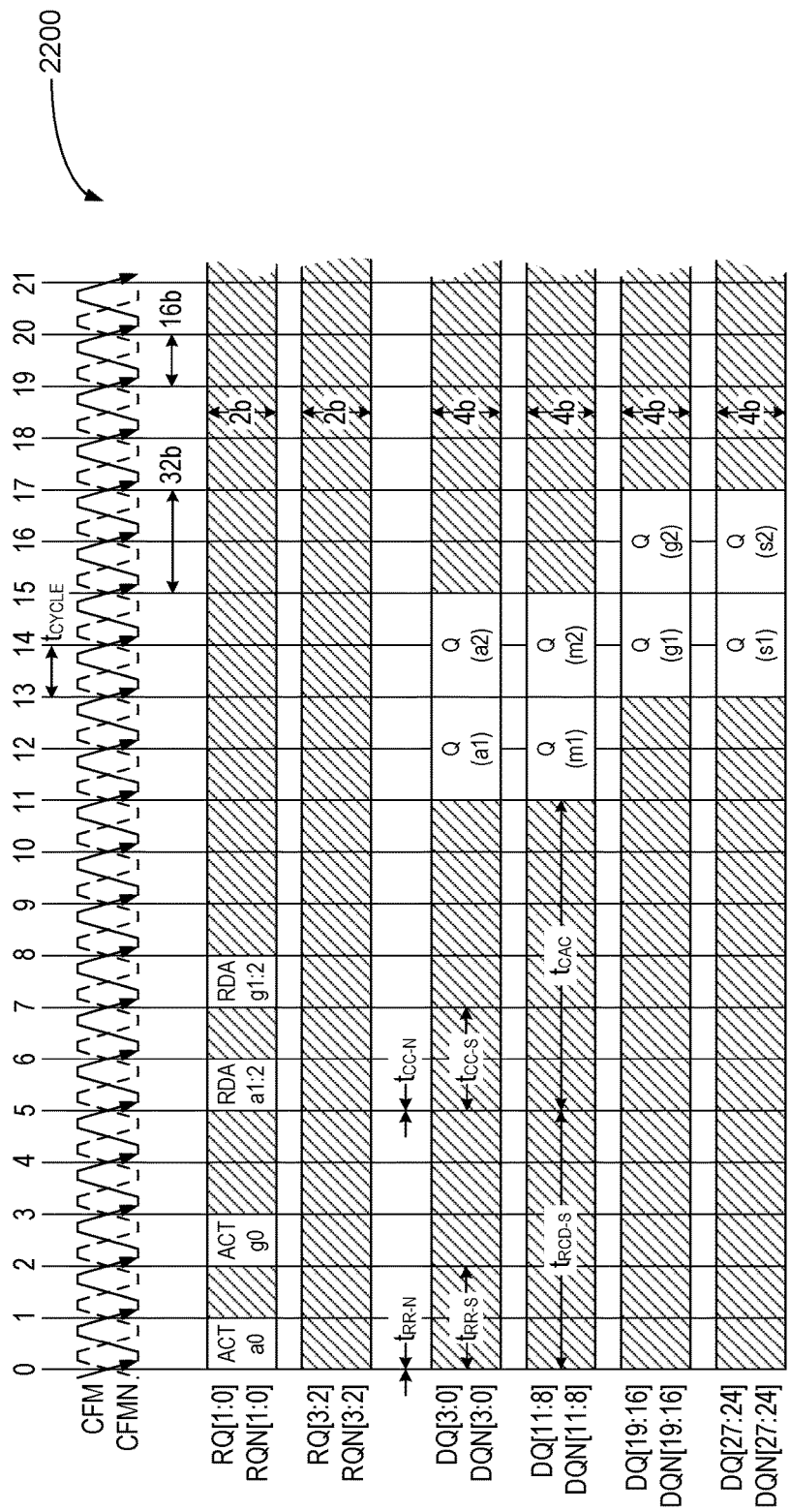
FIG. 22 shows a timing diagram 2200 in which four read transactions are directed to banks located in each of the four quads BLKA0, BLKA1, BLKB0, and BLKB1 of each of the two memory devices (e.g. DRAMS) 1910 of system 2100 of FIG. 21.
Figure 22:
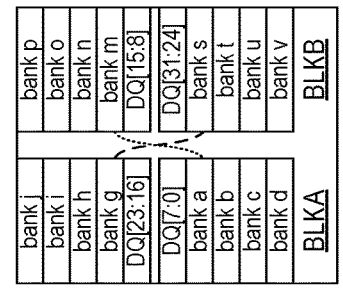

FIG. 22 shows a timing diagram 2200 for memory system 2100 of FIG. 21 in which two read transactions are directed to banks located in each of the four read transactions are directed to banks located in pairs of quads (e.g., blocks BLKA0 and BLKB0) in each of memory devices 1910 respectively labeled DRAM-0 and DRAM-1. Each memory device has 16 DQ links enabled (e.g. DQ[3:0]/DQN[3:0], DQ[11:8]/DQN[11:8], DQ[19:16]/DQN[19:16], and DQ[27:24]/DQN[27:24]) and one RQ link-pair enabled (RQ [1:0]/RQN[1:0]). The differences is this dual-device configuration as compared with the single-device configuration of FIG. 19 include:

sixteen DQ links (vs thirty-two);
one RQ link-pair (vs two)
two memory devices connected to controller 1905 via channel 1935 (vs one memory device 1910);
parallel operation of banks in diagonal quads, e.g., banks "a" and "m" of memory blocks BLKA0 and BLKB0 (vs individual operation of banks);
sub-row address SR[1] used to select sub-rows within the memory banks; and
sub-column addresses SCx[3], SCy[3] used to select sub-columns within the memory banks.

A read request to bank "a" is received on the RQ[1:0]/RQN[1:0] links, and the read data is transmitted on the DQ[3:0]/DQN[3:0] links. Simultaneously, the same read request is directed to bank "m"; in other words, banks "a" and "m" are linked for parallel operation, and they receive the same address fields from the request packets. The read data from "m" is transmitted on the DQ[11:8]/DQN[11:8] links.

After a delay ($t_{RR-S}$), the request to bank "g" is received on the RQ[1:0]/RQN[1:0] links, and the read data is transmitted on the DQ[19:16]/DQN[19:16] links. Simultaneously the same request is directed to bank "s"; in other words, banks "g" and "s" are linked for parallel operation, and they receive the same address fields from the request packets. The read data from "s" is transmitted on the DQ[27:24]/DQN [27:24] links.

Each read transaction includes a ROW packet with an ACT command, a bank address, a row address, and a sub-row address. The sub-row address SR[1] is used in this x16 embodiment. The term "x16," or "by sixteen," refers to the combined effective width of interfaces 1940 on each memory device 1910. The combined width of the two memory devices is therefore thirty-two, just as in the embodiment of FIG. 19. Each read transaction also includes a COL packet with a RDA command, a bank address, two column addresses, and two sub-column addresses. The sub-column addresses SCx[3], SCy[3] are used in this x16 case. The COL packet follows the ROW packet by the read row-to-column delay $t_{RCD-R}$. The read data from the first column access follows the COL packet by $t_{CAC}$. The read data from the second column access follows $t_{CC}$ later.

Each column access produces 128 bits of data. This is serialized as 32 bits of data on each of the four DQ links. Two parallel column accesses produce 32 bits of data on each of eight DQ links. The column granularity is 32 bytes (32 B), and the row granularity is 64 bytes (64 B), the same as the system in FIG. 19.

Referring again to FIG. 21, steering logic 1945 and 1960 are configured such that only the RQ[1:0]/RQN[1:0] and RQ[5:4]/RQN[5:4] link pairs are used. Each independent memory slice 2105 of controller 1905 directs requests to two of the four quads in each of memory devices DRAM-0 and DRAM-1. The DQ output ports from each slice 2105 are split between two data interfaces 1940. For example, four DQ links from slice [W] are coupled to block BLKA0 via the data interface 1940 that supports DQ links DQ[7:0], while the remaining four DQ links are coupled to block BLKB0 via the data interface 1940 that supports DQ links DQ[15:8]. The different routing of data signals in this embodiment versus that of FIG. 19 uses data steering logic within the PHY interfaces that selectively directs data from each memory-controller block to one subset of external data ports 1920 in a first operational mode or a second subset of the external data ports in a second operational mode. In particular, the first memory controller block 1915 marked "W" is coupled to a by-eight external data port associated with data DQ[7:0] in the single-device embodiment of FIG. 19 and to the external data ports associated with data DQ[11:8,3:0] in the dual-device embodiment of FIG. 21.

The RQ information from each slice 2105 is multiplexed with the RQ information from one other slice 2105 because the RQ link-pairs are shared among two RQ ports in this example. In FIG. 21 this multiplexing function is depicted as steering logic 1945, but the steering logic can be implemented differently. Furthermore, steering logic 1945 is shown to support the multiplexing of DQ links among the different banks and devices. This data steering can be implemented elsewhere, for example within that data interface circuitry introduced above in connection with FIG. 19. Interleaved write transactions would steer the data in a manner similar to that shown in FIG. 21, except that the write data moves from controller 1905 to memory devices 1910, rather than vice versa as in the read case.

Figure 23:
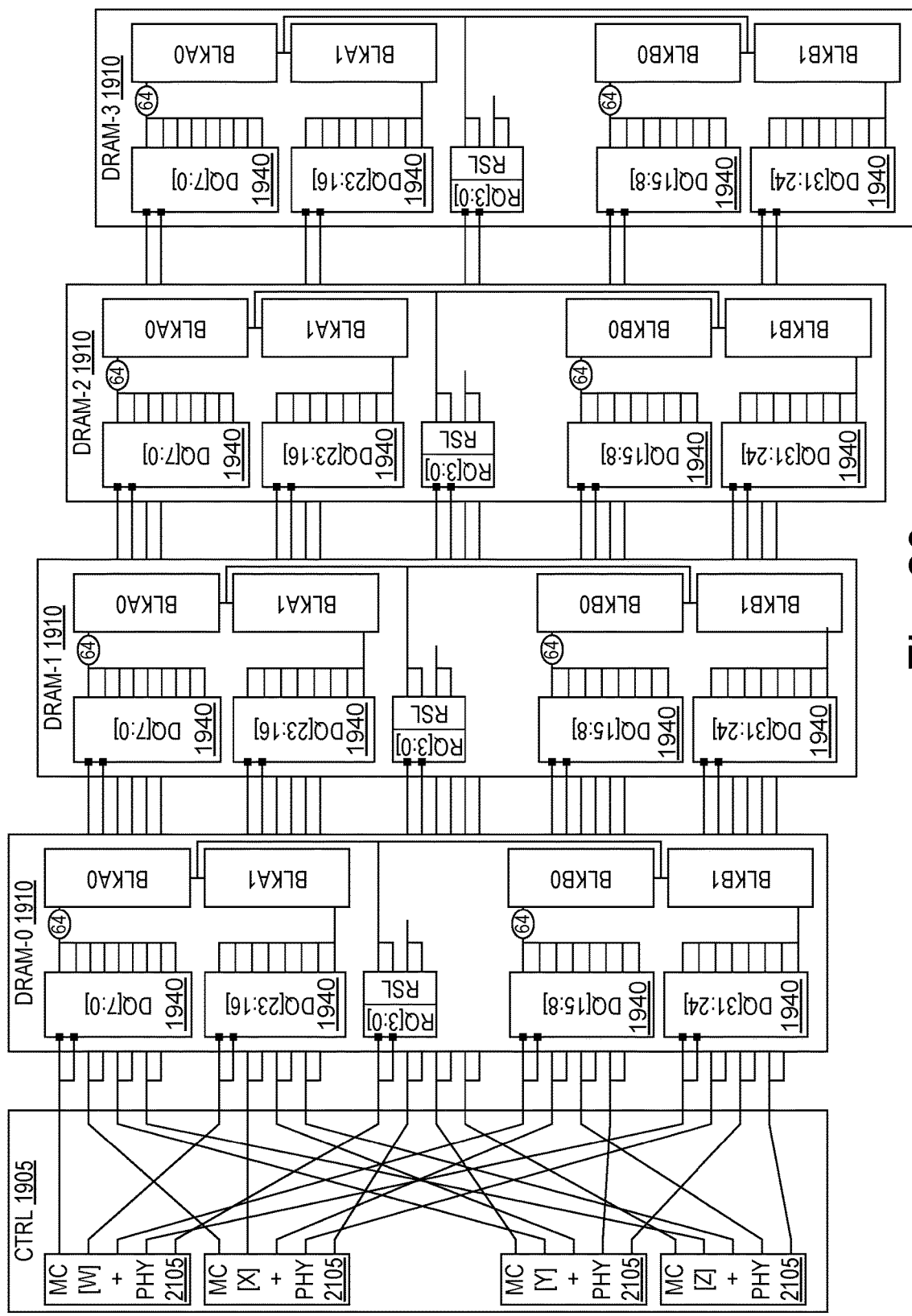
FIG. 23 depicts a four-device memory system 2300 in which controller 1905 of FIG. 19 is configured to communicate with four memory devices 1905, for four times the memory capacity of system 1900, while maintaining the same number of logical memory banks and the same access granularity for slices 2105, and controller 1905 generally.

FIG. 23 depicts a four-device memory system 2300 in which controller 1905 of FIG. 19 is configured to communicate with four memory devices 1905, for four times the memory capacity of system 1900, while maintaining the same number of logical memory banks and the same access granularity for slices 2105, and controller 1905 generally. The fact that each DQ and RQ link is established via a point-to-point connection irrespective of the number of memory devices facilitates speed performance, and the constancy of access granularity simplifies the design of slices 2105.

Each memory device 1910 (DRAM-0, DRAM-1, DRAM-2, and DRAM-3) has eight DQ links enabled, two for each of the four data interfaces 1940. In this example, those links are DQ[1:0]/DQN[1:0], DQ[9:8]/DQN[9:8], DQ[17:16]/DQN[17:16], and DQ[25:24]/DQN[25:24]. Each memory device has two enabled request links, or one enabled link-pair (e.g. RQ[1:0]/RQN[1:0]).

The differences in this four-device configuration as compared with the single-device configuration of FIG. 19 include:
- eight DQ links (vs thirty-two);
- one RQ link pair (vs two);
- four memory devices connected to controller 1905 via channel 1935 (vs one memory device 1910);
- parallel operation of banks in four quads, memory blocks BLKA0, BLKA1, BLKB0, and BLKB1 (vs individual operation of banks);
- sub-row address SR[1] used to select sub-rows within the memory banks;
- sub-column addresses SCx[3:2] and SCy[3:2] used to select sub-columns within the memory banks;
- half of the request-packet slots are unused on the RQ link pair;
- requests directed to block A (blocks BLKA0 and BLKA1) are received on the RQ[1:0]/RQN[1:0] links, and the read data is transmitted on the DQ[1:0]/DQN[1:0] links;
- requests are simultaneously directed to linked banks (e.g., banks "a", "g", "m", and "s" of respective blocks BLKA0, BLKA1, BLKB0, and BLKB1 of FIG. 19) are linked for parallel operation, and receive the same address fields from the request packets; and
- the read data from banks "m", "g", and "s" are transmitted on the DQ[9:8]/DQN[9:8], DQ[17:16]/DQN[17:16], and DQ[25:24]/DQN[25:24] links, respectively.

Each read request includes a ROW packet with an ACT command, a bank address, a row address, and a sub-row address. The sub-row address SR[1:0] is used in this x8 case. Each read transaction also includes a COL packet with a RDA command, a bank address, two column addresses, and two sub-column addresses. The sub-column addresses SCx[3:2], SCy[3:2] are used in this x8 case. The COL packet follows the ROW packet by the read row-to-column delay $t_{RCD\text{-}R}$. The read data from the first column access follows the COL packet by $t_{CAC}$. The read data from the second column access follows $t_{CC}$ later.

Each column access produces 64 bits of data, which is serialized as 32 bits of data on each of the two enabled DQ links. Four parallel column accesses produce 32 bits of data on each of 8 DQ links. The column granularity is 32 bytes (32 B), and the row granularity is 64 bytes (64 B), the same as the system of FIG. 19. Though the steering logic on controller 1905 is omitted from the figure, the connectivity for the data and request links are as shown. In this four-memory-device embodiment each RQ link-pair connects to all four quads on each memory device 1910. Interleaved write transactions would steer the data in a similar manner but in the opposite direction from the read case.

In FIG. 23, each memory device 1910 is coupled to memory controller 1905 via two differential pairs. In that case, the two links can be shared between controller and memory blocks in a number of ways (e.g., via time or wire multiplexing). In other embodiments a memory system fully populated with memory devices includes one request link for each memory device. Of interest, both the request and data widths on each device change in inverse proportion to the number of memory devices. The ratio of request links to data links remains constant, which simplifies the design and connectivity of the memory-controller blocks.

The request-steering methods used in the forgoing systems are beneficial for a number of reasons. Among them, the various links may be interleaved across the physical portion (PHY) of the data and request interfaces to facilitate point-to-point routing of both the request and data links in PCB (printed circuit board), POP (package-on-package), and SIP (system-in-package) packaging environments. Furthermore, the same memory controller device may be connected to different numbers of memory devices to support different memory capacities by simply setting a configuration register. The configuration option may be fixed, as in a system in which the one or two memory devices are permanently coupled to the controller component. Alternatively, the configuration option may be adjustable, as in the case of a system that uses either one or two memory modules (also called DPP, or dynamic point-to-point) inserted into two memory sockets which connect to the controller component.

Figure 24:
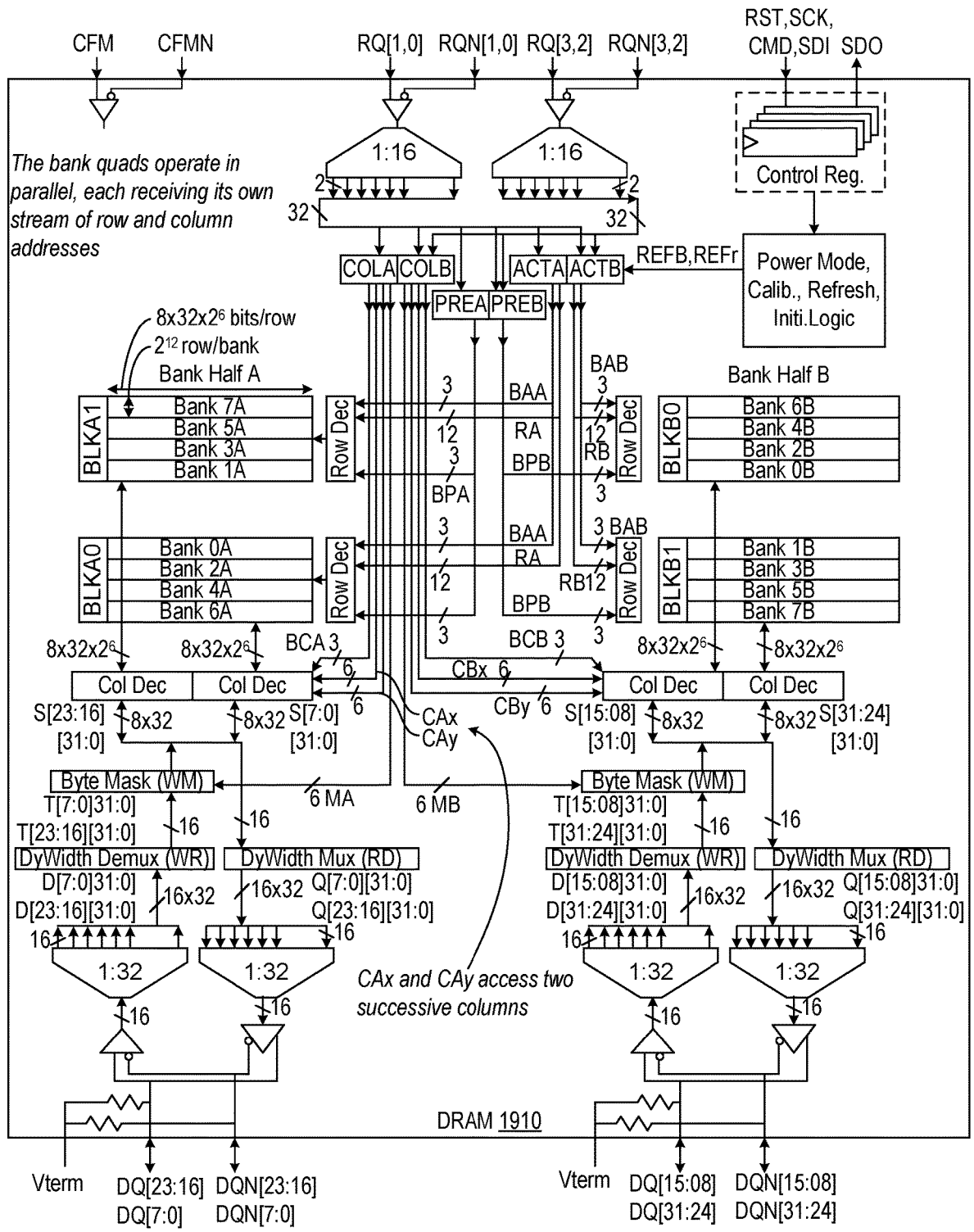
FIG. 24 depicts an integrated memory device 1910 in accordance with one embodiment, including all the interface ports and major internal circuit blocks.

FIG. 24 depicts an integrated memory device 1910 in accordance with one embodiment, including all the external ports and major internal circuit blocks. The CFM/CFMN clock link is received and used by clock generation logic (not shown) to produce the internal timing events needed by the interface and the core. The RQ[1:0]/RQN[1:0] links receive the request information for quads BLKA0/1, and the RQ[3:2]/RQN[3:2] links receive the request information for the other two quads BLKB0/1. Each quad contains four independent banks.

Two 32-bit request words are received in each $t_{CYCLE}$ interval. These two words are decoded and supply control and address information to the core. Memory device 1910, in this embodiment, supports threaded and standard modes. The threaded mode supports concurrent core operations, which may be referred to as threading, micro-threading or mThreading. In contrast, in the standard mode different types of operations (e.g. row activate, column read, column write, and row precharge) overlap between different banks in a quad, but the quads are themselves locked together in parallel operation (e.g. same bank/row/column addresses).

Threaded operation improves over operation in the standard mode by allowing different quads to operate independently (different bank/row/column addresses). In this embodiment, request packets on the RQ[1:0]/RQN[1:0] links and the RQ[3:2]/RQN[3:2] are directed to diagonally opposite quads; i.e. the two request packets may be directed to one of banks 0A, 2A, 4A, and 6A and one of banks 0B, 2B, 4B, and 6B; or the two request packets may be directed to one of banks 1A, 3A, 5A, and 7A and one of banks 1B, 3B, 5B, and 7B. This includes the bank (BA) and row (R) addresses for an activate (ACT) command, the bank (BA) and row (REFr) addresses for a refresh activate (REFA) command, the bank (BP) address for a precharge (PRE) command, the bank (BR) address for a refresh precharge (REFP) command, and the bank (BC) and two column addresses (Cx, Cy, SCx, and SCy) addresses for a read (RD) or write (WR or WM) command. In addition, a mask (M) is used for a masked write (WRM) command. Note that all of these address and control signals are given an "A" or "B" suffix to indicate whether they are driving the two quads on the left or right, respectively. Some of these address and control signals can all be optionally delayed in increments of $t_{CYCLE}$ under control of delay fields in the request.

A bank address is decoded for an ACT command. The indicated row of the selected bank is sensed and placed into the associated sense amp array for the bank. Sensing a row is also referred to as "opening a page" for the bank. Another bank address is decoded for a PRE command. The indicated bank and associated sense amp array are precharged to a state in which a subsequent ACT command can be applied. Precharging a bank is also called "closing the page" for the bank. After a bank is given an ACT command and before it is given a PRE command, it may receive read (RD) and write (WR) column commands. These commands permit the data in the bank's associated sense amp array (now shown) to be accessed.

For a WR command, the bank address is decoded. The indicated column of the associated sense amp array of the selected bank is written with the data received from one of the 8-DQ-link subsets of the DQ[31:0] pins. Eight 32-bit words are received in one $t_{CC}$ interval. The bank address is decoded for a RD command. The indicated column of the selected bank's associated sense amp array is read. The data is transmitted onto one of the 8-DQ-link subsets of the DQ[31:0] pins. Eight 32-bit words are accessed for the read transaction and are transmitted in one $t_{CC}$ interval.

The RST, SCK, and CMD pins connect to the Control Register block. These pins supply the data, address, and control needed to write the control registers. The read data for these registers is accessed through the SDO/SDI pins. These pins are also used to initialize the device. The VREF pin supplies a reference voltage used by the RQ receivers. The control registers are used to transition between power modes, and are also used for calibrating the high speed transmit and receive circuits of the device. The control registers also supply bank (REFB) and row (REFr) addresses for refresh operations. The block labeled "Power Mode, Calib., Refresh, Init Logic" manages power-mode transitions, calibration operations, refresh operations, and initialization.

Request links in accordance with some embodiments operate at speeds at or approaching the high-speed data links. RQ links that operate at high link rates may require careful calibration. The following disclosure and supporting figures detail calibration methods and circuits that can be used to ensure the high-speed request links provide suitably low bit-error rates. Calibration involves two components that can occur separately, or together: fine calibration (phase adjustment) and coarse calibration (bit alignment). These can be done either in the presence, or absence, of noise.

Figure 25:
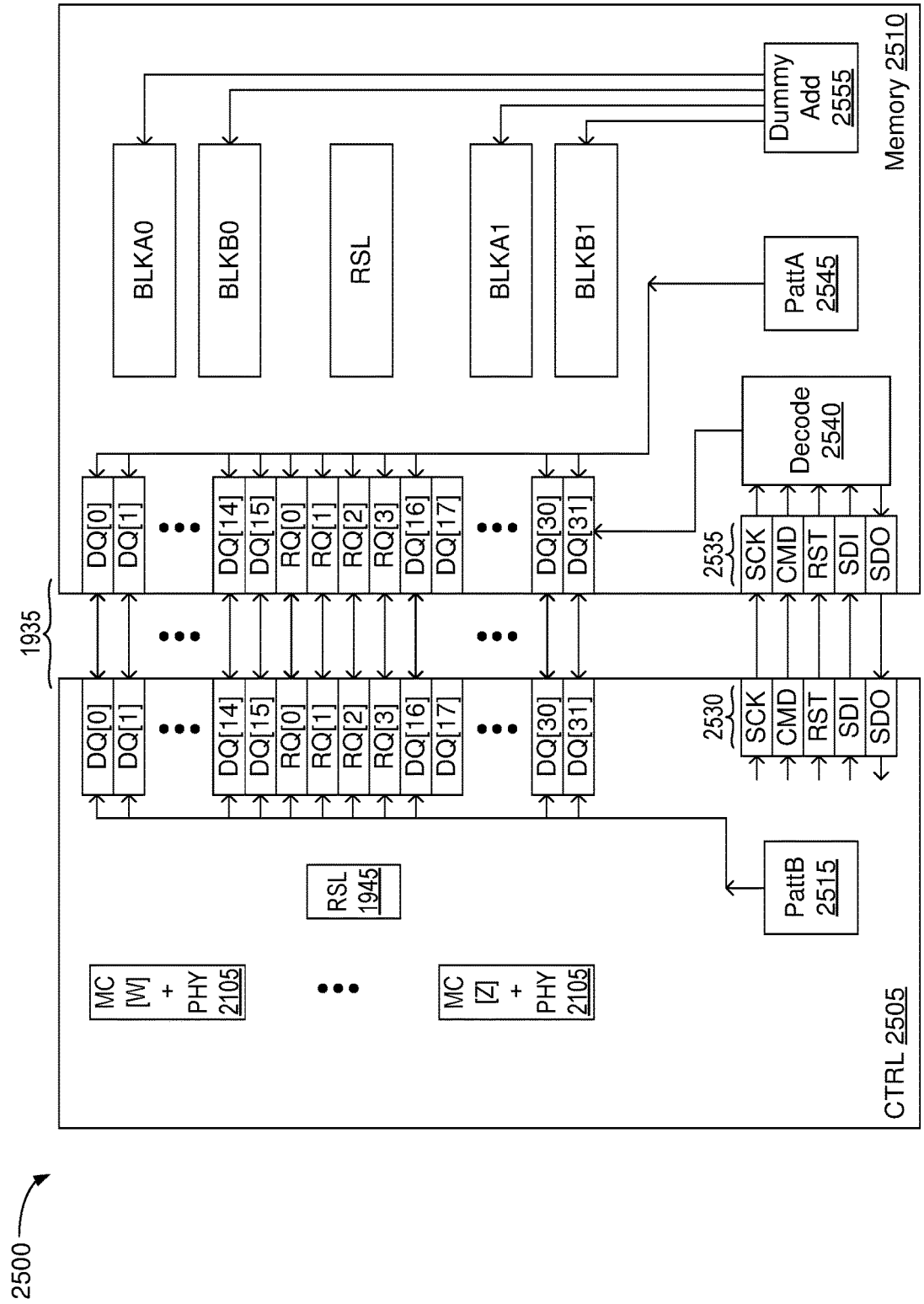
FIG. 25 depicts a memory system 2500 in accordance with another embodiment.

FIG. 25 depicts a memory system 2500 in accordance with another embodiment, and highlights test and calibration circuitry for tuning the request and data links. Memory system 2500 includes a memory controller 2505 and memory device 2510 which may be like controller 1905 and memory device 1910 of FIG. 19, respectively. On controller 2505, the blocks labeled DQ and RQ may be portions of the data and request interfaces described previously. FIG. 25 focuses on portions of system 2500 used to calibrate timing parameters for the data and request interfaces, which are represented in each of controller 2505 and memory device 2510 as opposing data and request blocks DQ[31:0] and RQ[3:0]. On controller 2505, the calibration and configuration resources include a pattern generator 2515 (labeled PattB 2515) and a conventional serial command interface 2530. In one embodiment, pattern generator 2515 is a linear-feedback shift register (LFSR). On device 2510, the configuration resources include a command interface 2535, a command decoder 2540, a pattern generator 2545 (labeled PattA 2545), and a dummy-address generator 2555. Command interfaces 2530 and 2535 are robust, low-speed interfaces used to communicate calibration signals and information for tuning the higher-speed links between controller 2505 and memory device 2510. Additional pattern generators can be included on either or both controller and memory device.

In this example, fine and coarse calibration will be described as occurring sequentially. To begin fine calibration, controller 2505 issues a command via serial interface 2530 that causes memory device 2510 to enter a calibration mode. In response to the calibration mode command, memory 2510 sends controller 2505 deterministic test patterns from pattern generator 2545 over the data links and request links. Controller 2505 then tunes the receive phases of the controller's request and data interface blocks with reference to a receive clock (not shown). The dummy address generator 2555 can be used to simulate noise during this fine calibration. In this example, coarse calibration of the controller receiver can now occur; again the dummy address generator 2555 can be used to simulate noise.

Next, controller 2505 issues commands to memory device 2510 that cause the data and request interfaces to enter a "loop-back" mode in which signals conveyed to memory device 2510 are immediately returned to controller 2505. (Circuits for looping back data and request signals are detailed below in connection with FIGS. 26 and 27). In one embodiment, each even-numbered data and request link is each looped back via an adjacent odd-numbered link. For example, the data link for DQ[0] may be looped back at the memory side of system 2500 via the data link for DQ[1].

Controller 2505 then conveys deterministic test patterns from pattern generator 2515 to memory device 2510 via the even links, and memory device 2510 returns the test patterns via the odd links.

Controller 2505, upon receiving the returned test pattern, compares them with the originally transmitted patterns to complete fine and coarse calibration. Because the return links are already calibrated, errors can be attributed to issues in the forward links (toward memory device 2510). Controller 2505 then calibrates the timing of the forward links to minimize the errors.

In this embodiment the request links (RQ[3:0]) employ the same bidirectional interface circuitry as the data links, and can thus be tuned in the same fashion as the data links. In alternative embodiment, loop-back paths from request links to data links may be included at the memory device for embodiments in which the request links are unidirectional. Request links that operate at lower speeds may not require the same degree of tuning as the data links.

The noise environment during calibration might not accurately represent normal memory-system operation. The loop-back calibration scheme described here may therefore be inadequate for obtaining maximum speed performance. Memory system 2500 therefore supports a simulated noise environment. In response to a command from controller 2505, dummy-address generator 2555 provides dummy addresses to memory blocks BLKA0, BLKA1, BLKB0, and BLKB1, which simulates a realistic noise environment. More generally, the test procedure can be repeated periodically in a real or simulated noise environment to accommodate e.g. temperature or supply fluctuations.

Specific example circuitry to support the above-described test procedures will now be described. The following FIGS. 26 and 27 detail aspects of an embodiment of memory system 2500 of FIG. 25 that support loop-back calibration. More specifically, FIG. 26 shows read calibration using the side-band and transmissions from the memory to the controller that was previously described and FIG. 27 shows write calibration that occurs after the read calibration is completed.

Figure 26:
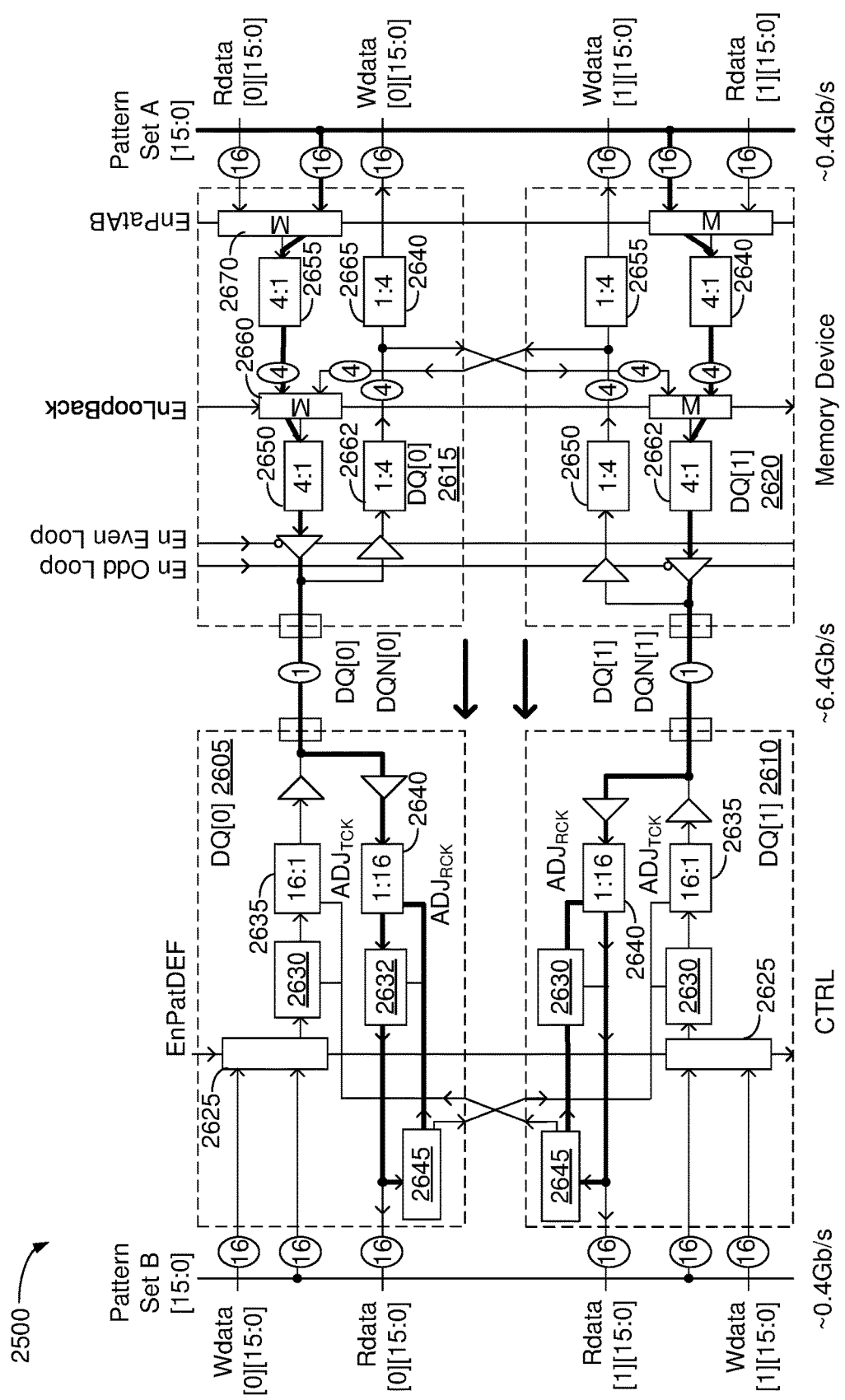
FIG. 26 details portions of system 2500 of FIG. 25, two controller-side data interfaces 2605 and 2610 and two memory-device-side data interfaces 2615 and 2620.
Figure 27:
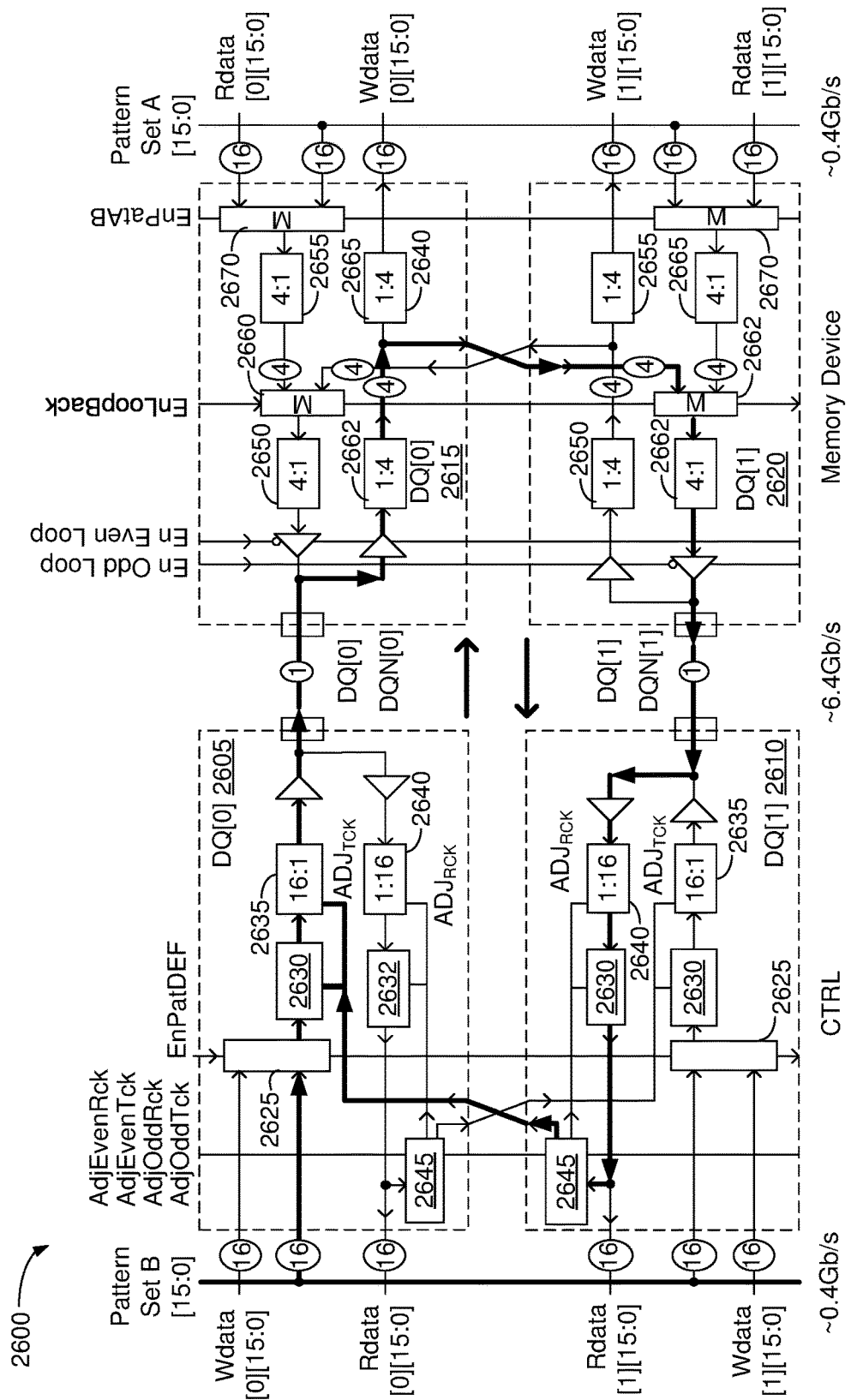
FIG. 27 depicts the configuration process for an "even" write link in the loop-back mode.

FIG. 26 details portions of system 2500 of FIG. 25, two controller-side data interfaces 2605 and 2610 and the corresponding two memory-device-side data interfaces 2615 and 2620. Each controller-side data interface includes a test serializer 2625, two leveling circuits 2630 and 2632, a serializer 2635, a deserializer 2640, and match circuitry 2645. With reference to data interface 2605, serializer 2625 selects either sixteen write-data bits Wdata or a sixteen-bit pattern from e.g. pattern generator 2515 of FIG. 25. The output from serializer 2625 is coupled to one of leveling circuits 2630, 2632. Each leveling circuit 2630 and 2632 is used to coarsely align received and expected test patterns on a per-bit basis using known techniques. Serializer 2625, e.g. a multiplexer, then converts the resulting sixteen-bit data into serial data for transmission to interface 2616.

In the depicted example, a 400 MHz clock is distributed to both the controller and the memory device to synchronize their respective cores, and the data and request signals are conveyed serially at 6.4 Gb/s using appropriately timed transmit and receive clocks. Methods and circuits for generating and distributing suitable clock signals, and for sweeping clock phases to correctly capture data, are known. Detailed discussions of clock generation, distribution, and alignment are therefore omitted for brevity.

On the receive side, a one-to-sixteen deserializer converts serial receive data into sixteen-bit data, which is conveyed to leveling circuit 2632. When the memory device is operational, received data Rdata is ultimately conveyed to core logic (not shown). In the calibration mode, match circuitry 2645 examines received test data Rdata against expected patterns and issue phase control signals to deserializer 2640, leveling circuit 2632, and serializer 2635 of neighboring interface 2610. Interface 2610 has the similar components and works in a similar fashion.

Write interface 2615 on the memory side includes two four-to-one serializers 2650 and 2655, loop-back select logic (a multiplexer) 2660, two one-to-four deserializers 2662 and 2665, and a pattern-enable multiplexer 2670. In the calibration mode, responsive to an enable-pattern signal EnPattAB, multiplexer 2670 directs patterns from pattern generator 2545 to deserializer 2640, which necks down the sixteen bits from pattern bus PatternSetA,B to four bits. Multiplexer 2660 conveys the resulting test patters to serializer 2650, which produces a serial data stream to interface 2605 of the memory controller. Of two enable signals EnOddLoop and EnEvenLoop, the latter the input and output buffers of interface 2615 (DQ[0] is considered an "even" link, and DQ[1] an odd). Interface 2620 has the similar components and works in a similar fashion, though the input and output buffers are controlled by enable signal EnEvenLoop. A detailed treatment of interface 2620 is omitted for brevity.

With reference to the upper interface pair, the test patterns traverse both interfaces 2615 and 2605, ultimately arriving at match circuit 2645. Match circuit 2645, which may be implemented in hardware or using a combination of hardware and software, manipulates phase-adjust signal $ADJ_{RCK}$, and consequently the input phase of deserializer 2640, until the deterministic patterns from interface 2615 are as expected. In a typical example, match circuit 2645 might scan the phase of the receive clock with respect to an external reference clock to find the phase offset centered within a range of phase values that produces correctly sampled data. Signal characteristics other than phase can be adjusted as well (e.g., termination values, drive strength, and equalization parameters). In embodiments that support high-speed RQ links, the phase and signal characteristics adjusted in the DQ links may also require adjustment in the RQ links. Match circuit 2645 then stores the resulting phase value. Interface 2610 is likewise phase calibrated at the same time.

FIG. 27 depicts the configuration process for an "even" write link in the loop-back mode. Multiplexer 2660 in interface 2620 on the memory-device side selects the output from deserializer 2662 of interface 2615. Patterns conveyed in the write direction from interface 2605 are therefore fed back to interface 2610, and ultimately to pattern matching circuit 2645. Because the read channels were tuned as noted previously in connection with FIG. 26, errors noted by matching circuit 2645 are attributable to the write channel. This process is sometimes referred to as "write-launch" calibration, in which the transmit phase of write data is calibrated with respect to a reference clock. Pattern match circuitry sweeps the phase of the transmit clock via a transmit-clock-adjust signal $ADJ_{TCK}$ in the same manner described previously for the receive clock, ultimately arriving at a phase setting that provides a desired error rate. The process can then be repeated for the odd write links using the even read links for the loop-back channel.

In this example, all the even links are tuned together, followed by all the odd links. The request links are bidirectional, and can be tuned in the same way. Other embodiments may have unidirectional RQ links, in which case request interfaces on the memory device can be modified to use e.g. a neighboring DQ link for loop-back testing. Once all the read and write links are tuned, the system can repeat the calibration in an artificial noise environment using dummy core operations for fine tuning.

In the memory systems of FIG. 19-23, the memory controllers and devices included integrated steering logic to manage the flow of requests for different numbers of devices. In other embodiments, the steering logic for the memory controller can be provided external to the controller IC, and steering logic each memory IC and likewise be provided externally. The following FIGS. 28-30 depict a memory system that supports from one to four memory devices using steering logic external to a memory controller and the one or more memory devices to maintain point-to-point data and request links and constant access granularity irrespective of the number of memory devices.

Figure 28:
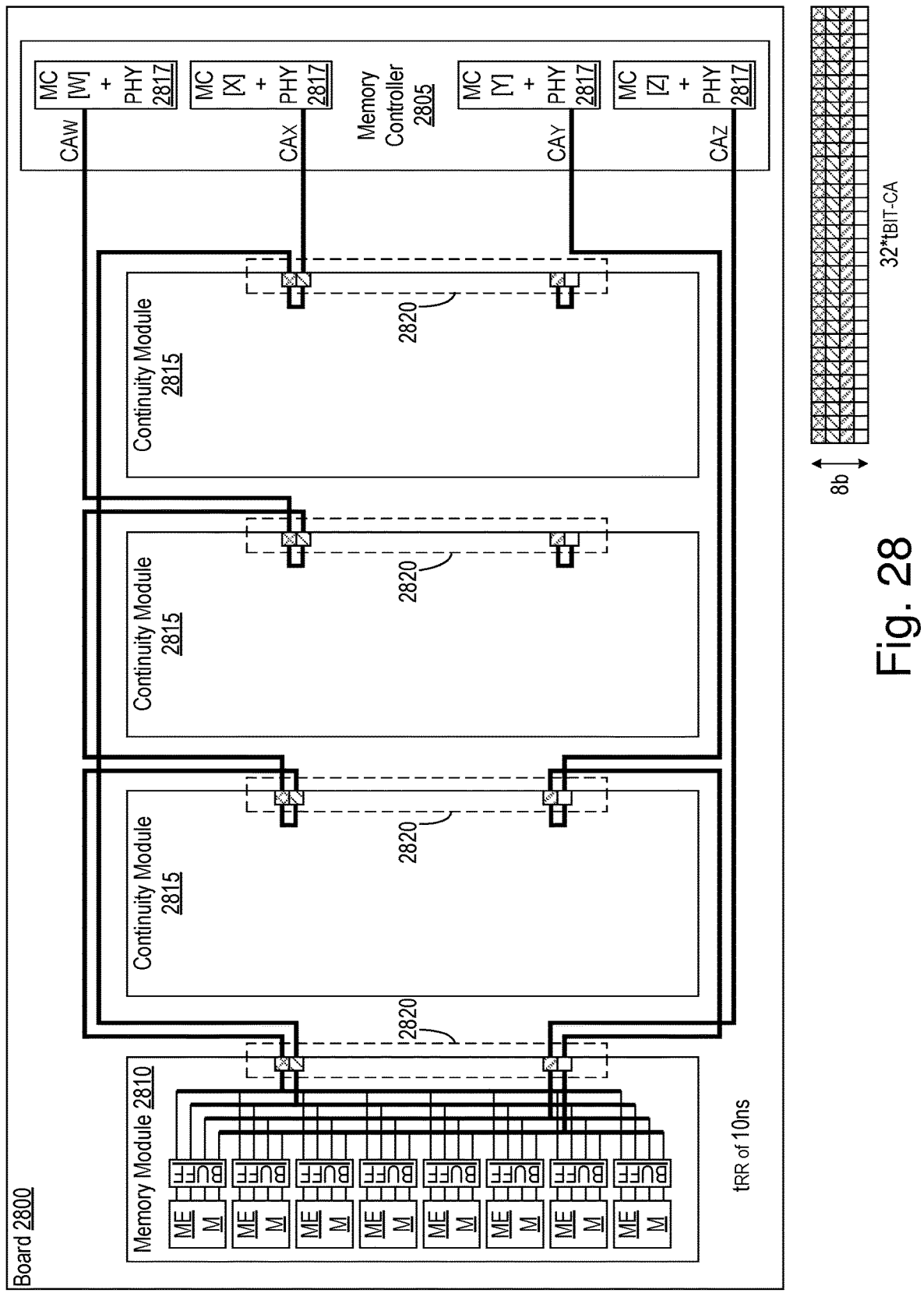
FIG. 28 depicts a memory system in accordance an embodiment in which a printed-circuit board 2800 supports a memory controller 2805, a memory module 2810, and three continuity modules 2815.
Figure 29:
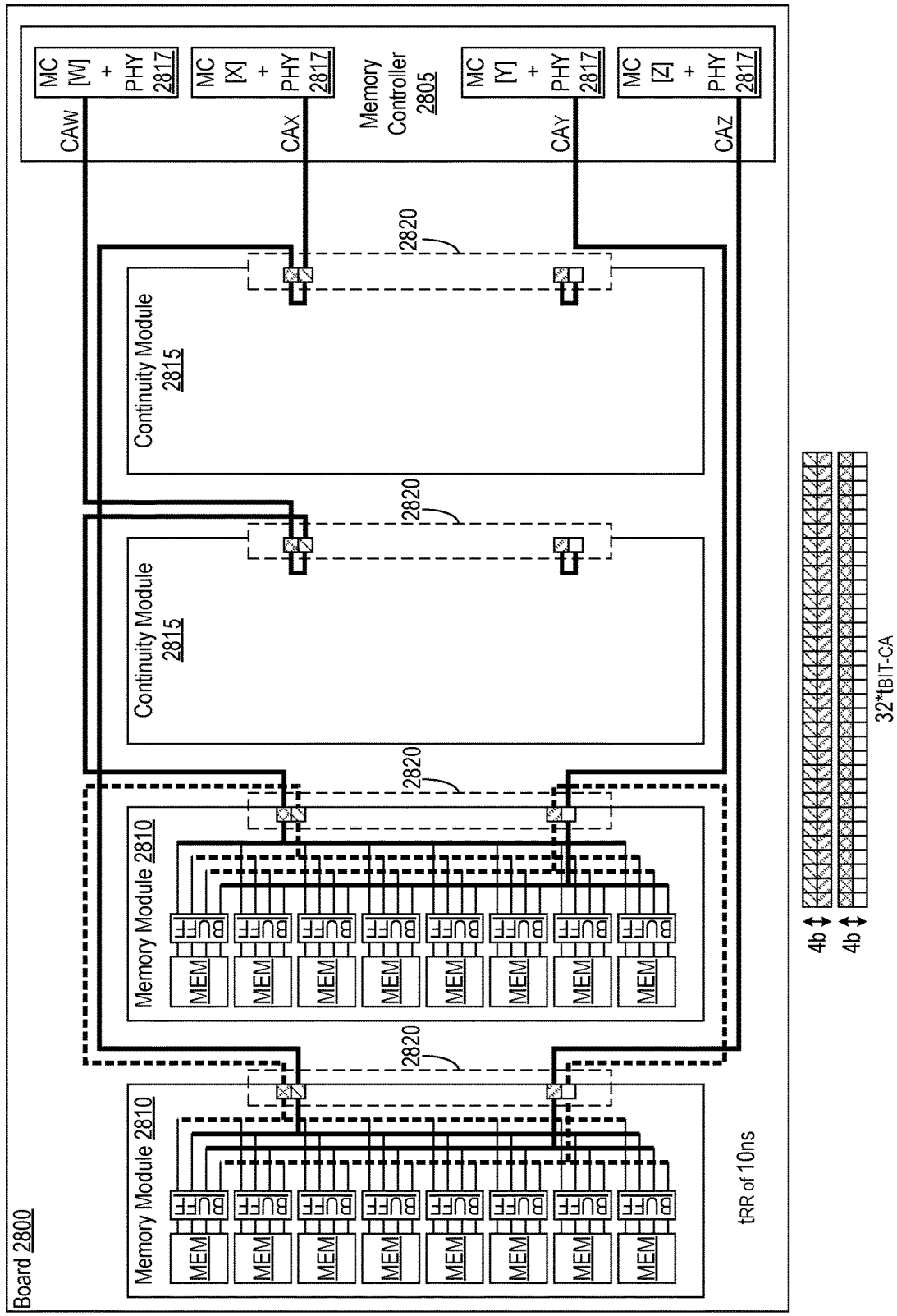
FIG. 29 depicts the memory system introduced in FIG. 28 in a dual-module configuration, or mode.

FIG. 28 depicts a memory system in accordance with an embodiment in which the request steering logic is provided external to a memory-controller IC and a memory-device IC. In the depicted system, a printed-circuit board (PCB) 2800 supports a memory controller 2805, a memory module 2810, and three continuity modules 2815. Memory controller 2805 includes four independent memory-controller blocks 2817, all of which are coupled to the single, installed memory module 2810 via four physical request channels CAw, CAx, CAy, and CAz. Though channels CAw, CAx, and CAy are coupled to module 2810 via one or more continuity module 2815 and associated connectors 2820, each connection is point-to-point. Each request channel CAw, CAx, CAy, and CAz includes sixteen CA links.

Memory module 2810 includes eight memory arrays MEM and associated buffers BUFF. Each array/buffer pair supports four pairs of links, so module 2810 supports a total of 64 links in this example. Each buffer BUFF receives four independent request streams. Each request stream, in turn, is conveyed over two links and is 32 bits long in each $t_{RR}$ interval. The buffers provide steering logic and data-width adjustment similar to what is described previously as integrated with memory arrays in other embodiments. Conventional memory arrays can thus be used in systems that take advantage of some aspects of the forgoing embodiments. Memory controller 2805 omits the steering logic discussed above in connection with FIGS. 19-24. However, a similar role is served by the presence or absence of continuity modules. In other embodiments the continuity modules can be replaced with other switching mechanisms, e.g. connectors that short when a memory module is absent, or active switches within connectors 2820 or board 2800. The legend at the lower right indicates that the one installed module 2810 communicates four a 32-byte request packet across FIG. 29 depicts the memory system introduced in FIG. 28 in a dual-module configuration, or mode. The dashed links indicate portions of request channels that are disconnected by the removal of the leftmost continuity module 2815 in FIG. 28. The request channels that extended to that module now provide point-to-point connections to a second memory module 2810. Each buffer BUFF receives two independent request streams, each of which is conveyed over two links and is 32 bits long in each $t_{RR}$ interval. The request-channel width of each of the two modules is halved relative to the single-module embodiment, so the request-channel width is the same in both configurations from the perspective of memory controller 2805.

Figure 30:
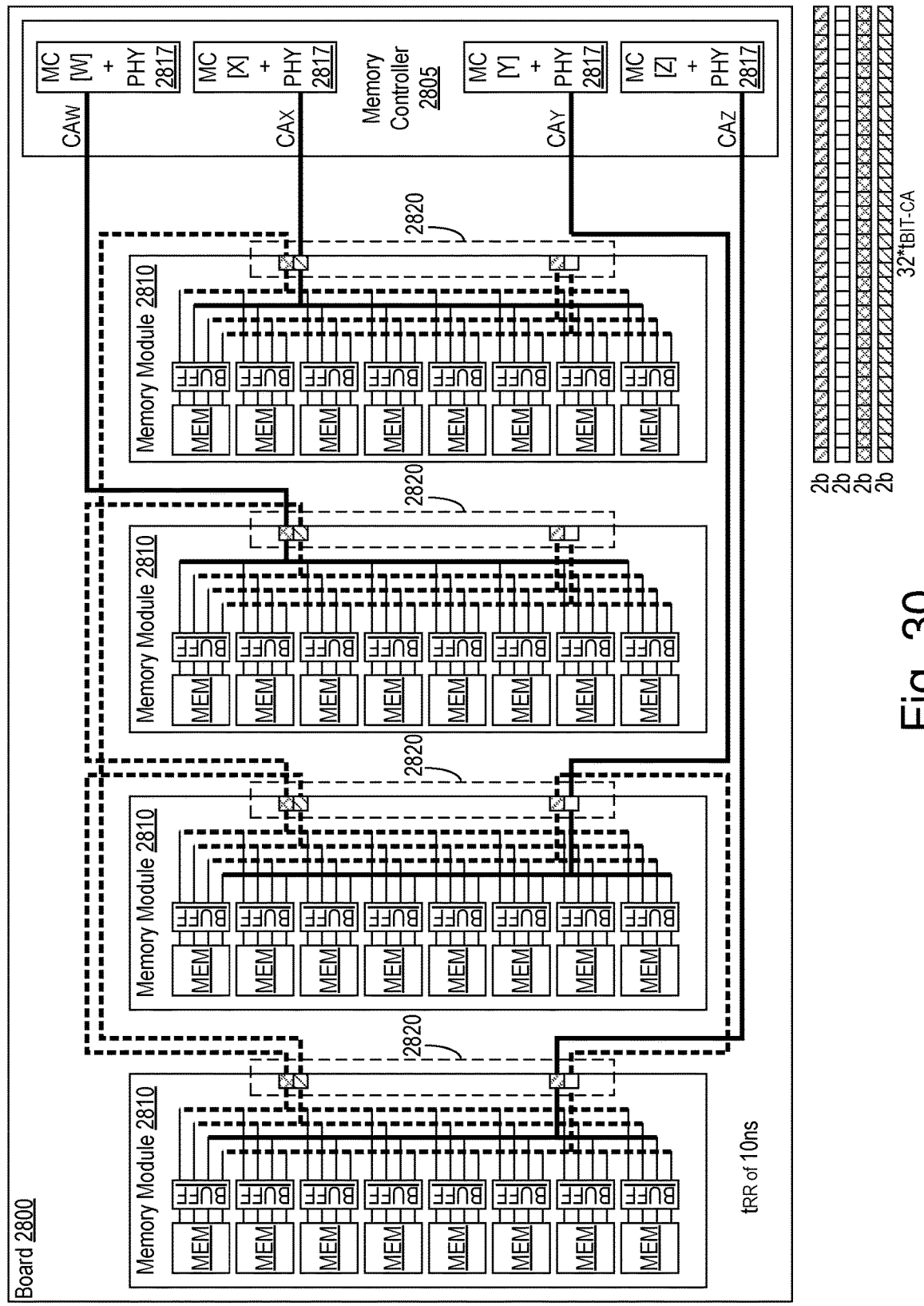
FIG. 30 depicts the memory system described in connection with FIGS. 28 and 29, but this time in a fully-populated, four-module configuration.

FIG. 30 depicts the memory system described in connection with FIGS. 28 and 29, but this time in a fully-populated, four-module configuration. The dashed lines again indicate portions of request channels that are disconnected by the removal of continuity modules 2815. Each of the four request channels extends to one memory module 2810, which allows each memory-controller block 2817 to communicate complete requests to a respective one of modules 2810. The request-channel width of each of the two modules is halved again relative to the dual-module embodiment, so the request-channel width is again the same from the perspective of memory controller 2805. Each buffer BUFF receives one independent request stream, which in turn, is conveyed over two links and is 32 bits long in each $t_{RR}$ interval. Buffers BUFF allow for data and request steering, but may be omitted if the memory devices support this functionality.

Memory controller 2805 adjusts bank, row, and column-address fields in requests directed to the memory module or modules 2810 depending upon the number of modules. Though not shown, memory controller 2805 may include a register or other mechanism for indicating the number of attached memory devices. Memory modules 2810 may likewise include a register or other configuration mechanism. For example, memory controller 2805 may load a register in each installed module to configure the data and request ports as appropriate for a given number and type of installed module. The memory system of FIGS. 28-30 thus supports different number of memory devices while maintaining the same data request granularity from the perspective of the memory controller.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

In the foregoing description and in the accompanying drawings, specific terminology and drawing symbols are set forth to provide a thorough understanding of the foregoing embodiments. In some instances, the terminology and symbols may imply specific details that are not required to practice the invention. Furthermore, the term "system" may refer to a complete communication system, including a transmitter and a receiver, or may refer to portion of a communication system, such as a transmitter, a receiver, or an IC or other component that includes a transmitter and/or receiver. Still other embodiments will be evident to those of skill in the art.

Some components are shown directly connected to one another while others are shown connected via intermediate components. In each instance the method of interconnection, or "coupling," establishes some desired electrical communication between two or more circuit nodes (e.g., pads, lines, or terminals). Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

Miscellaneous Embodiments

In one embodiment, a memory controller comprises: a memory request generator to generate one or more memory requests; and controller logic to generate, based on the memory requests, a plurality of control and address (CA) signals for addressing or controlling one or more memory devices residing on a memory module, in one of at least two modes, including: a first mode in which the controller logic generates first CA signals for a first memory device and transmits the first CA signals to the first memory device via a first link at a first signaling rate, and in which the controller logic generates second CA signals for a second memory device and transmits the second CA signals to the second memory device via a second link at the first signaling rate; and a second mode in which the controller logic generates third CA signals for a third memory device and transmits the third CA signals for the third memory device on both the first link and the second link at a second signaling rate. In one example of the memory controller, the second signaling rate is lower than the first signaling rate. In a particular case, the second signaling rate is one half of the first signaling rate.

In one embodiment, a memory device comprises: a plurality of memory cells storing data; an interface circuit coupled to the memory cells and a plurality of input and output pins including first and second sets of control and address (CA) pins, the interface circuit being configurable to receive CA signals in one of at least two modes, including: a first mode in which the CA signals are received at a first signaling rate via both the first and second sets of CA pins; and a second mode in which the CA signals are received at a second signaling rate via the first set of CA pins and not via the second set of CA pins. In one example of the memory device the second signaling rate is higher than the first signaling rate. In another example, the second signaling rate is double the first signaling rate.

In one embodiment, a memory system comprises: one or more memory devices residing on one or more memory modules; a memory controller generating a plurality of control and address (CA) signals for addressing or controlling the one or more memory devices in one of at least two modes, including: a first mode in which the memory controller generates first CA signals for a first memory device and transmits the first CA signals to the first memory device via a first link at a first signaling rate, and in which the memory controller generates second CA signals for a second memory device and transmits the second CA signals to the second memory device via a second link at a second signaling rate; and a second mode in which the memory controller generates third CA signals for a third memory device and transmits the third CA signals to the third memory device via both the first link and the second link at a second signaling rate. In other examples of the memory system, (1) the third memory device is the first memory device, (2) the second signaling rate is lower than the first signaling rate, (3) the second signaling rate is one half of the first signaling rate, (4) in the first mode, the first signaling rate is one half a data signaling rate of data signals that are read from the first and second memory devices, and/or (5) both the first link and second link are connected to each of the first and second memory devices, and the first and second memory devices reside on opposite sides of a circuit board on which the memory module is formed.

In one embodiment a buffer to be coupled between a memory controller and one or more memory devices comprises: first and second sets of input pins to receive command and address (CA) signals from the memory controller; and first and second sets of output pins to output converted CA signals to the one or more memory devices; the buffer being configurable to operate in one of at least two modes, wherein: in a first mode, the buffer receives first CA signals for a first memory device at a first signaling rate via the first set of input pins and second CA signals for a second memory device at the first signaling rate via the second set of input pins, converts the first and second CA signals into first and second converted CA signals that are compatible with respective ones of the first memory device and the second memory device, and transmits the first converted CA signals to the first memory device via the first set of output pins and the second converted CA signals to the second memory device via the second set of output pins; and in the second mode, the buffer receives third CA signals for a third memory device at a second signaling rate via the first and second sets of input pins, converts the third CA signals into third converted CA signals that are compatible with the third memory device, and transmits the third converted CA signals to the third memory device via the first and second output pins. In various examples of the buffer, the second signaling rate is lower than the first signaling rate (e.g., the second signaling rate is half the first signaling rate); the first and second output pins have a same signal width wider than the first and second input pins, respectively, and the first and second output pins operate at a third signaling rate lower than the first signaling rate and the second signaling rate in both the first mode and the second mode; and in the first mode the first and second output pins operate at a third signaling rate, and in the second mode the first and second output pins operate at a fourth signaling rate lower than the third signaling rate.

In one embodiment, a method of controlling one or more memory devices residing on one or more memory modules comprises: generating a plurality of control and address (CA) signals for addressing or controlling the one or more memory devices, in one of at least two modes, including: a first mode in which first CA signals are transmitted to a first memory device via a first link at a first signaling rate and second CA signals are transmitted to a second memory device via a second link at the first signaling rate; and a second mode in which third CA signals for a third memory device are transmitted via both the first link and the second link at a second signaling rate; and accessing the one or more memory devices with the CA signals. In examples of the method, the second signaling rate is lower than the first signaling rate (e.g., the second signaling rate is one half of the first signaling rate); and in the first mode, the first signaling rate is one half a data signaling rate of data signals that are read from the first and second memory devices.

In one embodiment, a method of operating a memory device comprises: receiving control and address (CA) signals in one of at least two modes, including: a first mode in which the CA signals are received at a first signaling rate via a first and a second set of CA pins of the memory device; and a second mode in which the CA signals are received at a second signaling rate via the first set of CA pins and not via the second set of CA pins; and accessing memory cells in the memory device using the CA signals. In examples of this method, the second signaling rate is higher than the first signaling rate (e.g., the second signaling rate is twice the first signaling rate); and in the second mode, the second signaling rate is one half a data signaling rate of data signals that are read from the memory device.

What is claimed is:

1. A dynamic random access memory (DRAM) device comprising:
   a memory array;
   a command/address (CA) interface that is operable, in a normal operating mode, to receive commands from a CA link that specify accesses to memory locations in the memory array, and wherein the CA interface is operable, in a CA interface calibration mode, to receive a test pattern from the CA link;
   a data interface to transfer data in connection with the commands that specify accesses to memory locations in the memory array; and
   loop-back circuitry to provide a feedback path from the CA interface to the data interface during the CA interface calibration mode.

2. The DRAM device of claim 1 wherein:
   the memory array is a first memory array, the CA interface is a first CA interface, the data interface is a first data interface, and the CA link is a first CA link;
   the DRAM device further comprises a second memory array, a second CA interface, a second data interface and a second CA link;
   the second CA interface is operable to receive commands from the second CA link that specify accesses to memory locations in the second memory array;
   the second CA interface is operable to receive a test pattern from the second CA link; and
   the loop-back circuitry is operable to provide a feedback path from the second CA interface to the second data interface during the CA interface calibration mode.

3. The DRAM device of claim 1 wherein:
   the CA interface comprises a deserializer; and
   the CA interface is operable to deserialize the commands from the CA link along with address information received from the CA link to access the memory locations in the memory array.

4. The DRAM device of claim 1 wherein the data interface includes a programmable width.

5. The DRAM device of claim 1 wherein the CA interface is unidirectional and the test pattern is looped back via the loop-back circuitry and the data interface during the CA interface calibration mode.

6. The DRAM device of claim 1 wherein:
   the CA interface comprises a receiver that is operable to receive bits from the CA link, during the normal operating mode, at a first data rate; and
   the data interface comprises a transmitter that is operable to transmit bits of data from the DRAM device to a memory controller, during the normal operating mode, at a second data rate; and
   wherein the second data rate is greater than the first data rate.

7. The DRAM device of claim 1 further comprising a package that includes a controller device having a respective CA interface that is coupled to the CA interface of the DRAM device, the controller device having a respective data interface that is coupled to the data interface of the DRAM device.

8. The DRAM device of claim 1 wherein the DRAM device further comprises circuitry operable during the CA interface calibration mode to simulate noise.

9. The DRAM device of claim 8 wherein the circuitry to simulate noise is operable to generate dummy memory addresses during the CA interface calibration mode.

10. A dynamic random access memory (DRAM) device comprising:
    a memory array;
    a command/address (CA) interface that is operable:
       (i) to receive commands from a CA link that specify accesses to memory locations in the memory array; and
       (ii) to receive a test pattern from the CA link in response to a calibration command that specifies a CA interface calibration mode;
    a data interface to transfer data in connection with the commands that specify accesses to memory locations in the memory array; and
    loop-back circuitry to provide a feedback path from the CA interface to the data interface during the CA interface calibration mode.

11. The DRAM device of claim 10 wherein:
    the CA interface comprises a deserializer; and
    the CA interface is operable to deserialize the commands from the CA link along with address information received from the CA link to access the memory locations in the memory array.

12. The DRAM device of claim 10 wherein the CA interface is unidirectional and the test pattern is looped back via the data interface and the loop-back circuitry during the CA interface calibration mode.

13. The DRAM device of claim 10 wherein:
    the CA interface comprises a receiver that is operable to receive bits from the CA link at a first data rate; and
    the data interface comprises a transmitter that is operable to transmit bits of data from the DRAM device to a memory controller, during the normal operating mode, at a second data rate; and
    wherein the second data rate is greater that the first data rate.

14. The DRAM device of claim 10 wherein the CA interface includes a first programmable width and the data interface includes a second programmable width.

15. The DRAM device of claim 10 wherein the DRAM device further comprises circuitry operable during the CA interface calibration mode to simulate noise, wherein the circuitry to simulate noise is operable to generate dummy memory addresses during the CA interface calibration mode.

16. A device comprising:
    a controller component; and
    a dynamic random access memory (DRAM) die attached to the controller component, the DRAM die comprising:
       a command/address (CA) interface that is operable:
          (i) to receive commands, from the controller component, that specify accesses to memory locations in the DRAM; and
          (ii) to receive a test pattern, from the controller component, in response to a calibration command that specifies a CA interface calibration mode;
       a data interface to transfer data in connection with the commands that specify accesses to memory locations; and
       loop-back circuitry to provide a feedback path from the CA interface to the data interface during the CA interface calibration mode.

17. The device of claim 16, wherein the loop-back circuitry, during the CA interface calibration mode, is to loop-back a received version of the test pattern from the CA interface, the received version of the test pattern to be output by the data interface to the controller component.

18. The device of claim 16 wherein the controller component and the DRAM die are disposed together in a package-on-package (POP) configuration.

19. The device of claim 16 wherein the controller component and the DRAM die are disposed together in a system-in-package (SIP) configuration.

20. The device of claim 16 wherein the DRAM die is a first DRAM die, wherein the device further comprises a second DRAM die having a CA interface that is operable to receive commands from the controller component, and the second DRAM die to receive a test pattern from the controller component during the CA interface calibration mode.

* * * * *